US012578899B2

(12) United States Patent
Tang et al.

(10) Patent No.: US 12,578,899 B2
(45) Date of Patent: Mar. 17, 2026

(54) MEMORY DEVICE, MEMORY SYSTEM, MEMORY CONTROLLER, AND OPERATION METHOD

(71) Applicant: YANGTZE MEMORY TECHNOLOGIES CO., LTD., Wuhan (CN)

(72) Inventors: Xingwei Tang, Wuhan (CN); Guangchang Ye, Wuhan (CN); Wen Luo, Wuhan (CN); Lu Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 33 days.

(21) Appl. No.: 18/807,567

(22) Filed: Aug. 16, 2024

(65) Prior Publication Data

US 2025/0265009 A1     Aug. 21, 2025

Related U.S. Application Data

(63) Continuation of application No. PCT/CN2024/077807, filed on Feb. 20, 2024.

(51) Int. Cl.
*G06F 3/06* (2006.01)
*G11C 16/04* (2006.01)
*G11C 16/26* (2006.01)

(52) U.S. Cl.
CPC .......... *G06F 3/0655* (2013.01); *G06F 3/0602* (2013.01); *G06F 3/0679* (2013.01); *G11C 16/0458* (2013.01); *G11C 16/26* (2013.01)

(58) Field of Classification Search
None
See application file for complete search history.

(56) References Cited

U.S. PATENT DOCUMENTS

| | | | | |
|---|---|---|---|---|
| 2014/0119124 A1* | 5/2014 | Kim | .................. | G11C 16/0483 365/185.18 |
| 2015/0332777 A1* | 11/2015 | Yoon | .................. | G11C 11/5642 365/185.12 |
| 2020/0027503 A1 | 1/2020 | Chen et al. | | |
| 2020/0058359 A1* | 2/2020 | Lee | .................. | G06F 11/1048 |

(Continued)

FOREIGN PATENT DOCUMENTS

| | | |
|---|---|---|
| CN | 101325089 A | 12/2008 |
| CN | 113223593 A | 8/2021 |
| CN | 115497540 A | 12/2022 |

*Primary Examiner* — Yaima Rigol
(74) *Attorney, Agent, or Firm* — BAYES PLLC

(57) ABSTRACT

Examples of the present disclosure include a memory device including: a memory cell array including a plurality of blocks. The blocks include a plurality of word lines, and a plurality of memory cells coupled to the plurality of word lines. The plurality of memory cells coupled to a same word line form a physical page. A physical page includes one or more code words; and a peripheral circuit coupled to the memory cell array and configured to: acquire a predicted initial read voltage of the one or more code words according to a position of the word line coupled to the one or more code words in an open block and a position of a first blank physical page in the open block; and obtain a target valley voltage of the code words according to a first result corresponding to the code words at the predicted initial read voltage.

20 Claims, 22 Drawing Sheets

Generate a predicted initial read voltage of a code word according to a position of the word line coupled to the code word in an open block and a position of a first blank physical page in the open block — S10

Obtain a target valley voltage of the code word according to a first result corresponding to the code word at the predicted initial read voltage, wherein the first result comprises the number of bits representing the flipping of the code word in two read results at a first read voltage and a second read voltage, and a difference between the first read voltage and the second read voltage is less than a preset voltage; and the target valley voltage is used as a read voltage when a read operation is performed on the code word — S20

(56)     References Cited

U.S. PATENT DOCUMENTS

| 2022/0044737 A1* | 2/2022 | Khayat | G11C 11/5642 |
| 2022/0076738 A1* | 3/2022 | Bazarsky | G11C 29/028 |
| 2022/0076762 A1* | 3/2022 | Lee | G11C 16/08 |
| 2022/0270687 A1* | 8/2022 | Tokutomi | G11C 16/0483 |
| 2023/0062445 A1* | 3/2023 | Lee | G11C 29/028 |
| 2023/0186959 A1* | 6/2023 | Lang | G11C 16/08 |
| | | | 365/189.15 |
| 2024/0086074 A1* | 3/2024 | Song | G06F 3/0653 |
| 2024/0304259 A1* | 9/2024 | Su | G11C 16/26 |

* cited by examiner

<u>100</u>

<u>300</u>

Figure 7:
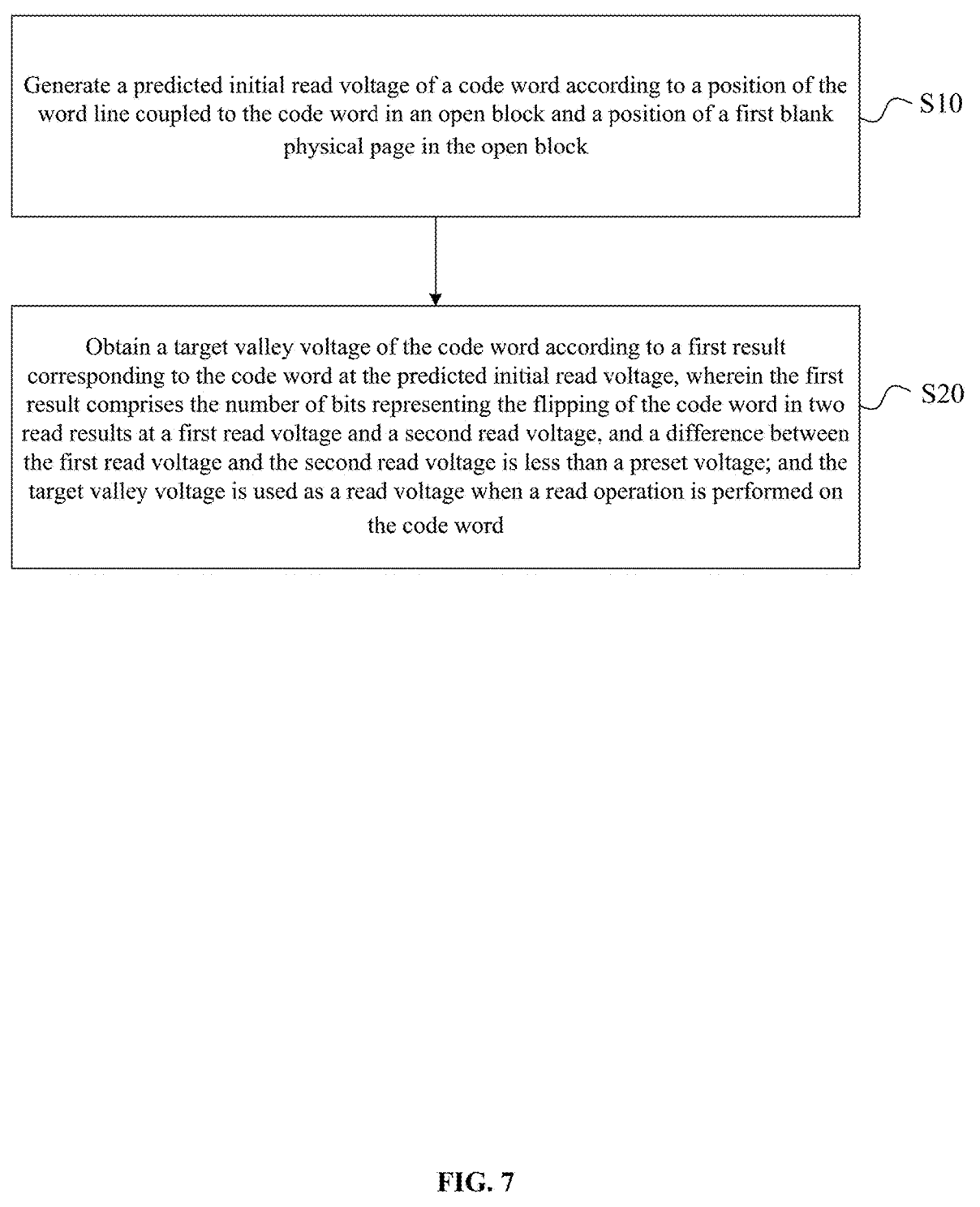

Generate a predicted initial read voltage of a code word according to a position of the word line coupled to the code word in an open block and a position of a first blank physical page in the open block ⟋ S10

Obtain a target valley voltage of the code word according to a first result corresponding to the code word at the predicted initial read voltage, wherein the first result comprises the number of bits representing the flipping of the code word in two read results at a first read voltage and a second read voltage, and a difference between the first read voltage and the second read voltage is less than a preset voltage; and the target valley voltage is used as a read voltage when a read operation is performed on the code word ⟋ S20

Cycle Type

DQx

MEMORY DEVICE, MEMORY SYSTEM, MEMORY CONTROLLER, AND OPERATION METHOD

CROSS-REFERENCE TO RELATED APPLICATIONS

The present application is a continuation of International Application No. PCT/CN2024/077807, filed on Feb. 20, 2024, which is hereby incorporated by reference in its entirety.

TECHNICAL FIELD

The present disclosure relates to, but is not limited to, a memory device, a memory system, a memory controller, and operation methods.

BACKGROUND

With the development of science and technology, the market scale of the integrated circuit industry is getting increasingly large, the process and technology of non-volatile memory devices in the entire integrated circuit industry have been developed by leaps and bounds in recent years, and the application of NAND memories is especially wide. The NAND memories capture and store charges in a gate dielectric layer of a memory cell comprised therein, so as to realize the function of data storage. However, with normal use, the charges stored in the memory cell vary with increased use time, repeated read operations, crossover temperatures, etc., thus affecting the correctness of data reading.

SUMMARY

According to one aspect of the present disclosure, a memory device is provided. The memory device may include a memory cell array. The memory cell array may include a plurality of blocks. The plurality of blocks may include a plurality of word lines and a plurality of memory cells coupled to the plurality of word lines. The plurality of memory cells coupled to a same word line may form a physical page. The physical page may include one or more code words. A peripheral circuit may be coupled to the memory cell array. The peripheral circuit may be configured to acquire a predicted initial read voltage of the one or more code words according to a position of the word line coupled to the one or more code words in an open block and a position of a first blank physical page in the open block. The peripheral circuit may be configured to obtain a target valley voltage of the one or more code words according to a first result corresponding to the one or more code words at the predicted initial read voltage. The first result may include a number of bits representing flipping of the one or more code words in two read results at a first read voltage and a second read voltage, and a difference between the first read voltage and the second read voltage may be less than a preset voltage. The target valley voltage may be used as a read voltage when a read operation is performed on the one or more code words.

In some implementations, the peripheral circuit may be configured to acquire an offset value corresponding to the predicted initial read voltage of the one or more code words according to a first offset value corresponding to a close block whose write moment difference with the open block is less than a preset time duration, a second offset value corresponding to a position of a word line coupled to the first blank physical page in all word lines of the open block, and a third offset value corresponding to a distance of the word line coupled to the one or more code words from the word line coupled to the first blank physical page in the open block. In some implementations, the peripheral circuit may be configured to obtain the predicted initial read voltage of the one or more code words according to the offset value corresponding to the predicted initial read voltage.

In some implementations, the peripheral circuit may be configured to respectively acquire the first offset value, the second offset value, and the third offset value. In some implementations, the peripheral circuit may be configured to sum the first offset value, the second offset value, and the third offset value to obtain a total offset value. In some implementations, the peripheral circuit may be configured to sum a default read voltage and the total offset value to obtain the predicted initial read voltage of the one or more code words.

In some implementations, the peripheral circuit may be configured to, in response to the first result corresponding to the one or more code words at the predicted initial read voltage being less than a preset threshold, use the predicted initial read voltage as the target valley voltage of the one or more code words. In some implementations, the peripheral circuit may be configured to, in response to the first result corresponding to the one or more code words at the predicted initial read voltage being greater than or equal to the preset threshold, adjust the predicted initial read voltage at least once, and acquire the first result corresponding to the adjusted read voltage after each adjustment. In some implementations, the peripheral circuit may be configured to, in response to the first result corresponding to the adjusted read voltage meeting a preset condition, determine the target valley voltage of the one or more code words.

In some implementations, a memory cell may be configured to store a plurality of memory bits, and the plurality of memory bits correspond to a plurality of stages of read voltages. In some implementations, the peripheral circuit may be configured to acquire the predicted initial read voltage of the one or more code words at a target stage, a predicted offset direction of the predicted initial read voltage, and a predicted boundary voltage according to the position of the word line coupled to the one or more code words in an open block, the position of the first blank physical page in the open block, and a stage of the target stage among the plurality of stages. In some implementations, the peripheral circuit may be configured to, in response to the adjusted predicted initial read voltage exceeding a range defined by the predicted boundary voltage, change a current offset direction while adjusting the predicted initial read voltage at least once.

In some implementations, the predicted offset direction of the predicted initial read voltage may be a direction in which a default read voltage is decreased.

In some implementations, the peripheral circuit may be configured to adjust the predicted initial read voltage for M times, perform M first adjustments on a read voltage to be adjusted with a first step size during a process of M adjustments, and respectively acquire M first results corresponding to the read voltage after the M first adjustments. In some implementations, the peripheral circuit may be configured to use the minimum first result in the M first results as a knee point value. In some implementations, a read voltage corresponding to the knee point value may include a knee voltage. In some implementations, the peripheral circuit may be configured to perform N second adjustments on the knee voltage with a second step size, and respectively acquire N first results corresponding to the read voltage after the N second adjustments. In some implementations, the second step size may be less than the first step size, and M and N may both positive integers greater than 1. In some implementations, the peripheral circuit may be configured to determine the target valley voltage according to the acquired N first results.

In some implementations, a memory cell may be configured to store a plurality of memory bits, and the plurality of memory bits may correspond to a plurality of stages of read voltages. In some implementations, the peripheral circuit may be configured to acquire a predicted valley voltage of the one or more code words at a target stage according to the first result corresponding to the one or more code words at the predicted initial read voltage at the target stage, and a stage of the target stage. In some implementations, the peripheral circuit may be configured to determine the target valley voltage of the target stage based on the predicted valley voltage of the target stage.

In some implementations, a memory cell may be configured to store a plurality of memory bits, and the plurality of memory bits may correspond to a plurality of stages of read voltages. In some implementations, the peripheral circuit may be configured to, after determining the target valley voltage of the one or more code words at a target stage, respectively determine target valley voltages of other stages in the plurality of stages other than the target stage.

In some implementations, the plurality of memory bits may respectively correspond to a plurality of pages. In some implementations, at least one page may correspond to the plurality of stages. In some implementations, the plurality of stages may include first stages and second stages. In some implementations, read voltages of the second stages may be less than read voltages of the first stages. In some implementations, the peripheral circuit may be configured to, when stages corresponding to the determined target valley voltages belong to the first stages, acquire predicted valley voltages of the second stages in the plurality of stages or the predicted valley voltages of the rest of the first stages with lower read voltages according to the determined target valley voltages. In some implementations, obtain target valley voltages of the second stage and the rest of the first stages according to the predicted valley voltages of the second stages in the plurality of stages or the predicted valley voltages of the rest of the first stages with lower read voltages.

In some implementations, the peripheral circuit may be configured to perform the read operation on the one or more code words according to the target valley voltages and the predicted valley voltages of all first stages and second stages.

In some implementations, the peripheral circuit may be configured to read storage data of the one or more code words at the first read voltage to obtain a second result. In some implementations, the peripheral circuit may be configured to perform a third adjustment on the first read voltage with a third step size to obtain the second read voltage, and read the storage data of the one or more code words at the second read voltage to obtain a third result. In some implementations, the peripheral circuit may be configured to perform a logical operation on the second result and the third result to obtain a fourth result. In some implementations, the peripheral circuit may be configured to count the number of bits in the fourth result that represent flipping in the third result compared to the second result, to obtain the first result.

In some implementations, the peripheral circuit may include a first latch configured to store the second result. In some implementations, the peripheral circuit may include a second latch configured to store the third result. In some implementations, the peripheral circuit may include a third latch configured to store the fourth result.

According to another aspect of the present disclosure, a memory system is provided. The memory system may include one or more memory devices. The one or more memory devices may include a memory cell array. The memory cell array may include a plurality of blocks. The plurality of blocks may include a plurality of word lines. The plurality of blocks may include a plurality of memory cells coupled to the plurality of word lines. The plurality of memory cells coupled to a same word line may form a physical page. A physical page may include one or more code words. The memory system may include a peripheral circuit coupled to the memory cell array. The peripheral circuit may be configured to acquire a predicted initial read voltage of the one or more code words according to a position of the word line coupled to the one or more code words in an open block and a position of a first blank physical page in the open block. The peripheral circuit may be configured to obtain a target valley voltage of the one or more code words according to a first result corresponding to the one or more code words at the predicted initial read voltage. The first result may include a number of bits representing flipping of the one or more code words in two read results at a first read voltage and a second read voltage. A difference between the first read voltage and the second read voltage may be less than a preset voltage. The target valley voltage may be used as a read voltage when a read operation is performed on the one or more code words. The memory system may include memory controller coupled with the one or more memory devices and configured to control the one or more memory devices.

In some implementations, the memory controller may be configured to send a data acquisition instruction. In some implementations, the data acquisition instruction may indicate acquisition of a target valley voltage. In some implementations, the memory device may be configured to receive the data acquisition instruction, acquire the target valley voltage, and send information comprising the target valley voltage to the memory controller. In some implementations, the memory controller may be further configured to perform a read operation on data stored in the memory device according to the target valley voltage in the information.

In some implementations, the memory controller may be further configured to perform an error correction code decoding operation on a read result of the read operation.

According to a further aspect of the present disclosure, a memory controller is provided. The memory controller may include a control section. The control section may be configured to acquire a predicted initial read voltage of one or more code words according to a position of a word line coupled to the one or more code words in an open block and a position of a first blank physical page in the open block. The one or more code words may be included a memory device coupled to the memory controller. The memory device comprising may include a plurality of blocks. The plurality of blocks may include a plurality of word lines and a plurality of memory cells coupled to the plurality of word lines. The plurality of memory cells coupled to a same word line may form a physical page. The physical page may include the one or more code words. The control section may be configured to obtain a target valley voltage of the one or more code words according to a first result corresponding to the one or more code words at the predicted initial read voltage. The first result may include a number of bits representing flipping of the one or more code words in two read results at a first read voltage and a second read voltage. A difference between the first read voltage and the second read voltage may be less than a preset voltage. The target valley voltage may be used as a read voltage when a read operation is performed on the one or more code words.

In some implementations, the control section may be configured to acquire an offset value corresponding to the predicted initial read voltage of the one or more code words according to a first offset value corresponding to a close block whose write moment difference with the open block is less than a preset time duration, a second offset value corresponding to a position of a word line coupled to the first blank physical page in all word lines of the open block, and a third offset value corresponding to a distance of the word line coupled to the one or more code words from the word line coupled to the first blank physical page in the open block. In some implementations, the control section may be configured to obtain the predicted initial read voltage of the one or more code words according to the offset value corresponding to the predicted initial read voltage.

In some implementations, the control section may be configured to respectively acquire the first offset value, the second offset value, and the third offset value. In some implementations, the control section may be configured to sum the first offset value, the second offset value, and the third offset value to obtain a total offset value. In some implementations, the control section may be configured to sum a default read voltage and the total offset value to obtain the predicted initial read voltage of the one or more code words.

In some implementations, the control section may be configured to, in response to the first result corresponding to the one or more code words at the predicted initial read voltage being less than a preset threshold, use the predicted initial read voltage as the target valley voltage of the one or more code words. In some implementations, the control section may be configured to, in response to the first result corresponding to the one or more code words at the predicted initial read voltage being greater than or equal to the preset threshold, adjust the predicted initial read voltage at least once, and acquire the first result corresponding to the adjusted read voltage after each adjustment. In some implementations, the control section may be configured to, in response to the first result corresponding to the adjusted read voltages meeting a preset condition, determine the target valley voltage of the one or more code words.

In some implementations, a memory cell may be configured to store a plurality of memory bits. In some implementations, the plurality of memory bits may correspond to a plurality of stages of read voltages. In some implementations, the control section may be configured to acquire the predicted initial read voltage of the one or more code words at a target stage, a predicted offset direction of the predicted initial read voltage, and a predicted boundary voltage according to the position of the word line coupled to the one or more code words in an open block, the position of the first blank physical page in the open block, and a stage of the target stage among the plurality of stages. In some implementations, the control section may be configured to, in response to the adjusted predicted initial read voltage exceeding a range defined by the predicted boundary voltage, change a current offset direction while adjusting the predicted initial read voltage at least once.

In some implementations, the predicted offset direction of the predicted initial read voltage may be a direction in which a default read voltage is decreased.

In some implementations, the control section may be configured to adjust the predicted initial read voltage for M times, perform M first adjustments on a read voltage to be adjusted with a first step size during a process of M adjustments, and respectively acquire M first results corresponding to the read voltage after the M first adjustments. In some implementations, the control section may be configured to use the minimum first result in the M first results as a knee point value. In some implementations, a read voltage corresponding to the knee point value may include a knee voltage. In some implementations, the control section may be configured to perform N second adjustments on the knee voltage with a second step size, and respectively acquire N first results corresponding to the read voltage after the N second adjustments. In some implementations, the second step size may be less than the first step size, and M and N may both be positive integers greater than 1. In some implementations, the control section may be configured to determine the target valley voltage according to the acquired N first results.

In some implementations, a memory cell may be configured to store a plurality of memory bits, and the plurality of memory bits may correspond to a plurality of stages of read voltages. In some implementations, the control section may be configured to acquire a predicted valley voltage of the one or more code words at a target stage according to the first result corresponding to the one or more code words at the predicted initial read voltage at the target stage, and a stage of the target stage. In some implementations, the control section may be configured to determine the target valley voltage of the target stage based on the predicted valley voltage of the target stage.

In some implementations, a memory cell may be configured to store a plurality of memory bits, and the plurality of memory bits may correspond to a plurality of stages of read voltages. In some implementations, the control section may be configured to, after determining the target valley voltage of the one or more code words at a target stage, respectively determine target valley voltages of other stages in the plurality of stages other than the target stage.

In some implementations, the plurality of memory bits may respectively correspond to a plurality of pages. In some implementations, at least one page may correspond to the plurality of stages. In some implementations, the plurality of stages may include first stages and second stages. In some implementations, read voltages of the second stages may be less than read voltages of the first stages. In some implementations, the control section may be configured to, when stages corresponding to the determined target valley voltages belong to the first stages, acquire predicted valley voltages of the second stages in the plurality of stages or predicted valley voltages of the rest of the first stages with lower read voltages according to the determined target valley voltages. In some implementations, the control section may be configured to obtain target valley voltages of the second stage and the rest of the first stages according to the predicted valley voltages of the second stages in the plurality of stages or the predicted valley voltages of the rest of the first stages with lower read voltages.

In some implementations, the control section may be configured to perform the read operation on the one or more code words according to the target valley voltages and the predicted valley voltages of all first stages and second stages.

According to still another aspect of the present disclosure, a method of operating a memory device is provided. The method may include acquiring a predicted initial read voltage of one or more code words according to a position of the word line coupled to the one or more code words in an open block and a position of a first blank physical page in the open block. The one or more code words may be included in the memory device. The memory device may include a plurality of blocks. The plurality of blocks may include a plurality of word lines and a plurality of memory cells coupled to the plurality of word lines. The plurality of memory cells coupled to a same word line may form a physical page. A physical page may include the one or more code words. The method may include obtaining a target valley voltage of the one or more code words according to a first result corresponding to the one or more code words at the predicted initial read voltage. The first result may include a number of bits representing flipping of the one or more code words in two read results at a first read voltage and a second read voltage, and a difference between the first read voltage and the second read voltage is less than a preset voltage. The target valley voltage may be used as a read voltage when a read operation is performed on the one or more code words.

According to still a further aspect of the present disclosure, a method of operating a memory system is provided. The method may include sending, by a memory controller in a memory system, a data acquisition instruction. The data acquisition instruction may indicate acquisition of a target valley voltage. The method may include receiving, by a memory device in the memory system, the data acquisition instruction, acquiring the target valley voltage according to an operation method of a memory device, and sending information comprising the target valley voltage to the memory controller. The method may include performing, by the memory controller, a read operation on data stored in the memory device according to the target valley voltage in the information. The memory device may include a plurality of blocks. The plurality of blocks may include a plurality of word lines and plurality of memory cells coupled to the plurality of word lines. The plurality of memory cells coupled to a same word line may form a physical page. A physical page comprises one or more code words. The operation method of the memory device may include acquiring a predicted initial read voltage of the one or more code words according to a position of the word line coupled to the one or more code words in an open block and a position of a first blank physical page in the open block. The operation method of the memory device may include obtaining a target valley voltage of the one or more code words according to a first result corresponding to the one or more code words at the predicted initial read voltage. The first result may include a number of bits representing flipping of the one or more code words in two read results at a first read voltage and a second read voltage, and a difference between the first read voltage and the second read voltage may be less than a preset voltage. The target valley voltage may be used as a read voltage when a read operation is performed on the one or more code words.

According to yet another aspect of the present disclosure, a method of operating a memory controller is provided. The method may include acquiring a predicted initial read voltage of one or more code words according to a position of the word line coupled to the one or more code words in an open block and a position of a first blank physical page in the open block. The one or more code words may be included in a memory device. The memory controller may be coupled with at least one memory device. The memory device may include a plurality of blocks. The plurality of blocks may include a plurality of word lines and a plurality of memory cells coupled to the plurality of word lines. The plurality of memory cells coupled to a same word line may form a physical page. The physical page may include the one or more code words. The method may include obtaining a target valley voltage of the one or more code words according to a first result corresponding to the one or more code words at the predicted initial read voltage. The first result may include a number of bits representing flipping of the one or more code words in two read results at a first read voltage and a second read voltage. A difference between the first read voltage and the second read voltage may be less than a preset voltage. The target valley voltage may be used as a read voltage when a read operation is performed on the one or more code words.

According to yet a further aspect of the present disclosure, a non-transitory computer-readable medium, having executable instructions stored thereon, which when executed by a memory device, cause the memory device to perform operations is provided. The operations may include acquiring a predicted initial read voltage of one or more code words according to a position of the word line coupled to the one or more code words in an open block and a position of a first blank physical page in the open block. The memory device may include a plurality of blocks. The plurality of blocks may include a plurality of word lines and a plurality of memory cells coupled to the plurality of word lines. The plurality of memory cells coupled to a same word line may form a physical page. The physical page may include the one or more code words. The operations may include obtaining a target valley voltage of the one or more code words according to a first result corresponding to the one or more code words at the predicted initial read voltage. The first result may include a number of bits representing flipping of the one or more code words in two read results at a first read voltage and a second read voltage, and a difference between the first read voltage and the second read voltage may be less than a preset voltage. The target valley voltage may be used as a read voltage when a read operation is performed on the one or more code words.

According to yet a further aspect of the present disclosure, a non-transitory computer-readable medium, having executable instructions stored thereon, which when executed by a memory system, cause the memory system to perform operations is provided. The operations may include sending, by a memory controller in the memory system, a data acquisition instruction. The data acquisition instruction may indicate acquisition of a target valley voltage. The operations may include receiving, by a memory device in the memory system, the data acquisition instruction. The operations may include acquiring the target valley voltage according to an operation method of a memory device, and sending information comprising the target valley voltage to the memory controller. The operations may include performing, by the memory controller, a read operation on data stored in the memory device according to the target valley voltage in the information. The memory device may include a plurality of blocks. The plurality of blocks may include a plurality of word lines and a plurality of memory cells coupled to the plurality of word lines. The plurality of memory cells coupled to a same word line may form a physical page. The physical page may include one or more code words. The operation method of the memory device may include acquiring a predicted initial read voltage of the one or more code words according to a position of the word line coupled to the one or more code words in an open block and a position of a first blank physical page in the open block. The operation method of the memory device may include obtaining a target valley voltage of the one or more code words according to a first result corresponding to the one or more code words at the predicted initial read voltage. The first result may include a number of bits representing flipping of the one or more code words in two read results at a first read voltage and a second read voltage, and a difference between the first read voltage and the second read voltage is less than a preset voltage. The target valley voltage may be used as a read voltage when a read operation is performed on the one or more code words.

According to yet a further aspect of the present disclosure, a non-transitory computer-readable medium, having executable instructions stored thereon, which when executed by a memory controller coupled to a memory device, cause the memory controller to perform operations is provided. The operations may include acquiring a predicted initial read voltage of one or more code words according to a position of the word line coupled to the one or more code words in an open block and a position of a first blank physical page in the open block. The memory device may include a plurality of blocks. The plurality of blocks may include a plurality of word lines and a plurality of memory cells coupled to the plurality of word lines. The plurality of memory cells coupled to a same word line may form a physical page. The physical page may include the one or more code words. The operations may include obtaining a target valley voltage of the one or more code words according to a first result corresponding to the one or more code words at the predicted initial read voltage. The first result may include a number of bits representing flipping of the one or more code words in two read results at a first read voltage and a second read voltage, and a difference between the first read voltage and the second read voltage may be less than a preset voltage. The target valley voltage may be used as a read voltage when a read operation is performed on the one or more code words.

BRIEF DESCRIPTION OF THE DRAWINGS

In the drawings, unless stated otherwise, same reference numerals throughout a plurality of drawings represent same or similar parts or elements. These drawings are not necessarily drawn to scale. It is to be understood that these drawings merely describe some implementations disclosed according to examples of the present disclosure, and should not be considered as limiting the scope of the present disclosure.

FIG. 7 is a schematic diagram of an implementation flow of an operation method that a peripheral circuit of a memory device is configured to perform provided by an example of the present disclosure;

FIG. 8 is a schematic diagram of data state distribution of physical pages corresponding to word lines in an open block provided by an example of the present disclosure;

DETAILED DESCRIPTION

Figure 1:
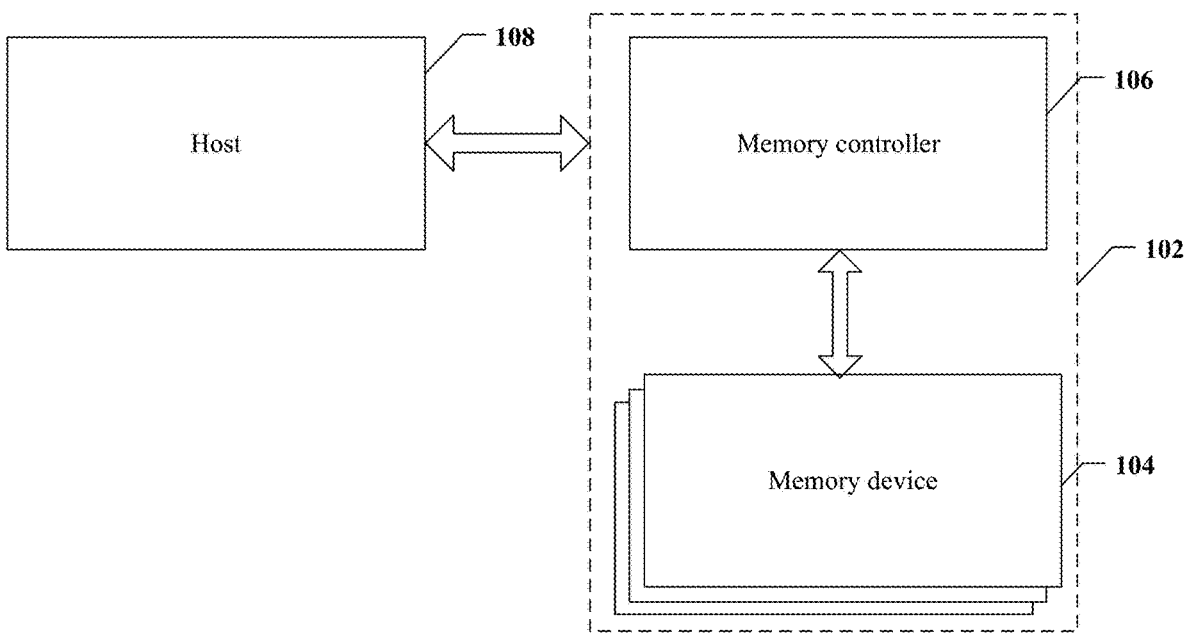
FIG. 1 is a schematic diagram of an example system having a memory system according to an example of the present disclosure.

Example implementations disclosed by the present disclosure will be described below in more detail with reference to the drawings. Although example implementations of the present disclosure are shown in the figures, it is to be understood that the present disclosure may be implemented in various forms without being limited by the example implementations as set forth herein. On the contrary, these implementations are provided for more thorough understanding of the present disclosure, and can fully convey a scope disclosed by the present disclosure to a person skilled in the art.

In the following descriptions, a lot of example details are given in order to provide the more thorough understanding of the present disclosure. However, it is apparent to a person skilled in the art that the present disclosure may be implemented without one or more of these details. In other examples, in order to avoid confusion with the present disclosure, some technical features well-known in the field are not described. That is, all the features of the actual examples are not described here, and well-known functions and structures are not described in detail.

In addition, the drawings are merely schematic illustrations of the present disclosure and are not necessarily drawn to scale. The same reference numerals in the drawings denote same or similar portions, and thus repeated descriptions will be omitted. Some of the block diagrams shown in the drawings are functional entities and do not necessarily have to correspond to physically or logically separate entities. These functional entities may be implemented in a software form, or in one or more hardware modules or integrated circuits, or in different networks and/or processor devices and/or microcontroller devices.

The flowcharts shown in the drawings are exemplary descriptions only and are not required to comprise all operations. For example, some operations can also be broken down, while others can be combined or partially combined, such that an actual level of performing is likely to change depending on actual situations.

A purpose of the terms used here is only to describe the examples and not as limitation to the present disclosure. As used herein, unless otherwise indicated expressly in the context, "a", "one" and "the" in a singular form are also intended to include a plural form. It should also be understood that terms "comprised of" and/or "comprising", while used in the description, determine the existence of the described features, integers, steps, operations, elements and/or components, but do not exclude the existence of one or more other features, integers, steps, operations, elements, components, and/or groups. As used herein, a term "and/or" comprises any and all combinations of related items listed.

A memory device in examples of the present disclosure includes, but is not limited to, a three-dimensional NAND memory. For ease of understanding, the three-dimensional NAND memory is used as an example for description.

FIG. 1 shows a block diagram of an example system 100 having a memory device according to some aspects of the present disclosure. The system 100 may include a mobile phone, a desktop computer, a laptop computer, a tablet computer, a vehicle computer, a gaming console, a printer, a positioning apparatus, a wearable electronic apparatus, a smart sensor, a virtual reality (VR) apparatus, an augmented reality (AR) apparatus, or any other suitable electronic apparatus having a memory. As shown in FIG. 1, the system 100 may include a host 108 and a memory system 102, and the memory system 102 is provided with one or more memory devices 104 and a memory controller 106. The host 108 may be a control section (e.g., a central processing unit (CPU)) of an electronic apparatus, or a system on chip (SoC) (such as an application processor (AP)). The host 108 may be configured to send or receive data to or from the memory device 104.

According to some implementations, the memory controller 106 is coupled to the memory device 104 and the host 108, and is configured to control the memory device 104. The memory controller 106 may manage data stored in the memory device 104, and communicate with the host 108. In some implementations, the memory controller 106 is designed for operating in a low duty-cycle environment, such as secure digital (SD) cards, compact flash (CF) cards, universal serial bus (USB) flash drives, or other media for use in electronic apparatuses, such as personal computers, digital cameras, mobile phones, etc.

In some implementations, the memory controller 106 is designed for operating in high duty-cycle environment of solid state disks (SSD) or embedded multi-media cards (eMMC) used as data memories for mobile apparatuses, such as smartphones, tablets, laptop computers, etc., and enterprise memory arrays.

The memory controller 106 may further be configured to control operations of the memory device 104, such as read, erase, and program operations. The memory controller 106 may further be configured to manage various functions with respect to data stored or to be stored in the memory device 104, including, but not limited to, bad-block management, garbage collection, logical-to-physical address translation, wear leveling, etc. In some implementations, the memory controller 106 is further configured to process error correction codes with respect to the data read from or written to the memory device 104.

The memory controller 106 may further perform any other suitable functions as well, for example, formatting the memory device 104. The memory controller 106 may communicate with an external apparatus (e.g., the host 108) according to an example communication protocol. For example, the memory controller 106 may communicate with the external apparatus through at least one of various interface protocols, such as a USB protocol, an MMC protocol, a peripheral component interconnection (PCI) protocol, a PCI-Express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The memory controller 106 and the one or more memory devices 104 can be integrated into various types of storage apparatuses, for example, be included in the same package, such as a Universal Flash Storage (UFS) package or an eMMC package. That is to say, the memory system 102 may be implemented and packaged into different types of end electronic products.

Figure 2A:
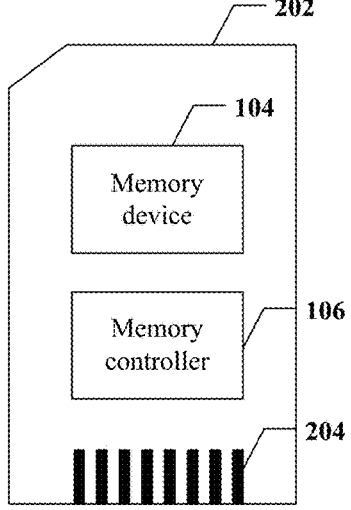
FIG. 2A is a schematic diagram of an example memory card having a memory system according to an example of the present disclosure.

In an example shown in FIG. 2a, the memory controller 106 and the single memory device 104 may be integrated into a memory card 202. The memory card 202 may include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card 202 may further include a memory card connector 204 coupling the memory card 202 with a host (e.g., the host 108 in FIG. 1).

Figure 2B:
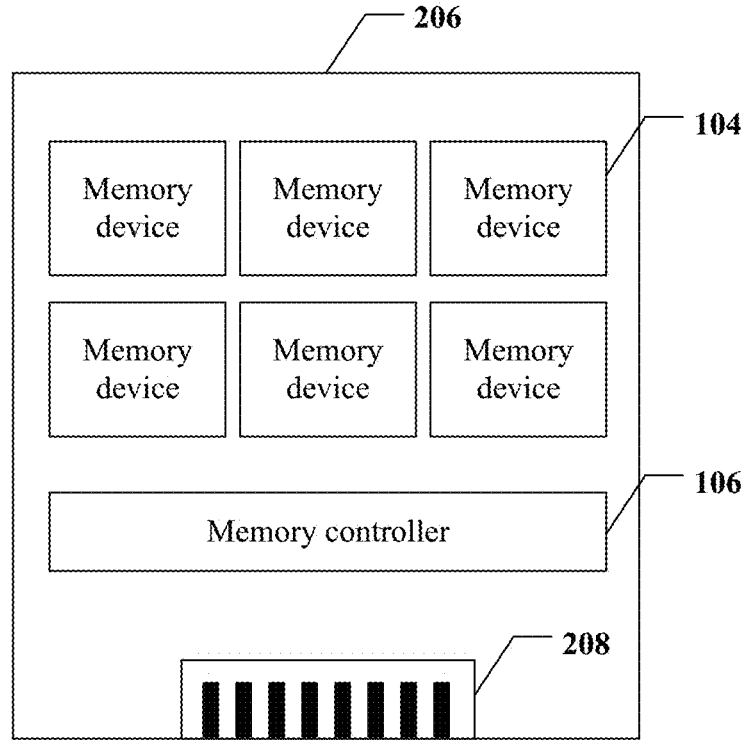
FIG. 2B is a schematic diagram of an example solid-state drive having a memory system according to an example of the present disclosure.

In another example as shown in FIG. 2b, the memory controller 106 and a plurality of memory devices 104 may be integrated into an SSD 206. The SSD 206 may further include an SSD connector 208 coupling the SSD 206 with a host (e.g., the host 108 in FIG. 1). In some implementations, at least one of a storage capacity or an operation speed of the SSD 206 is greater than at least one of a storage capacity and/or an operation speed of the memory card 202.

In some examples, each block may be coupled to a plurality of word lines, and a plurality of memory cells coupled to each word line form a physical page.

Figure 3:
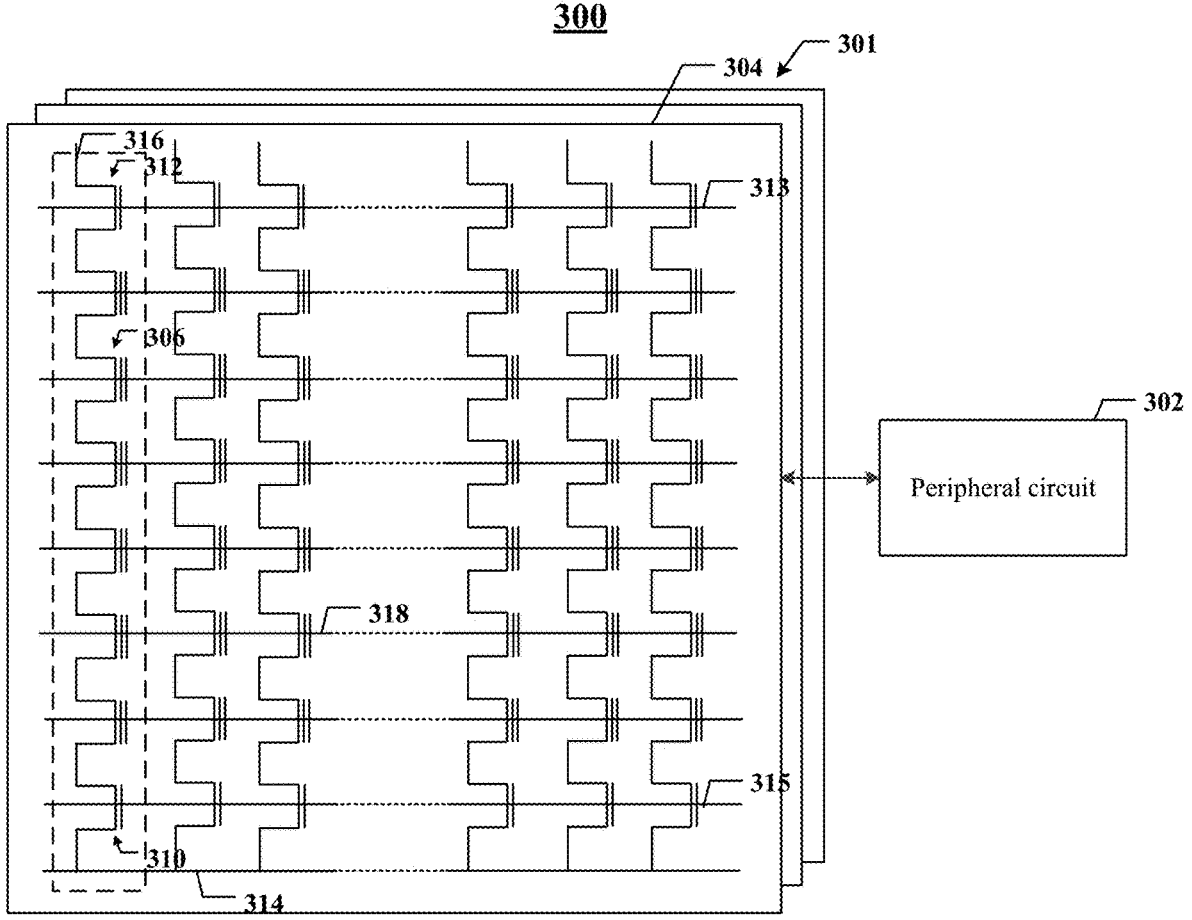
FIG. 3 is a schematic diagram of an example memory comprising a peripheral circuit according to an example of the present disclosure.

FIG. 3 shows a schematic circuit diagram of an example memory device 300 including a peripheral circuit according to some aspects of the present disclosure. The memory device 300 may be an example of the memory device 104 in FIG. 1. The memory device 300 may include a memory cell array 301 and a peripheral circuit 302 coupled to the memory cell array 301. For example, the memory cell array 301 is a three-dimensional NAND memory array, where a memory cell 306 is a NAND cell; the memory cell 306 is provided in the form of an array of memory strings 308; and each memory string 308 perpendicularly extends above a substrate (not shown). In some implementations, each memory string 308 may include a plurality of memory cells 306 coupled in series and stacked perpendicularly. Each memory cell 306 may maintain a continuous analog value, such as voltage or charge, which depends on the number of electrons trapped within a region of the memory cells 306. Each memory cell 306 may be either a floating gate type memory cell that includes a floating gate transistor, or a charge trapping type memory cell that includes a charge trapping transistor.

In some implementations, each memory cell 306 is a single-level cell (SLC) that has two possible storage states and thus may store one bit of data. For example, a first storage state "0" may correspond to a first voltage range, and a second storage state "1" may correspond to a second voltage range. In some implementations, each memory cell 306 is a multi-level cell (MLC) that can store more than one bit of data in more than four storage states. For example, the MLC can store two bits per cell (which may also be called a double-level cell), three bits per cell (also called a trinary-level cell (TLC)), four bits per cell (also called a quad-level cell (QLC)), five bits per cell (also called a penta-level cell (PLC)), or more than five bits per cell. Each MLC can be programmed to assume a range of possible nominal storage values. In an example, if each MLC stores two bits of data, the MLC can be programmed to take one of three possible programmed levels from an erased state by writing one of three possible nominal storage values to the cell, and a fourth nominal storage value may be used for the erased state.

It is to be noted that the storage state described here is the storage state of the memory cell described in the present disclosure. Different memory cells have different numbers of storage states, for example, a SLC-type memory cell has 2 storage states (e.g., two memory states), where the 2 storage states include a programmed state and an erased state. For another example, a MLC-type memory cell has 4 storage states, where the 4 storage states include an erased state and 3 programmed states. For yet another example, a TLC-type memory cell has 8 storage states, where the 8 storage states include an erased state and 7 programmed states. In some implementations, a QLC-type memory cell has 16 storage states, where the 16 storage states include an erased state and 7 programmed states.

As shown in FIG. 3, each memory string 308 may include a bottom select transistor (BSG) 310 (also referred to as a source side select transistor) at a source terminal of the memory string and a top select transistor (TSG) 312 (also referred to as a drain side select transistor) at a drain terminal of the memory string. The BSG 310 and the TSG 312 may be configured to activate a selected memory string 308 during read and program operations. In some implementations, sources of memory strings 308 in a same block 304 are coupled through a same source line (SL) 314 (for example, a common SL). In other words, according to some implementations, all the memory strings 308 in the same block 304 have an array common source (ACS). According to some implementations, the TSG 312 of each memory string 308 is coupled to a respective bit line (BL) 316, and data may be read or written from the bit line 316 via an output bus (not shown). In some implementations, each memory string 308 is configured to be selected or unselected by applying a select voltage (e.g., above a threshold voltage of a transistor having the TSG 312) or an unselect voltage (e.g., 0 V) to the respective TSG 312 via one or more TSG lines 313 and/or by applying a select voltage (e.g., above a threshold voltage of a transistor having the BSG 310) or an unselect voltage (e.g., 0 V) to the respective BSG 310 via one or more BSG lines 315.

As shown in FIG. 3, the memory strings 308 may be organized into a plurality of blocks 304, and each of the plurality of blocks 304 may have a common source line 314 (e.g., coupled to the ground). In some implementations, each block 304 is a basic data unit for an erase operation, e.g., all of the memory cells 306 on the same block 304 are erased at the same time. In order to erase the memory cells 306 in a selected block 304, the source lines 314 coupled to the selected block 304a as well as unselected blocks 304 that are in the same plane as the selected block 304a can be biased with an erase voltage (Vers, such as a high positive voltage (e.g., 20 V or higher)). It is to be understood that in some examples, the erase operation may be performed at a half block level, a quarter block level, or a level having any suitable number of blocks or any suitable fractions of a block. The memory cells 306 of adjacent ones of the memory strings 308 may be coupled through a word line 318 that selects which row of memory cells 306 is affected by the read and program operations.

Referring to FIG. 3, each of the plurality of memory cells 306 is coupled to the respective word line 318, and each memory string 308 is coupled to the respective bit line 316 through a respective select transistor (such as, the top select transistor (TSG) 312).

Figure 4:
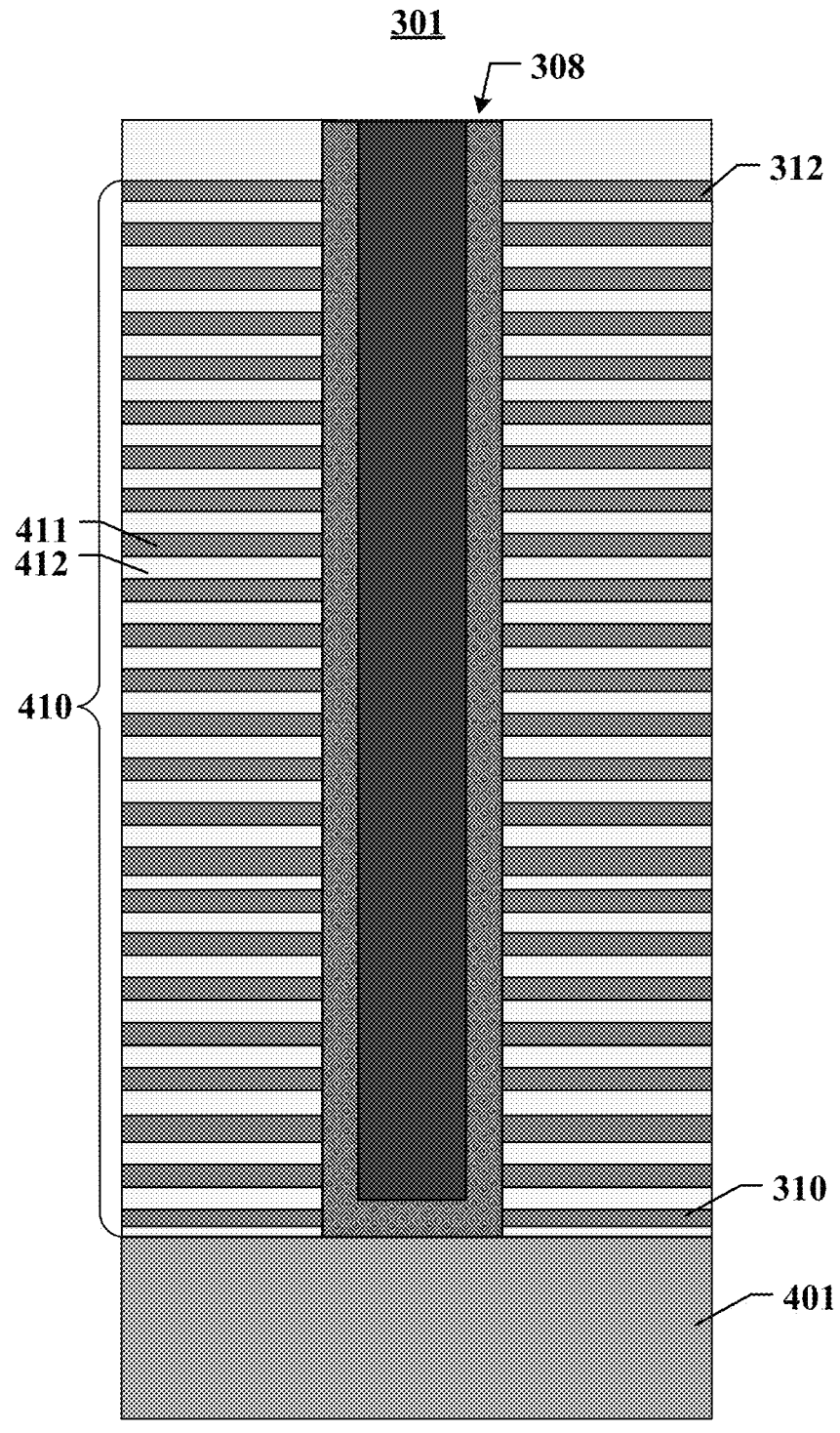
FIG. 4 is a schematic cross-sectional view of a memory cell array comprising a NAND memory string according to an example of the present disclosure.

FIG. 4 shows a schematic cross-sectional view of an example memory cell array 301 including a memory string 308 with NAND as an example according to some aspects of the present disclosure. As shown in FIG. 4, the NAND memory cell array 301 may include a stack structure 410. The stack structure 410 includes a plurality of gate layers 411 and a plurality of insulation layers 412 that are sequentially and alternately stacked and a channel structure that penetrates the gate layers 411 and the insulation layers 412 vertically. The channel structure is coupled with each gate layer to form a memory cell. The channel structure is coupled with the plurality of gate layers in the stack structure 410 to form the memory string 308. The gate layers 411 and the insulation layers 412 may be alternately stacked, and two adjacent gate layers 411 are spaced apart by one insulation layer 412.

A constituent material of the gate layers 411 may include a conductive material. The conductive material includes, but is not limited to, tungsten (W), cobalt (Co), copper (Cu), aluminum (Al), polysilicon, doped silicon, silicides, or any combination thereof. In some implementations, each gate layer 411 includes a metal layer, e.g., a tungsten layer. In some implementations, each gate layer 411 includes a doped polysilicon layer. Each gate layer 411 may include a control gate around a memory cell. The gate layer 411 at the top of the stack structure 410 may extend laterally as a top select gate line; the gate layer 411 at the bottom of the stack structure 410 may extend laterally as a bottom select gate line; and the gate layers 411 that extend laterally between the top select gate line and the bottom select gate line may act as word line layers.

In some examples, the stack structure 410 may be disposed on a substrate 401. The substrate 401 may include silicon (e.g., single crystalline silicon), silicon germanium (SiGe), gallium arsenide (GaAs), germanium (Ge), silicon on insulator (SOI), germanium on insulator (GOI), or any other suitable materials.

In some examples, the memory string 308 includes a channel structure that extends through the stack structure 410 vertically. In some implementations, the channel structure includes a channel hole filled with (one or more) semiconductor materials (e.g., as a semiconductor channel) and (one or more) dielectric materials (e.g., as a memory film). In some implementations, the semiconductor channel includes silicon, e.g., polysilicon. In some implementations, the memory film is a composite dielectric layer including a tunneling layer, a storage layer (also known as a "charge trap/storage layer"), and a blocking layer. The channel structure may have a cylindrical shape (e.g., a pillar shape). According to some implementations, the semiconductor channel, the tunneling layer, the storage layer, and the blocking layer are arranged radially from the center toward the outer surface of the pillar in this order. The tunneling layer may include silicon oxide, silicon oxynitride, or any combination thereof. The storage layer may include silicon nitride, silicon oxynitride, or any combination thereof. The blocking layer may include silicon oxide, silicon oxynitride, a high dielectric constant (high-k) dielectric, or any combination thereof. In an example, the memory film may include a composite layer of silicon oxide/silicon oxynitride/silicon oxide (ONO).

Figure 5:
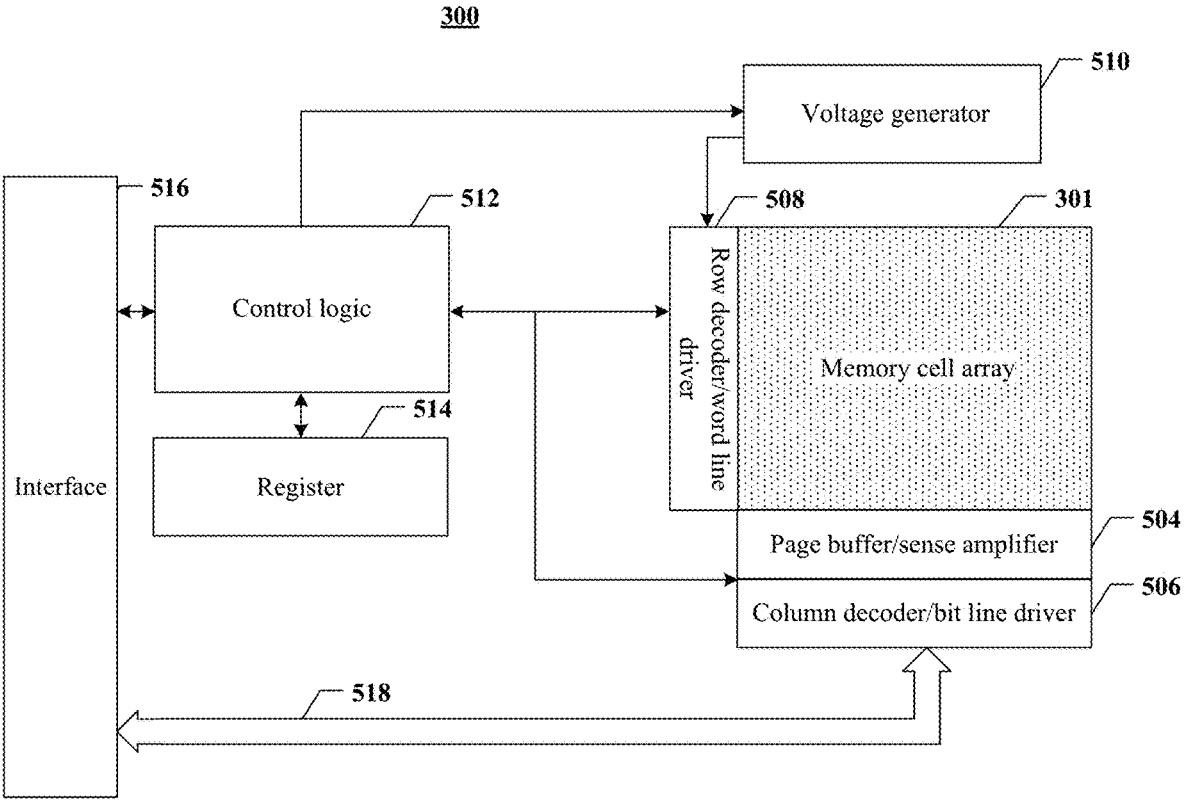
FIG. 5 is a schematic diagram of an example memory device comprising a memory cell array and a peripheral circuit according to an example of the present disclosure.

Referring back to FIG. 3, the peripheral circuit 302 may be coupled to the memory cell array 301 through the bit lines 316, the word lines 318, the source lines 314, the BSG lines 315, and the TSG lines 313. The peripheral circuit 302 may include any suitable analog, digital, and hybrid signal circuits for facilitating the operations of the memory cell array 301 by applying and sensing voltage signals and/or current signals to and from each target memory cell 306 via the bit lines 316, the word lines 318, the source lines 314, the BSG lines 315, and the TSG lines 313. The peripheral circuit 302 may include various types of peripheral circuits formed using a metal-oxide-semiconductor (MOS) technology. For example, FIG. 5 shows some example peripheral circuits. The peripheral circuit includes a page buffer/sense amplifier 504, a column decoder/bit line driver 506, a row decoder/word line driver 508, a voltage generator 510, a control logic 512, a register 514, an interface 516, and a data bus 518. It is to be understood that, in some examples, additional peripheral circuits not shown in FIG. 5 may also be included as well.

The page buffer/sense amplifier 504 may be configured to read and program (write) data from and to the memory cell array 301 according to a control signal from the control logic 512. In one example, the page buffer/sense amplifier 504 may store program data (write data) to be programmed into the memory cell array 301. In another example, the page buffer/sense amplifier 504 may perform a program verification operation to ensure that the data has been properly programmed into the memory cell 306 coupled to the selected word line 318. In yet another example, the page buffer/sense amplifier 504 may also sense a low power signal from the bit line 316 that represents a data bit stored in the memory cell 306, and amplifies a small voltage swing to a recognizable logic level in the read operation. The column decoder/bit line driver 506 may be configured to be controlled by the control logic 512 and select one or more memory strings 308 by applying a bit line voltage acquired from the voltage generator 510.

The row decoder/word line driver 508 may be configured to be controlled by the control logic 512, select/unselect the blocks 304 of the memory cell array 301, and select/unselect the word lines 318 of the blocks 304. The row decoder/word line driver 508 may be further configured to drive the word lines 318 using a word line voltage acquired from the voltage generator 510. In some implementations, the row decoder/word line driver 508 may also select/unselect and drive the BSG line 315 and the TSG line 313. As described below in detail, the row decoder/word line driver 508 is configured to perform the program operation on the memory cells 306 that are coupled to (one or more) selected word line 318. The voltage generator 510 may be configured to be controlled by the control logic 512 and acquire a word line voltage (such as, a read voltage, a program voltage, a pass voltage, a channel boost voltage, a verify voltage, etc.), a bit line voltage, and a source line voltage to be supplied to the memory cell array 301.

The control logic 512 can be coupled to each of the other portions in the peripheral circuit described above and configured to control the operations of each of the other portions in the peripheral circuit. The register 514 may be coupled to the control logic 512 and include a state register, a command register, and an address register for storing state information, a command operation code (OP code), and a command address for controlling the operation of each peripheral circuit. The interface 516 may be coupled to the control logic 512, and act as a control buffer to buffer and relay control commands received from a host (not shown) to the control logic 512 and state information received from the control logic 512 to the host. The interface 516 may also be coupled to the column decoder/bit line driver 506 via the data bus 518 and act as a data I/O interface and a data buffer to buffer and relay the data to and from the memory cell array 301.

The basic principle of the three-dimensional NAND memory is that carriers (electrons or holes) cross a charge barrier to inject a certain amount of charges into a memory cell to complete the process of writing data, and then the stored data may be read according to a threshold voltage when the memory cell is on. Therefore, in order to read correct data, an error correction algorithm with strong error correction capability and high efficiency is generally introduced when the data is read.

However, as use time grows, the charges stored in the memory cell vary with increased use time, repeated read operations, crossover temperatures, etc., thus affecting the correctness of data reading. When the threshold voltage is relatively significantly offset upward or downward, and when an original read voltage is employed to read the data of the memory cell, the possibility of a read error is very high; and when the read error exceeds the error correction capability, the reading of the data of the memory cell fails.

Figure 6:
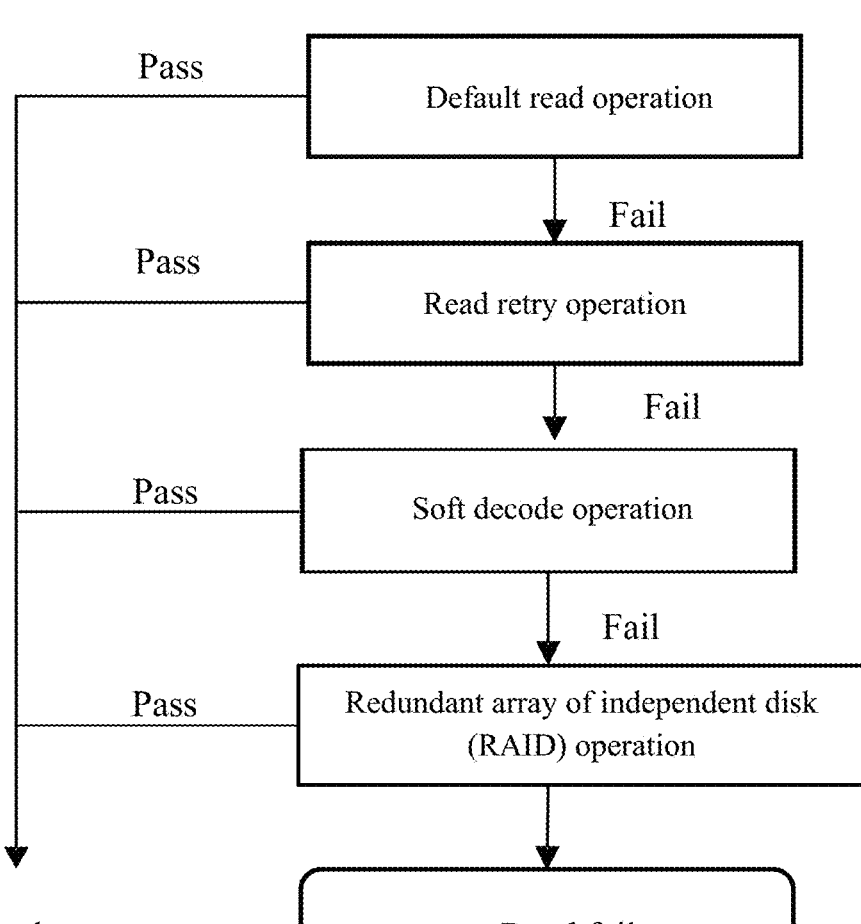
FIG. 6 is a schematic diagram of an example read operation flow of a memory system provided by the present disclosure.

FIG. 6 shows a schematic diagram of an example read operation flow of a memory system. As shown in FIG. 6, when a memory controller controls the memory device to perform a read operation, a default read operation (a FW default read) is first performed on the memory cell of a respective physical address; a read retry operation is performed after the default read operation fails; a soft decode operation is performed after the read retry operation fails; a redundant array of independent disk (RAID) operation is performed after the soft decode operation fails; the read operation stops and fails due to incapability of error correction after the RAID operation fails; and the memory controller sends a read fail signal to the host 108. The read retry operation and the default read operation may be applied to hard decoding.

In some implementations, the read retry operation may generally be performed by querying a retry table (or referred to as a trial and error table) provided by a manufacturer. The nature of the read retry operation is an error correction mechanism; a read retry table may provide a reference voltage for reading data; each memory cell is read again by querying the read retry table to try a read voltage deviating from the normal threshold voltage, and error correction is performed in cooperation with the error correction algorithm, so as to try to correctly read the data. The read retry table is stopped to be queried if the data with a read error is corrected. The read retry table is kept querying if the data with the read error is not corrected, until the entire read retry table is traversed.

The above read retry operation needs to query the read retry table item by item, such that the number of trials and errors is increased accordingly, which takes more time. Furthermore, the read retry table provided by the manufacturer only includes some reference values in some example environments, but a real application scenario is ever-changing, such that the read retry table provided by the manufacturer cannot cover many scenarios. In this case, the data might not be corrected by traversing the read retry table, causing an increase in latency to process commands. In a word, an undesirable amount of time is expended by repeatedly polling the read retry table for the read retry operations, affecting response time of subsequent commands, and thus affecting the performance of a device.

Based on one or more problems described above, according to a first aspect, examples of the present disclosure provide a memory device.

As shown in FIG. 7, the memory device includes: a memory cell array including a plurality of blocks, where the blocks include a plurality of word lines, and a plurality of memory cells coupled to the plurality of word lines, the plurality of memory cells coupled to a same word line form a physical page, and one physical page includes one or more code words; and a peripheral circuit coupled to the memory cell array and configured to perform the following operations.

For example, operation S10 includes acquiring a predicted initial read voltage of the code words, according to a position of the word line coupled to the code words in an open block and a position of a first blank physical page in the open block; and operation S20 includes obtaining a target valley voltage of the code words according to a first result corresponding to the code words at the predicted initial read voltage, where the first result includes the number of bits representing the flipping of the code words in two read results at a first read voltage and a second read voltage, and a difference between the first read voltage and the second read voltage is less than a preset voltage; and the target valley voltage is used as a read voltage when a read operation is performed on the code words.

Here, a structure of the memory device is referred to FIG. 3 described above, and is not repeatedly described here again.

In some examples, the memory device includes the memory cell array; and the memory cell array includes the plurality of blocks, and each block includes the plurality of word lines and the plurality of memory cells coupled to each word line. All memory cells coupled to one word line form one physical page. The preset number of memory cells forms one code word (CW). One physical page includes one or more code words.

In some examples, the number of the memory cells included in one code word is the same as the number of the memory cells included in one coding or decoding when error correction coding or decoding is performed. In some examples, the number of the memory cells included in one code word may be less than or equal to the number of the memory cells coupled to one physical page. For example, the number of the memory cells included in one code word is ¼ of the number of the memory cells coupled to one physical page. In some examples, the code word may include the memory cells with the number ranging from $2^4$ to $2^{12}$. In an example, the code word may include $2^4$, $2^8$, or $2^{12}$ memory cells.

In general, different memory systems may select the code words with different sizes, so as to meet the performance, reliability, and storage requirements of the memory systems.

The memory cells (e.g., MLC, TLC, or QLC) in different types of the memory devices may store different numbers of bits. It can be understood that a code word may include the plurality of memory cells, and the number of the memory cells included in the code word may be adjusted according to actual situations.

It is to be noted that the code word may have some extra reserved spaces for management and error correction, such that the number of the memory cells actually required may slightly exceed the above-mentioned calculation result.

Herein, the open block includes a block having two data states, which are a programmed state and an erased state. The open block is activated or enabled to a program operation. In examples of the present disclosure, the block in which at least one code word, for which a read operation is to be performed, is located is one open block. The position of the word line coupled to the code word in the open block may be understood as the position of the word line coupled to the at least one code word, for which the read operation is to be performed, in all word lines of the open block. The at least one code word, for which the read operation is to be performed, is the memory cells in which data has been written in the open block.

Herein, the first blank physical page may be understood as the first physical page of which data states appearing in the open block are all erased states according to a program sequence. The position of the first blank physical page in the open block may be understood as the position, in the open block, of the word line (the word line coupled to the first blank physical page is referred to as an open WL) coupled to the first blank physical page in the open block.

Herein, the predicted initial read voltage is related to the position of the word line coupled to the code word to be read in the open block, and the position of the first blank physical page in the open block, and is used for forming the subsequent target valley voltage. Herein, the target valley voltage is used as the read voltage when the read operation is performed on the code word. Compared to the target valley voltage obtained by directly utilizing a default read voltage (an offset value corresponding to the default read voltage is 0) for a plurality of loop iterations, the predicted initial read voltage obtained by considering the aforementioned two positions may reduce the number of loop iterations, so as to obtain the target valley voltage more rapidly.

An example implementation of acquiring the predicted initial read voltage of the code word according to the position of the word line coupled to the code word in the open block, and the position of the first blank physical page in the open block is provided below.

In some examples, the peripheral circuit is configured to: acquire an offset value corresponding to the predicted initial read voltage of the code word according to a first offset value corresponding to a close block whose write moment difference with the open block is less than a preset time duration, a second offset value corresponding to a position of a word line coupled to the first blank physical page in all word lines of the open block, and a third offset value corresponding to a distance of the word line coupled to the code word from the word line coupled to the first blank physical page in the open block; and obtain the predicted initial read voltage of the code word according to the offset value corresponding to the predicted initial read voltage.

Herein, a close block is opposite to an open block; and the close block includes a block in which data states are all programmed states. The close block is closed to the program operation. The close block in the examples of the present disclosure refers to a close block whose write moment difference with the open block in which the code word, for which the read operation is to be performed, is located is less than the preset time duration. Herein, the preset time duration may be set according to actual situations. In some examples, the preset time duration may be 1 ms-10 s. That is to say, the close block in the examples of the present disclosure is a close block whose write moment difference with the open clock in which the code word, for which the read operation is to be performed, is located is small and with a subsequent application scenario similar to the open block due to the fact that the close block and the open block are in the same memory device.

It can be understood that, the offset value corresponding to the initial read voltage corresponding to the code word, for which the read operation is to be performed, in the open block in the examples of the present disclosure is acquired on the basis of the first offset value corresponding to the close block by further considering the impact of the second offset value corresponding to the position of the word line coupled to the first blank physical page in all the word lines of the open block, and the third offset value corresponding to the distance of the word line coupled to the code word, for which the read operation is to be performed, from the word line coupled to the first blank physical page in the open block.

In some examples, when the word line coupled to the first blank physical page has a different position among all the word lines of the open block, an absolute value of the corresponding second offset value is different.

In some examples, when the distance between the word line coupled to the code word, for which the read operation is to be performed, and the word line coupled to the first blank physical page in the open block is different, the corresponding third offset value is different. The word lines coupled to all memory cells in the programmed states included in the open block are divided into inner word lines (Inner WL) and an edge word line (Edge WL), where the edge word line is a word line closest to the word line (Open WL) coupled to the first blank physical page, and the inner word lines are word lines in all the word lines coupled to the memory cells in which data has been written other than the edge word line. That is to say, as compared to an edge word line, an inner word line is further away from the word line (Open WL) coupled to the first blank physical page.

In some examples, an absolute value of the third offset value corresponding to the edge word line is greater than an absolute value of the third offset value corresponding to the inner word line.

In some examples, the third offset values corresponding to all inner word lines may take the same value, or may be partially or completely different depending on the distance from the word line (Open WL) coupled to the first blank physical page. In some examples, a third offset value corresponding to all the inner word lines may be determined according to offset characteristics of the memory devices of different models and batches.

Figure 8:
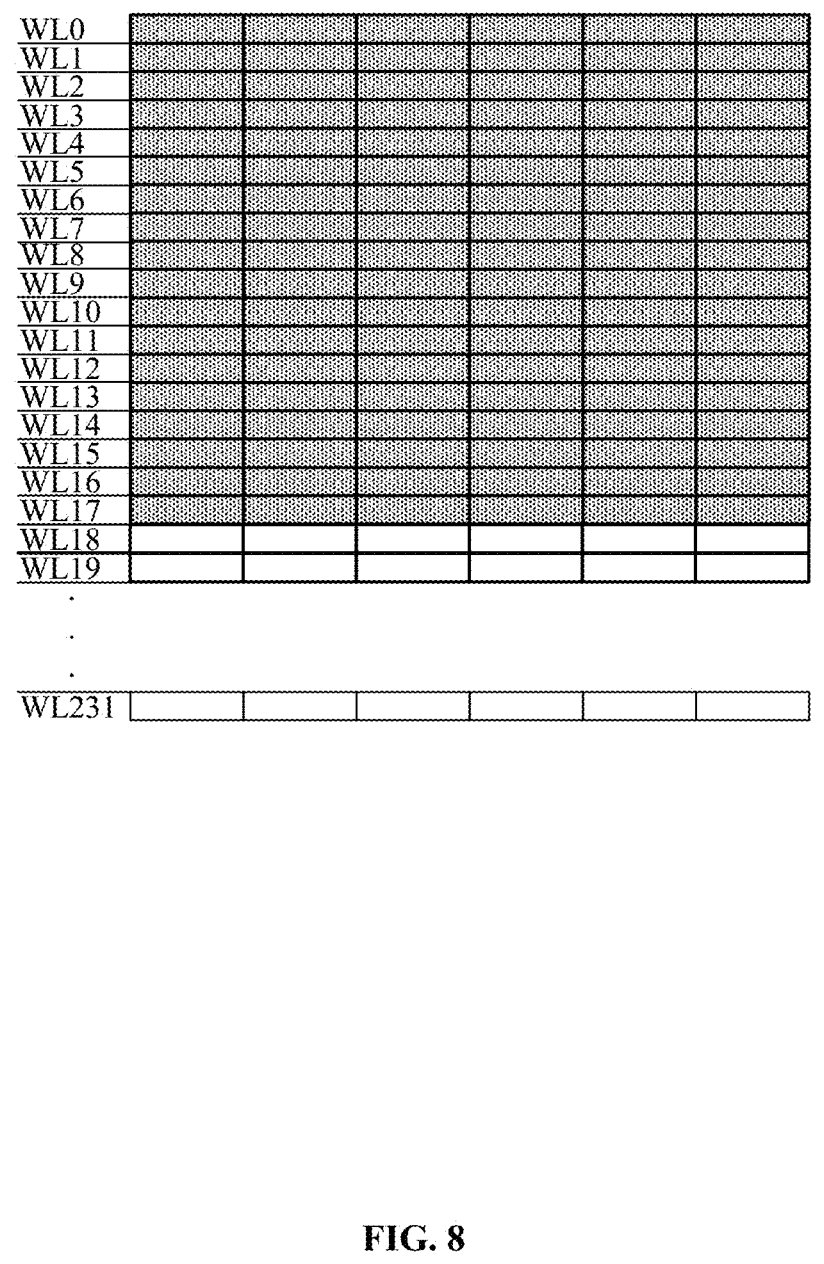

FIG. 8 is a schematic diagram of data state distribution of physical pages corresponding to word lines in an open block provided by an example of the present disclosure. A method of a total offset value corresponding to the initial read voltage is described below in reference to FIG. 8.

As shown in FIG. 8, the open block includes 232 word lines, and the 232 word lines are numbered as WL0, WL1, . . . , WL231 according to a program sequence, where all the memory cells coupled to the word lines numbered WL0 to WL17 have been written with data, e.g., in the programmed states; and all the memory cells coupled to the word lines numbered WL18 to WL231 have not been written with data, e.g., in the erased state. Herein, the word line numbered WL18 is the word line (Open WL) coupled to the first blank page; the word line numbered WL17 is the aforementioned edge word line (Edge WL); and the word lines numbered WL0 to WL16 are the aforementioned inner word lines (Inner WL). It can be understood that at least one code word, for which read operation is to be performed, is located in the memory cells coupled to the word lines numbered WL0 to WL17.

It is to be noted that, all the memory cells coupled to the edge word line may all be in the programmed states (this case is shown in FIG. 8), or the memory cells at a first half part in the program sequence among all the memory cells coupled to the edge word line are in programmed states.

It is to be noted that each rectangular lattice shown in FIG. 8 may be understood as a logical page, and generally, one physical page is mapped to the plurality of logical pages. The logical page is the minimum operation unit for reading and writing. The number of the logical pages in each row shown in FIG. 8 is only used to illustrate, and is not used to limit the number of the logical pages in each row in the examples of the present disclosure.

In an example, if the word line coupled to the at least one code word performing the read operation is the word line numbered WL7, in this case, the total offset value A1 corresponding to the initial read voltage=Base shift+factor*open_wl(8)/232+inner_factor1. Here, Base shift may be understood as corresponding to the aforementioned first offset value; factor*open_wl(8)/232 may be understood as corresponding to the aforementioned second offset value; and inner_factor1 may be understood as corresponding to the aforementioned third offset value.

In an example, if the word line coupled to the at least one code word performing the read operation is the word line numbered WL10, in this case, the total offset value A2 corresponding to the initial read voltage=Base shift+factor*open_wl(11)/232+inner_factor2. Here, Base shift may be understood as corresponding to the aforementioned first offset value; factor*open_wl(11)/232 may be understood as corresponding to the aforementioned second offset value; and inner_factor2 may be understood as corresponding to the aforementioned third offset value.

It is to be noted that, the third offset values inner_factor1 and inner_factor2 in the aforementioned two examples may be the same or different. In some cases, an absolute value of inner_factor1 is less than an absolute value of inner_factor2.

In an example, if the word line coupled to the at least one code word performing the read operation is the word line numbered WL17, in this case, the total offset value A3 corresponding to the initial read voltage=Base shift+factor*open_wl(18)/232+edge_factor. Here, Base shift may be understood as corresponding to the aforementioned first offset value; factor*open_wl(18)/232 may be understood as corresponding to the aforementioned second offset value; and edge_factor may be understood as corresponding to the aforementioned third offset value.

In some examples, the first offset value, the second offset value, and the third offset value are respectively acquired;

the first offset value, the second offset value, and the third offset value are summed to obtain the total offset value; and a default read voltage and the total offset value to obtain the predicted initial read voltage of the code word.

Herein, the default read voltage may be the read voltage when the threshold voltage of the memory cell is not offset, for example, for the corresponding read voltage at the time of just writing, the corresponding offset value in this case is 0. In some examples, the first offset value may be acquired by adjusting the default read voltage for a plurality of times. In some examples, the second offset value and the third offset value may be acquired through calculation using formulas of the aforementioned examples.

In some examples, the first offset value, the second offset value, and the third offset value are all negative, e.g., these three offset values are all offset in a decreasing direction relative to the default read voltage.

An implementation of obtaining the target valley voltage of the code word according to the first result corresponding to the code word, for which the read operation is to be performed, at the predicted value of the predicted initial read voltage is provided below.

In some examples, the peripheral circuit is configured to: use the predicted initial read voltage as the target valley voltage of the code word according to the fact that the first result corresponding to the code word at the predicted initial read voltage is less than a preset threshold; adjust the predicted initial read voltage at least once according to the fact that the first result corresponding to the code word at the predicted initial read voltage is greater than or equal to the preset threshold, and acquire first results corresponding to the adjusted read voltages after each adjustment; and determine the target valley voltage of the code word according to the fact that the first results corresponding to the adjusted read voltages meet a preset condition.

Herein, the meaning of the first result and the method to acquire the first result are introduced.

Herein, the first result represents the number of bits of the flipping of the code word, for which the read operation is to be performed, during two read results at the respective read voltage and a voltage near the respective read voltage.

In some examples, in a process of reading the memory device, a single read operation may read out data of one physical page; and when the number of the memory cells included in one code word may be less than the number of the memory cells coupled to one physical page, the code word is the unit that may be performed when the first result is acquired, but actually not excluding a plurality of code words. In other words, the first result corresponding to the at least one code word at the current read voltage may be acquired herein. For example, one physical page may correspond to 4 code words, a page buffer hardware operation may count respective fail bit counts (FBCs) of the 4 code words at one time, then the FBCs of the four code words are summed to obtain an FBC of the physical page, and subsequent calculation uses the value after the addition. It can be understood that the first result here may be data based on one physical page, and one physical page may include the plurality of code words.

Herein, the first read voltage and the second read voltage both are generalized concepts, and a difference between the first read voltage and the second read voltage is less than the preset voltage. In some examples, the second read voltage is greater than the first read voltage, and the difference between the first read voltage and the second read voltage ranges from 5 mV to 20 mV. In an example, the difference between the first read voltage and the second read voltage may be 5 mV, 10 mV, 15 mV, or 20 mV. In some other examples, the second read voltage is less than the first read voltage, and the difference between the first read voltage and the second read voltage ranges from −5 mV to −20 mV. In an example, the difference between the first read voltage and the second read voltage may be −5 mV, −10 mV, −15 mV, or −20 mV.

In some examples, the peripheral circuit is configured to: read storage data of the code word at the first read voltage to obtain a second result; perform third adjustment on the first read voltage in a third step size to obtain the second read voltage, and read the storage data of the code word at the second read voltage to obtain a third result; perform a logical operation on the second result and the third result to obtain a fourth result; and count the number of bits in the fourth result that represent the flipping in the third result compared to the second result, so as to obtain the first result.

In some examples, the peripheral circuit includes a first latch, a second latch, and a third latch; the first latch is configured to store the second result; the second latch is configured to store the third result; and the third latch is configured to store the fourth result.

Herein, the first read voltage and the second read voltage are related before and after. That is to say, the second read voltage is obtained by performing third adjustment according to the first read voltage. Based on this, a voltage difference between the first read voltage and the second read voltage is the third step size. The difference between the first read voltage and the second read voltage being less than the preset voltage may be understood as the first read voltage and the second read voltage having a small voltage difference. The preset voltage is related to the third step size, and may be a voltage slightly greater than the third step size. In some examples, the preset voltage ranges from 6 mV to 21 mV. In an example, the preset voltage may be 6 mV, 11 mV, 16 mV, or 21 mV. In some other examples, the preset voltage ranges from −6 mV to −21 mV. In an example, the preset voltage may be −6 mV, −10 mV, −15 mV, or −21 mV.

As mentioned above, the first read voltage and the second read voltage both are generalized concepts; a target read voltage, and read voltages obtained by adjusting (for example, first adjustment or second adjustment) the target read voltage may all be referred to as the first read voltages; and read voltages obtained by performing third adjustment on the first read voltages may all be referred to as the second read voltages.

In each example of the present disclosure, the first result corresponding to a voltage may be understood as: third adjustment is performed on the voltage, the number of bits of the code word, for which the read operation is to be performed, that are flipped in two read results at the voltage and the voltage after third adjustment may be taken as the first result corresponding to the voltage.

Figure 9:
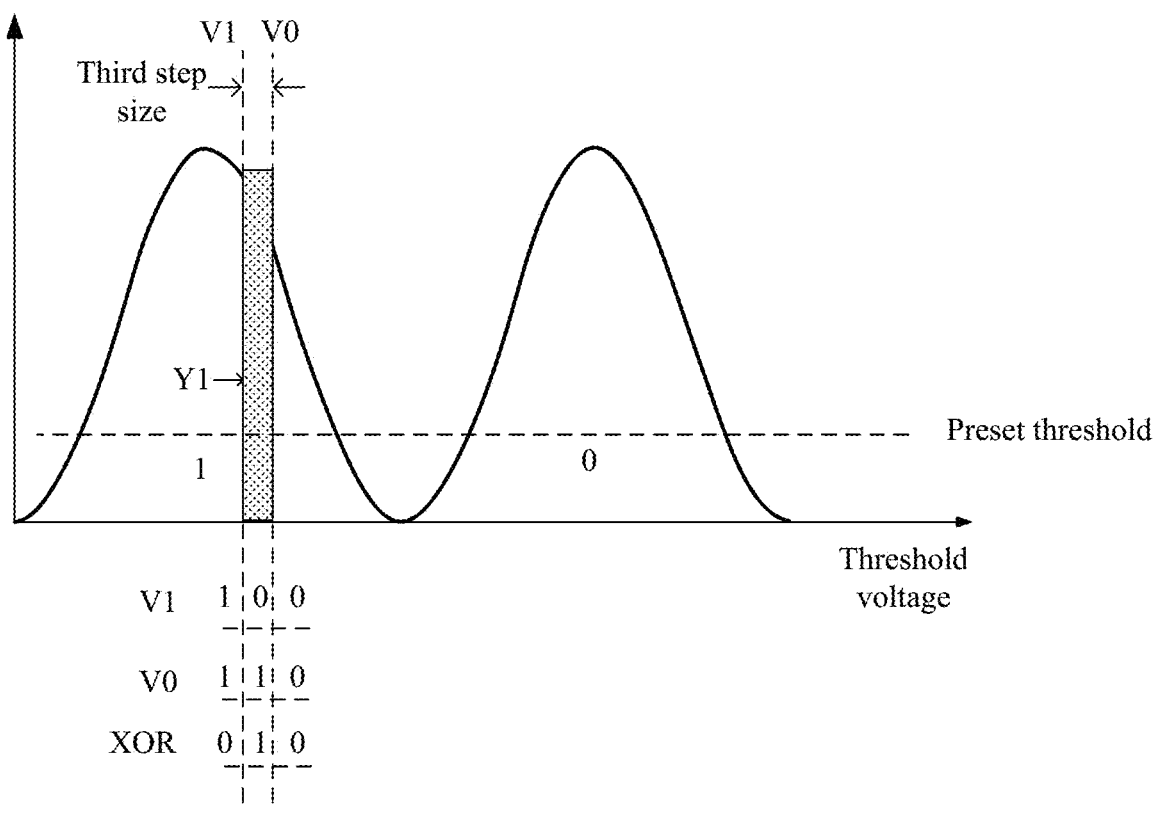
FIG. 9 is a schematic diagram of distribution of threshold voltages of memory cells, when a first result is acquired, provided by an example of the present disclosure.

In some examples, storage data of the code word is read at the first read voltage to obtain a second result; and the second result is stored in the first latch of the memory device. In an example, as shown in FIG. 9, the storage data of the at least one code word is read at the first read voltage V0 to obtain the second result. In an example, the memory cell of which threshold voltage is less than the target read voltage V0 is marked as Bit 1, and the memory cell of which threshold voltage is greater than the target read voltage V0 is marked as Bit 0, so as to obtain the second result; and the second result is stored in the first latch of the memory device.

Next, third adjustment is performed on the first read voltage to obtain the second read voltage, and the storage data of the code word is read at the second read voltage to obtain a third result; and the third result is stored in the second latch of the memory device. In an example, as shown in FIG. 9, third adjustment is performed on the first read voltage V0, and the storage data of the code word is read at the second read voltage V1 obtained after adjustment, so as to obtain the third result. In an example, the memory cell of which threshold voltage is less than the second read voltage V1 is marked as Bit 1, and the memory cell of which threshold voltage is greater than the second read voltage V1 is marked as Bit 0, so as to obtain the third result; and the third result is stored in the second latch of the memory device.

Next, a logical operation is performed on the second result and the third result to obtain a fourth result; and the fourth result is stored in the third latch of the memory device. In an example, as shown in FIG. 9, an exclusive OR operation is performed on the second result and the third result to obtain the fourth result; and the fourth result is stored in the third latch of the memory device. It is to be noted that, the exclusive OR operation is one of basic logical operations; in binary, if two binary numbers in a same position are the same, a result is "0"; and if the two binary numbers in the same position are different, the result is "1" (e.g., if same then is 0, and if different then is 1).

Next, the number of bits in the fourth result that represent the flipping in the third result compared to the second result is counted, so as to obtain the first result. In an example, as shown in FIG. 9, a portion with a bit being 1 in the fourth result indicates the number of the memory cells of which threshold voltages are different between the target read voltage V0 and the adjusted target read voltage V1; in other words, the portion with the bit being 1 in the fourth result indicates the number of bits of the code word that is flipped in two read results at the target read voltage V0 and the adjusted target read voltage V1; and since a single-level read mode is employed, e.g., the above-mentioned two read operations read one bit of data stored in a lower page of the memory cell of the code word, such that the portion with the bit being 1 in the fourth result indicates the number of the memory cells in which the code word is flipped in the two read results at the target read voltage V0 and the adjusted target read voltage V1, and the number is recorded as the first result Y1 corresponding to the target read voltage.

In examples of the present disclosure, the first result corresponding to the code word, for which the read operation is to be performed, at the predicted initial read voltage may be acquired through the above-mentioned method. That is to say, the predicted initial read voltage is used as the first read voltage to acquire the corresponding first result. The first result corresponding to the predicted initial read voltage is less than the preset threshold, and the predicted initial read voltage is used as a target valley voltage of the code word, for which the read operation is to be performed. Herein, the preset threshold may be used as a judgment threshold for determining the target valley voltage, e.g., when the first result is less than the preset threshold, it indicates that, when the read voltage corresponding to the first result is used as the target valley voltage, the read results are low in error rate and high in reliability. The value of the preset threshold is related to the type, memory density, etc. of the memory device. The preset threshold may be set according to an empiric value or is a factory-configured default value for the memory device that is obtained through extensive simulation experiments. In an example, the preset threshold ranges from 5 to 30, and in an example, the preset threshold may be 5, 10, 15, 20, 25, or 30.

The predicted initial read voltage is adjusted at least once according to the fact that the first result corresponding to the predicted initial read voltage is greater than or equal to the preset threshold, and the first results corresponding to the adjusted read voltages are acquired after each adjustment; and then, the target valley voltage of the code word is determined when the first results corresponding to the adjusted read voltages meet the preset condition. It can be understood that the read voltage after the predicted initial read voltage is adjusted each time is used as the first read voltage, and the first result corresponding to each adjusted read voltage is acquired by the method of acquiring the first result.

It is to be noted that, a step size corresponding to adjustment of the predicted initial read voltage is greater than the third step size corresponding to third adjustment, and an example adjustment mode is described in detail below. The preset condition here may include various judgment modes, and example judgment modes are described in detail below.

In some examples, the memory cell array includes a memory cell with a memory bit being P, P memory bits respectively correspond to P pages, and P-bit storage data of the P-bit memory cell may be read through a Q-level read voltage, where P and Q both are integers greater than 1, and $Q=2^P-1$.

Figure 10A:
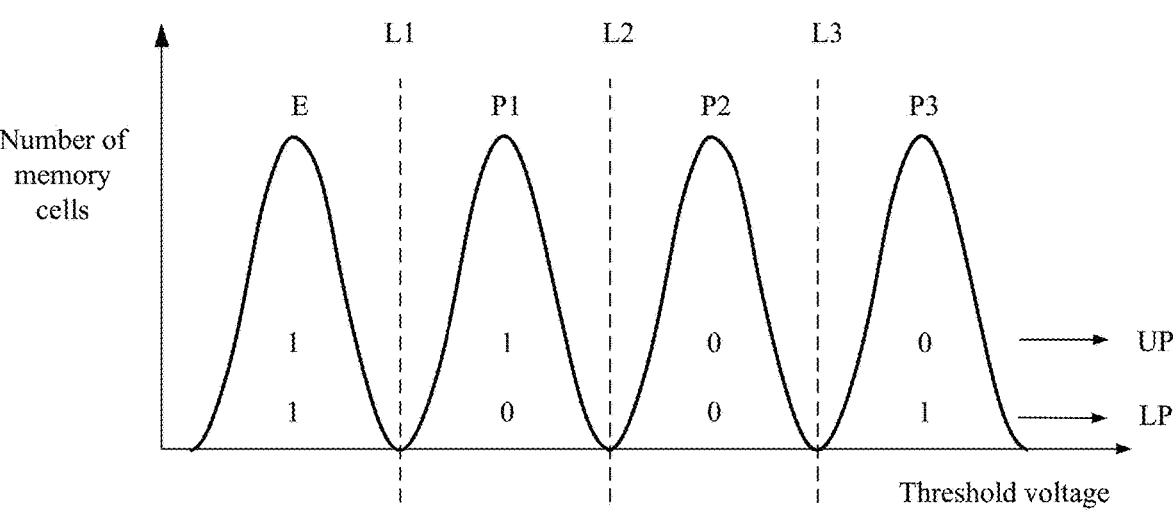
FIG. 10A is a schematic diagram of distribution of threshold voltages of a memory cell comprising 2 memory bits provided by an example of the present disclosure.

In an example, when the memory cell includes two memory bits, and corresponding storage states include a 0th state to 3rd state. Referring to FIG. 10A, the 4 states respectively are the 0th state E (also referred to as an erased state), the 1st state P1 (also referred to as a 1st storage state), the 2nd state P2 (also referred to as a 2nd storage state), and the 3rd state P3 (also referred to as a 3rd storage state); and binary data corresponding to the 4 states is 11, 10, 00, and 01, respectively. Accordingly, the memory device includes two pages, which respectively are a lower page (LP) and an upper page (UP).

Using the memory cell shown in FIG. 10A as an example, the two-bit memory cell reads two-bit four-state storage data through a 3-level read voltage (a first-level read voltage L1, a second-level read voltage L2, and a third-level read voltage L3 shown in FIG. 10A).

In an example, one of the pages corresponds to a plurality of levels of read voltages, and the other page corresponds to one level of read voltage. As shown in FIG. 10A, binary data corresponding to the lower page is 1001 respectively, and reading the lower page needs to the corresponding first-level read voltage L1 and third-level read voltage L3. Binary data corresponding to the upper page is 1100 respectively, and reading the upper page needs the corresponding second-level read voltage L2.

Figure 10B:
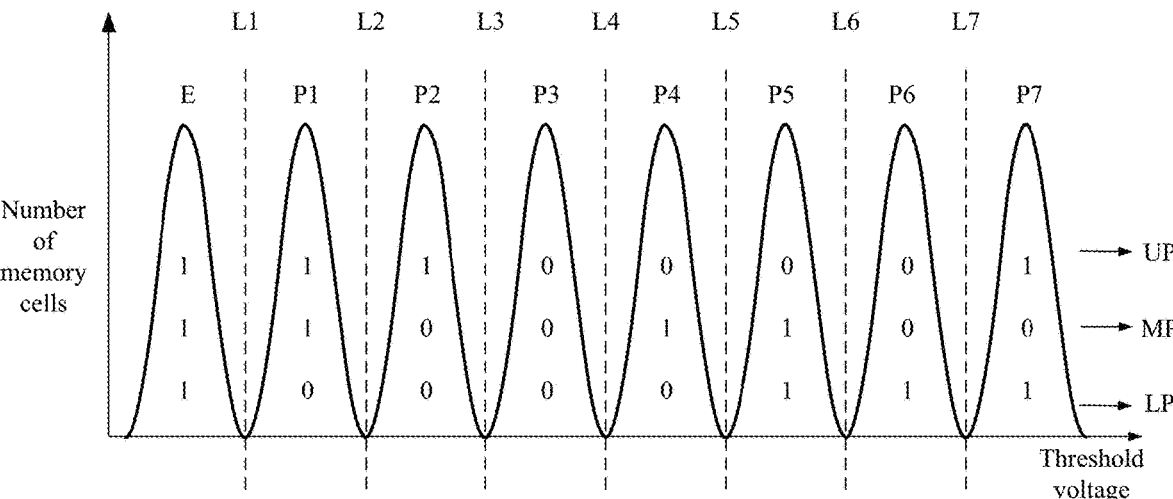
FIG. 10B is a schematic diagram of distribution of threshold voltages corresponding to memory cells comprising 3 memory bits provided by an example of the present disclosure.

In an example, when the memory cell includes three memory bits, and the corresponding storage states include a 0th state to 7th state. Referring to FIG. 10B, the 8 states respectively are the 0th state E (also referred to as an erased state), the 1st state P1 (also referred to as a 1st storage state), the 2nd state P2 (also referred to as a 2nd storage state), . . . , and the 7th state P7 (also referred to as a 7th storage state); and the binary data corresponding to the 8 states is 111, 110, 100, 000, 010, 011, 001, and 101, respectively. Accordingly, the memory device includes three pages, which respectively are a lower page, a middle page (MP), and an upper page.

Using the memory cell shown in FIG. 10B as an example, the three-bit memory cell reads three-bit eight-state storage data through a 7-level read voltage (a first-level read voltage L1, a second-level read voltage L2, a third-level read voltage L3, a fourth-level read voltage L4, a fifth-level read voltage L5, a sixth-level read voltage L6, and a seventh-level read voltage L7 shown in FIG. 10B).

In an example, each page corresponds to a plurality of levels of read voltages. As shown in FIG. 10B, binary data corresponding to the lower page is 10000111 respectively, and reading the lower page needs the corresponding first-level read voltage L1 and the fifth-level read voltage L5. Binary data corresponding to the middle page is 11001100 respectively, and reading the middle page needs the corresponding second-level read voltage L2, the fourth-level read voltage L4, and the sixth-level read voltage L6. Binary data corresponding to the upper page is 11100001 respectively, and reading the upper page needs the corresponding third-level read voltage L3 and the seventh-level read voltage L7.

Figure 10C:
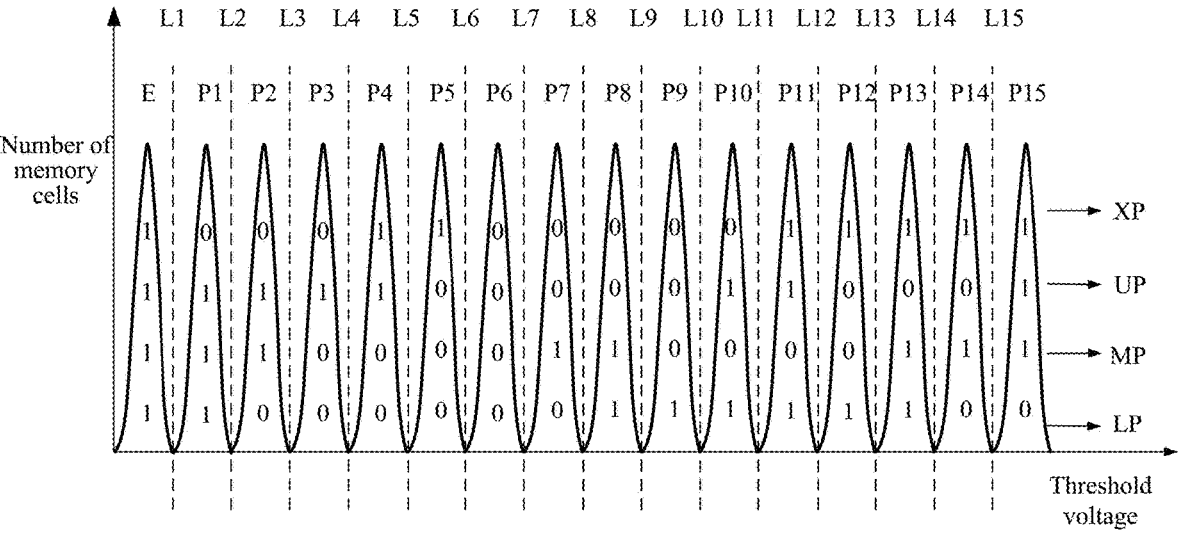
FIG. 10C is a schematic diagram of distribution of threshold voltages corresponding to memory cells comprising 4 memory bits provided by an example of the present disclosure.

In an example, when the memory cell includes four memory bits, and corresponding storage states include a 0th state to 15th state. Referring to FIG. 10C, the 16 states respectively are the 0th state E (also referred to as an erased state), the 1st state P1 (also referred to as a 1st storage state), the 2nd state P2 (also referred to as a 2nd storage state), . . . , and the 15th state P15 (also referred to as a 15th storage state); and binary data corresponding to the 16 states is 1111, 0111, 0110, . . . , 1110, respectively. Accordingly, the memory device includes four pages, namely lower page, middle page, upper page, and extra page (Extra Page, XP). Herein, the four memory bits corresponding to the 16 states are respectively stored in the lower page, the middle page, the upper page, and the extra page.

Using the memory cell shown in FIG. 10C as an example, the four-bit memory cell reads four-bit sixteen-state storage data through a 15-level read voltage (a first-level read voltage L1, a second-level read voltage L2, a third-level read voltage L3, a fourth-level read voltage L4, a fifth-level read voltage L5, a sixth-level read voltage L6, a seventh-level read voltage L7, an eighth-level read voltage L8, a ninth-level read voltage L9, a tenth-level read voltage L10, an eleventh-level read voltage L11, a twelfth-level read voltage L12, a thirteenth-level read voltage L13, a fourteenth-level read voltage L14, and a fifteenth-level read voltage L15 shown in FIG. 10C).

In an example, each page corresponds to a plurality of levels of read voltages. As shown in FIG. 10C, binary data corresponding to the lower page is 1100000011111100 respectively, and reading the lower page needs the corresponding second-level read voltage L2, the eighth-level read voltage L8, and the fourteenth-level read voltage L14. Binary data corresponding to the middle page is 1110000110000111 respectively, and reading the middle page needs the corresponding third-level read voltage L3, the seventh-level read voltage L7, the ninth-level read voltage L9, and the thirteenth-level read voltage L13. Binary data corresponding to the upper page is 1111100000110001 respectively, and reading the upper page needs the corresponding fifth-level read voltage L5, the tenth-level read voltage L10, the twelfth-level read voltage L12, and the fifteenth-level read voltage L15. Binary data corresponding to the extra page is 1000110000011111 respectively, and reading the extra page needs the corresponding first-level read voltage L1, the fourth-level read voltage L4, the sixth-level read voltage L6, and the eleventh-level read voltage L11.

In examples of the present disclosure, the target valley voltage of each of the plurality of levels of read voltages corresponding to each page is determined in sequence respectively. The lower page is generally the closest to a source/drain, such that preferably determining each of the levels of read voltages corresponding to the lower page has the fastest access speed and shortest response time, and can guarantee the balance performance and durability during a data access process.

It should be noted that first determining each level of read voltages corresponding to the lower page is just an example. It is not intended to limit the order in which each of the multiple levels of read voltages corresponding to at least part of the page in the embodiment of the present disclosure is determined.

In some examples, at least part of the pages corresponds to a plurality of stages of read voltages, and the plurality of stages of read voltages include first stage read voltages and second stage read voltages, where the second stage read voltages are less than the first stage read voltages. In an example, the first stage read voltages may be understood as the highest read voltages in the plurality of stages of read voltages of each page; and the second stage read voltages may be understood as other read voltages, which are less than the highest read voltages, in the plurality of stages of read voltages of each page.

It is to be noted that the first stages and the second stages are used for distinguishing the high-level read voltages and the low-level read voltages in the plurality of stages of read voltages corresponding to at least part of the pages; and the low-level read voltages are less than the high-level read voltages. For the memory cell including the plurality of memory bits, one page corresponding to one memory bit may include one or more stages, and one stage may include one or more levels.

In an example, referring to FIG. 10A, the memory device includes the lower page and the upper page, where the lower page corresponds to the plurality of stages, the plurality of stages corresponding to the lower page include the first level and the third level, and the first-level read voltage L1 is less than the third-level read voltage L3. Herein, the third-level read voltage L3 corresponds to the first stage read voltage, and the first-level read voltage L1 corresponds to the second stage read voltage.

In an example, referring to FIG. 10B, the memory device includes the lower page, the middle page, and the upper page, where each page corresponds to the plurality of stages, the plurality of stages corresponding to the lower page include the first level and the fifth level, and the first-level read voltage L1 is less than the fifth-level read voltage L5; the plurality of stages corresponding to the middle page include the second level, the fourth level, and the sixth level, and the second-level read voltage L2 and the fourth-level read voltage LA are both less than the sixth-level read voltage L6; and the plurality of stages corresponding to the upper page include the third level and the seventh level, and the third-level read voltage L3 is less than the seventh-level read voltage L7. Herein, the fifth-level read voltage L5, the sixth-level read voltage L6, and the seventh-level read voltage L7 respectively correspond to the first stage read voltages of the lower page, middle page, and upper page; and the first-level read voltage L1, the second-level read voltage L2, the fourth-level read voltage L4, and the third-level read voltage L3 respectively correspond to the second stage read voltages of the lower page, middle page, and upper page.

In an example, referring to FIG. 10C, the memory device includes the lower page, the middle page, the upper page, and the extra page, where each page corresponds to the plurality of stages, the plurality of stages corresponding to the lower page include the second level, the eighth level, and the fourteenth level, and the second-level read voltage L2 and the eighth-level read voltage L8 are both less than the fourteenth-level read voltage L14; the plurality of stages corresponding to the middle page include the third level, the seventh level, the ninth level, and the thirteenth level, and the third-level read voltage L3, the seventh-level read voltage L7, and the ninth-level read voltage L9 are all less than the thirteenth-level read voltage L13; the plurality of stages corresponding to the upper page include the fifth level, the tenth level, the twelfth level, and the fifteenth level, and the fifth-level read voltage L5, the tenth-level read voltage L10, and the twelfth-level read voltage L12 are less than the fifteenth-level read voltage L15; and the plurality of stages corresponding to the extra page include the first level, the fourth level, the sixth level, and the eleventh level, and the first-level read voltage L1, the fourth-level read voltage LA, and the sixth-level read voltage L6 are less than the eleventh-level read voltage L11. Herein, the fourteenth-level read voltage L14, the thirteenth-level read voltage L13, the fifteenth-level read voltage L15, and the eleventh-level read voltage L11 respectively correspond to the first stage read voltages of the lower page, middle page, upper page, and extra page; the second-level read voltage L2 and the eighth-level read voltage L8 correspond to the second stage read voltages of the lower page; the third-level read voltage L3, the seventh-level read voltage L7, and the ninth-level read voltage L9 correspond to the second stage read voltages of the middle page; the fifth-level read voltage L5, the tenth-level read voltage L10, and the twelfth-level read voltage L12 correspond to the second stage read voltages of the upper page; and the first-level read voltage L1, the fourth-level read voltage L4, and the sixth-level read voltage L6 correspond to the second stage read voltages of the extra page.

In some examples, a memory cell is configured to store a plurality of memory bits, and the plurality of memory bits correspond to a plurality of stages of read voltages; and the peripheral circuit is configured to: acquire the predicted initial read voltage of the code word at a target stage, a predicted offset direction of the predicted initial read voltage, and a predicted boundary voltage according to the position of the word line coupled to the code word in an open block, the position of the first blank physical page in the open block, and the target stage among the plurality of stages; and in the process of adjusting the predicted initial read voltage at least once, change a current offset direction according to the fact that the adjusted predicted initial read voltage exceeds a range defined by the predicted boundary voltage.

Herein, the target stage may be understood as a stage, of which target valley voltage is to be currently determined, in a target page. As mentioned above, in the examples of the present disclosure, the target valley voltage of each level in each corresponding stage in each page is determined in sequence. After the target valley voltage of the code word at the target stage is determined, target valley voltages of other stages in the plurality of stages other than the target stage are respectively determined.

Herein, when the predicted initial read voltage of the read operation to be performed is acquired, the target stage also needs to be considered when the position of the word line coupled to the code word, for which the read operation is to be performed, in the open block and the position of the first blank physical page in the open block are considered. Meanwhile, a predicted offset direction of the read voltage to be adjusted, and a predicted boundary voltage are acquired while the predicted initial read voltage of the code word, for which the read operation is to be performed, at the target stage is acquired.

In some examples, the predicted offset direction of the predicted initial read voltage is a direction in which the default read voltage is decreased. Based on this, a total offset value of the aforementioned predicted initial read voltage is actually negative, and summing the default read voltage and the total offset value is actually to subtract the total offset value from the default read voltage.

Using a TLC as an example, the predicted offset directions of the predicted initial read voltages corresponding to seven levels of read voltages corresponding to the TLC may all be negative.

Herein, the predicted boundary voltage aligns with a limit value of a voltage offset at a threshold point of the memory cell, and the predicted boundary voltage may include a left boundary voltage and a right boundary voltage, where the left boundary voltage is less than the right boundary voltage. The limit value of the memory cell offset may generally be obtained according to extensive experimental data on the offset performance of the memory cell, and the limit value of the voltage offset at the threshold point of one memory cell may be obtained in a targeted method when the position of the word line coupled to the code word, for which the read operation is to be performed, in the open block and the position of the first blank physical page in the open block are considered. When the first result after the predicted initial read voltage is greater than or equal to the preset threshold, the predicted initial read voltage needs to be adjusted at least once, and if a voltage range defined by the predicted boundary voltage is reached or exceeded during the adjustment process, a current offset direction needs to be adjusted. In an example, if the predicted initial read voltage is currently adjusted in a decreasing direction or a leftward direction, it needs to change to an increasing direction or a rightward direction to adjust the predicted initial read voltage. In an example, if the predicted initial read voltage is currently adjusted in the increasing direction or the rightward direction, it needs to change to the decreasing direction or the leftward direction to adjust the predicted initial read voltage.

Two examples of how to continuously determine the target valley voltage when the first result after the predicted initial read voltage is greater than or equal to the preset threshold are provided below. It is to be noted that, two ways to determining the target valley voltage are also applicable to determination of the target valley voltage in the close block, and in the close block, the default read voltage may be utilized to replace the predicted initial read voltage.

In some examples, a memory cell is configured to store a plurality of memory bits, and the plurality of memory bits correspond to a plurality of stages of read voltages; and the peripheral circuit is configured to: acquire a predicted valley voltage of the code word at the target stage according to the first result corresponding to the code word at the predicted initial read voltage at the target stage, and the target stage; and determine a target valley voltage of the target stage based on the predicted valley voltage of the target stage.

A relationship between the memory bits and the plurality of stages of read voltages (the plurality of levels of read voltages) is not described herein again. It should be noted that the stage in which the current stage is located here can be understood as the aforementioned level.

A predicted valley voltage of the target stage is acquired according to the first result corresponding to the predicted initial read voltage, the target stage, and a first mapping function. Herein, the first mapping function is related to the performance (in an example, the offset performance of the threshold voltage of the memory cell) of the memory device; and the first mapping function may be obtained by fitting according to a large number of experimental results before the memory device leaves the factory, and saved in the memory device.

In some examples, the memory device may save the plurality of first mapping functions with different mapping relationships, so as to acquire the predicted valley voltages of the plurality of target stages.

In some examples, the first mapping function may be utilized for a loop iteration. In an example, the predicted valley voltage of the target stage that is previously acquired is used as an input value of the first mapping function of the predicted valley voltage of the target stage that is acquired next, so as to acquire the predicted valley voltages of the plurality of target stages through iteration.

It can be understood that when any one of the obtained predicted valley voltages of the multiple target stages satisfies the preset conditions, the predicted valley voltage of the target stage that meets the preset conditions can be used as the target valley voltage of the target stage. Acquiring the predicted valley voltages of the plurality of target stages may increase the probability that the predicted valley voltages of the target stages meet the preset condition, so as to accelerate the determination of the target valley voltages.

In some examples, the preset condition may be that the first result corresponding to the predicted valley voltage is less than the preset threshold.

In some examples, the preset condition may be that data read at the predicted valley voltage is successfully decoded.

If the aforementioned method of utilizing a mapping function to acquire the predicted valley voltage cannot effectively determine the target valley voltage; in this case, the target valley voltage may be continued to be determined by utilizing the following methods, or the target valley voltage may be determined by skipping the aforementioned method of utilizing the mapping function to acquire the predicted valley voltage, and directly utilizing the following two adjustment methods.

In some other examples, the peripheral circuit is configured to: adjust the predicted initial read voltage for M times, during the process of M adjustments, perform M first adjustments on a read voltage to be adjusted with a first step size, and respectively acquire M first results corresponding to the read voltage after the M first adjustments; use the minimum first result in the M first results as a knee point value, where a read voltage corresponding to the knee point value includes a knee voltage; perform N second adjustments on the knee voltage with a second step size, and respectively acquire N first results corresponding to the read voltage after the N second adjustments, where the second step size is less than the first step size, and M and N both are positive integers greater than 1; and determine the target valley voltage according to the acquired N first results.

Herein, the first adjustment may be understood as big-step adjustment, or referred to as rough adjustment. The second adjustment may be understood as small-step adjustment, or referred to as fine adjustment. That is, the core idea of this adjustment solution is to make rough adjustment before fine adjustment.

Herein, the first step size is greater than the second step size, and the second step size is greater than a third step size. The first step size may be a large step size. In some examples, the first step size may range from 50 mV to 150 mV. In an example, the first step size may be 50 mV, 80 mV, 100 mV, 120 mV, or 150 mV. The second step size may be a small step size. In some examples, the second step size may range from 20 mV to 40 mV. In an example, the second step size may be 20 mV, 30 mV, or 40 mV. The third step size may be a smaller step size, and range from 5 mV to 20 mV. In an example, the third step size may be 5 mV, 10 mV, 15 mV, or 20 mV.

Herein, the read voltage after each adjustment is used as a horizontal coordinate, the first result corresponding to the corresponding adjusted target read voltage is used as a vertical coordinate, and the horizontal and vertical coordinates form one point. A knee point may be understood as a point relatively close to a valley. A valley point is a point corresponding to the target valley voltage as the horizontal coordinate.

It is to be noted that, during the processes of the first adjustment and the second adjustment, adjustments all need to be performed towards a positive direction (rightwards) and a negative direction (leftwards). In some examples, during the process of performing the first adjustment for a plurality of times, the adjustment stops until the predicted boundary voltages on left and right sides may be reached. In some examples, during the process of performing the second adjustment for a plurality of times, the predicted boundary voltages on the left and right sides may be reached or counting showing an upward trend exceeds the preset number of times. Herein, the counting showing the upward trend is performed once the first result corresponding to the target read voltage after a next adjustment is greater than the first result corresponding to the target read voltage after the previous adjustment. In some examples, the preset number of times is 3, 4, 5, 6, or 7. In an example, the preset number of times may be 3, 5, or 7. The adjusted read voltage corresponding to the minimum first result after the second adjustment is ended is used as the target valley voltage.

In some examples, a memory cell is configured to store a plurality of memory bits, and the plurality of memory bits correspond to a plurality of stages of read voltages; and the peripheral circuit is configured to: after determining the target valley voltage of the code word at the target stage, respectively determine target valley voltages of other stages in the plurality of stages other than the target stage.

An optional example for determining other stages is provided below.

In some examples, the plurality of memory bits respectively correspond to a plurality of pages; at least one page corresponds to the plurality of stages; the plurality of stages include first stages and second stages; read voltages of the second stages are less than read voltages of the first stages; and the peripheral circuit is configured to: when stages corresponding to the determined target valley voltages belong to the first stages, acquire, according to the determined target valley voltages, predicted valley voltages of the second stages in the plurality of stages and/or predicted valley voltages of the rest of the first stages with lower read voltages; and obtain target valley voltages of the second stages and the rest of the first stages, according to the predicted valley voltages of the second stages in the plurality of stages and/or the predicted valley voltages of the rest of the first stages with lower read voltages.

Herein, the first stages and the second stages have been introduced before, and are not described herein again. In examples of the present disclosure, predicted valley voltages of low stages (second stages) and predicted valley voltages of the remaining high stages may be acquired by utilizing target valley voltages/predicted valley voltages of high stages (first stages). In an example, a predicted valley voltage of stages to be predicted may be acquired according to target valley voltage/predicted valley voltage of the high stages, the stages to be predicted (the second stages and the remaining first stages), and a second mapping function. Herein, the second mapping function is related to the performance (in an example, the offset performance of the threshold voltage of the memory cell) of the memory device; and the second mapping function may be obtained by fitting according to a large number of experimental results before the memory device leaves the factory, and saved in the memory device. Different from the first mapping function, the second mapping function does not support the loop iteration. Then, on the basis of the predicted valley voltage, the target valley voltage may be determined by the aforementioned two adjustment methods, etc.

In some examples, the peripheral circuit is configured to: perform the read operation on the code word according to the target valley voltages/predicted valley voltages of all first stages and second stages.

It can be understood that the read operation may be performed by utilizing the target valley voltage after the target valley voltages of all stages of all pages are determined.

In some examples, in order to accelerate the entire process of reading, the read operation may be directly performed by utilizing the predicted valley voltages of all the stages of all the pages; then when a decode operation of the read operation is not passed, the read operation and the decode operation are performed once again after the target valley voltage is determined by utilizing the aforementioned two adjustment methods, etc.

According to a first aspect, in each memory device provided by the examples of the present disclosure, the first result (the first result may be several bytes) is transmitted instead of transmitting at least one code word (for example, the code word may be 4 KB), such that a data amount transmitted is reduced, thereby shortening transmission time of an output port; and the process of acquiring the first result is converged inside the memory device without occupying, for example, the space of the memory controller, and thus is less dependent on, for example, a memory controller. Meanwhile, in the examples of the present disclosure, considering a difference in charges in a memory cell with written data and a memory cell with unwritten data in the open block, on the basis of the close blocks in a same application scenario, the position of the open WL, and the distance between the word line coupled to the memory cell, for which the read operation is to be performed, and the open WL are taken into consideration, the predicted initial read voltage is acquired in a targeted method, and then the target valley voltage is determined based on the predicted initial read voltage. Compared to the method of obtaining the target valley voltage by directly utilizing the default read voltage for a plurality of loop iterations, in the examples of the present disclosure, the predicted initial read voltage obtained by considering the aforementioned two positions may reduce the number of loop iterations (the target valley voltage may be even directly determined through the predicted initial read voltage), such that the target valley voltage can be obtained more rapidly.

Figure 11A:
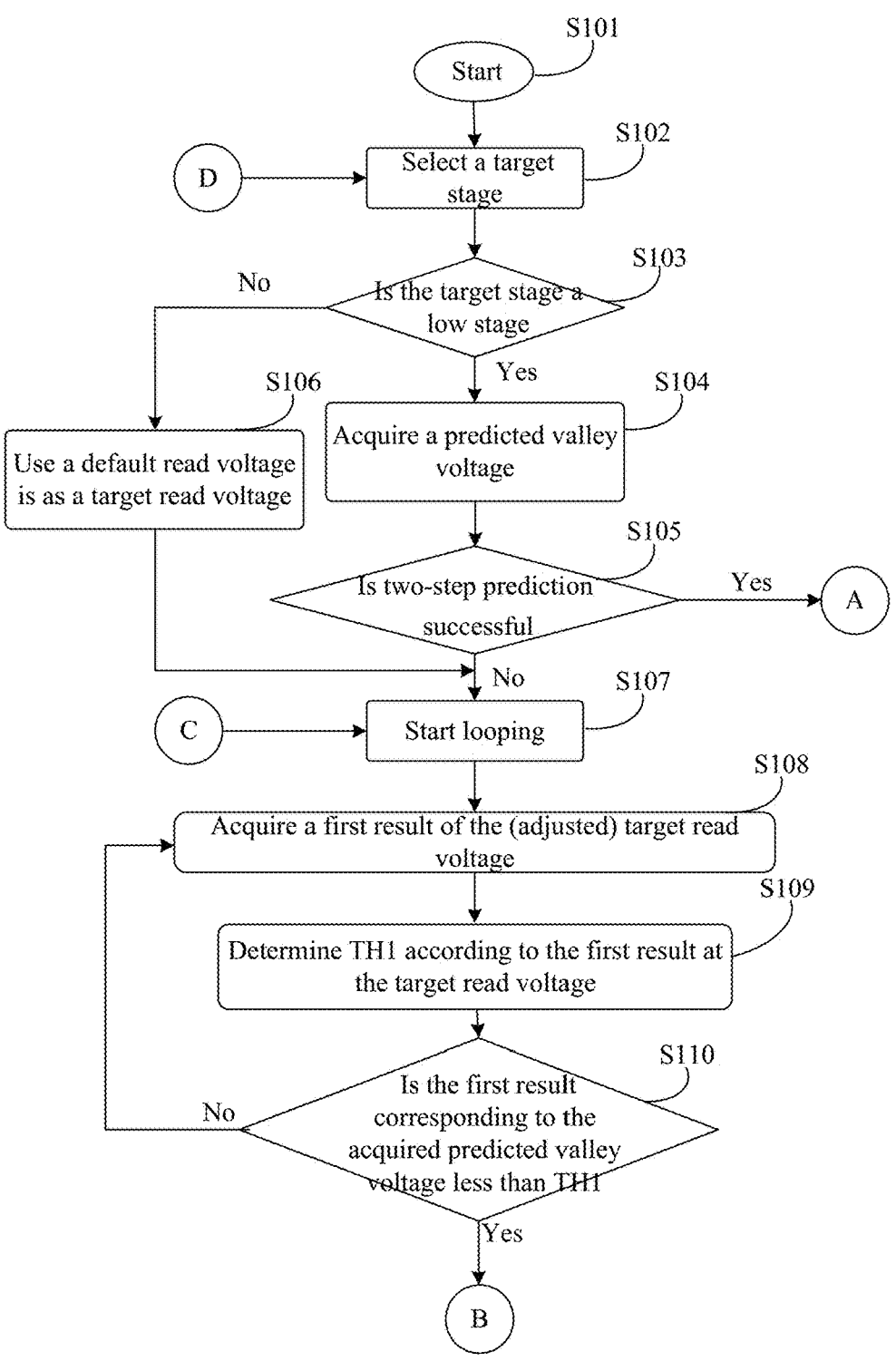
FIGS. 11A and 11B are a block flowchart I of an operation method of a memory device provided by an example of the present disclosure.
Figure 11B:
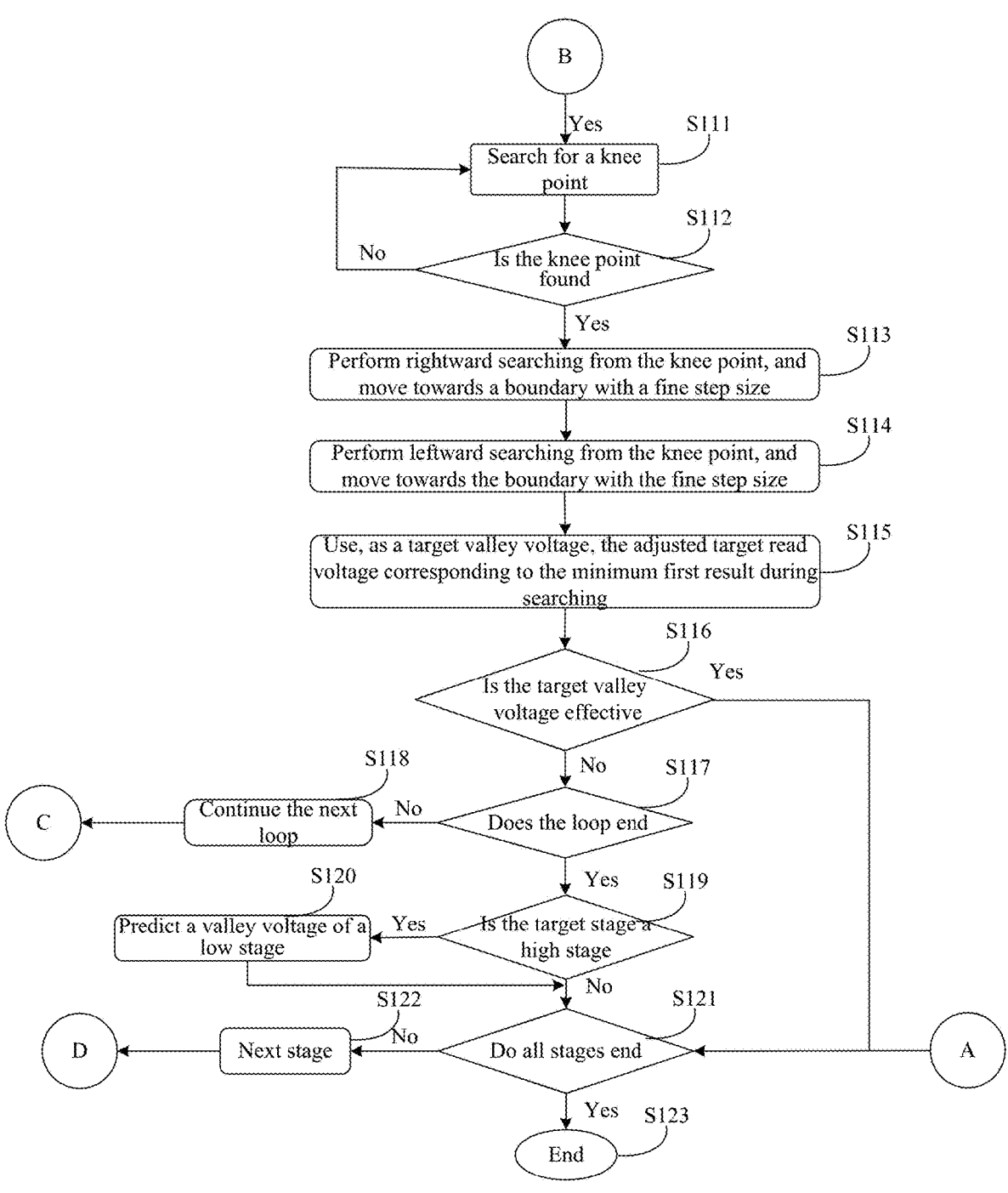

FIGS. 11A and 11B are a block flowchart I of an operation method of a memory device provided by an example of the present disclosure. A detailed process of determining the target valley voltage will be described in detail below through FIGS. 11A and 11B. It is to be noted that, here and below, the target valley voltage refers to a voltage for performing the read operation on data to be read.

In operation S101, the procedure of acquiring the target valley voltage is triggered, and the flow of acquiring the target valley voltage starts to be performed. Operation S102 is performed next.

As mentioned above, according to the fact that the memory bits of the memory cell are plural, the plurality of memory bits respectively correspond to the plurality of pages, and at least one page corresponds to the plurality of stages. When the target valley voltage is determined, the target valley voltage of each of at least one stage of read voltages corresponding to each of the plurality of page is determined in sequence. In operation S103, one stage is selected, as the target stage, from the plurality of stages corresponding to one page, and the target valley voltage corresponding to the read voltage of the target stage is first determined. In an example, using a TLC as an example, the target valley voltages of the first-level read voltage L1 and fifth-level read voltage L5 corresponding to the lower page are first determined, and one of the L1 or L5 may be selected as the target stage. Operation S103 is performed after the target stage is determined.

In operation S103, the type to which the target stage belongs may be determined. Herein, the target stage may be classified into two categories, which are the first stage (also referred to as the high stage) and the second stage (also referred to as the low stage), where the read voltage of the first stage is greater than the read voltage of the second stage. In an example, still using the lower page of the TLC as an example, the L5 is at the first stage, and the L1 is at the second stage. If the L1 is selected to be at the target stage in operation S103, the target stage is the second stage, e.g., the low stage; and if the L5 is selected to be at the target stage in operation S104, the target stage is the first stage, e.g., the high stage. Operation S104 is performed according to the target stage being the low stage; and operation S106 is performed according to the target stage being the high stage.

In operation S104, the predicted valley voltage is acquired. Herein, the predicted valley voltage is the predicted valley voltage corresponding to the low stage that is acquired according to a valley voltage corresponding to the high stage and related mapping functions. Here and below, the related mapping functions may be obtained by fitting according to a large number of experimental results before the memory device leaves the factory, and saved in the memory device. Operation S106 is performed next.

In operation S105, whether a two-step prediction method is successful is determined. Herein, the so-called two-step prediction may include a first-step prediction and a second-step prediction, where the first-step prediction is to acquire a predicted valley voltage of the high stage, and an example method is to acquire the predicted valley voltage of the high stage according to the first result corresponding to the target read voltage (default read voltage), the high stage, and the first mapping function; and the second-step prediction is to acquire a predicted valley voltage of the low stage, and an example method is to acquire the predicted valley voltage of the low stage according to the aforementioned predicted valley voltage of the high stage, the low stage, and the second mapping function. Furthermore, the predicted valley voltage is not determined after the two-step prediction is performed, and hard decode is performed by directly utilizing the predicted valley voltage of the high stage and the predicted valley voltage of the low stage; if hard decode is passed, it indicates that the two-step prediction is successfully, in this case, the searching of the target valley voltage is directly stopped, and operation S121 is performed; and if hard decode fails, it indicates that the two-step prediction fails, in this case, a point corresponding to the predicted valley voltage is used as a near-valley point for subsequent iterations, and operation S107 continues to be performed.

It is to be noted that, if hard decode fails, it indicates that the two-step prediction is not successful, and in this case, the target valley voltage needs to be determined in a method of searching or a method referred to as looping (or iterations), such that a process of looping is entered when the two-step prediction is not successful, and a searching process may be directly performed from the beginning of the loop after the two-step prediction is not successful, e.g., jumping from operation S105 to S107.

If the target stage is the high stage, the target valley voltage of the high stage is prepared to be determined by means of searching or looping. In operation S106, the default read voltage is used as the target read voltage. Herein, the target read voltage may be used as an initial value for subsequent searching or looping. In some examples, the default read voltage may be the read voltage when the threshold voltage of the memory cell is not offset. For example, for the corresponding read voltage at the time of just writing, the corresponding offset value in this case is 0 DAC, which represents the unit of voltage offset. Operation S107 is performed after operation S106.

It is to be noted that, here and below, a conversion relationship between DAC and the aforementioned mV is 1 DAC=10 mV.

In operation S107, the target valley voltage starts to be determined by means of searching or looping. Operation S108 is performed after operation S107.

A process of performing looping for the first time, in operation S108, is to acquire the first result at the target read voltage. It can be understood that the process of performing looping for the subsequent number of times, in operation S108, is to acquire the first result at the adjusted target read voltage. Operation S109 is performed after operation S108.

In operation S109, a first threshold TH1 is determined or adjusted according to the first result at the target read voltage. It can be understood that, during the read operation, when the threshold voltage of the memory cell is offset farther from the threshold voltage at the time of writing, the first result read by employing the target read voltage is generally relatively large. Based on this, the first threshold TH1 may be confirmed by utilizing a concrete value of the first result at the default read voltage, and the first threshold TH1 is used for representing changes (rise) in a valley voltage caused by the offset of the threshold voltage of the memory cell. Operation S110 is performed after operation S109. The first threshold here may further be understood with reference to related descriptions of the preset threshold in the aforementioned examples.

It is to be noted that operation S109 mainly targets the process of performing looping for the first time, but may be skipped for the process of performing looping for the subsequent number of times.

In operation S110, the predicted valley voltage is acquired, and whether the first result corresponding to the predicted valley voltage is less than the aforementioned first threshold TH1 is determined. A predicted read voltage after next adjustment is acquired according to the first result corresponding to the target read voltage after previous adjustment and related mapping functions (e.g., the aforementioned first mapping function), and the first result corresponding to the acquired predicted valley voltage is compared with the first threshold TH1. When a determination result of operation S110 is no, it indicates that the first result corresponding to the currently-acquired predicted valley voltage is greater than or equal to the first threshold TH1; operation S108 of the loop is continued, the target read voltage is adjusted, and the predicted valley voltage is re-acquired; and the first result corresponding to the predicted valley voltage re-acquired each time is determined with respect to the first threshold TH1, until the first result corresponding to the acquired predicted valley voltage is less than the first threshold TH1. That is to say, a prediction iteration is performed by utilizing the aforementioned prediction formulas or the related mapping functions, until the first result corresponding to the acquired predicted read voltage is less than the first threshold TH1. When the determination result of operation S110 is yes, it indicates that the first result corresponding to the currently-acquired predicted valley voltage is less than the first threshold TH1, and next operation S111 is entered.

In operation S111, a knee point is searched. Herein, the target read voltage after each adjustment is used as a horizontal coordinate, the first result corresponding to the corresponding adjusted target read voltage is used as a vertical coordinate, and the horizontal and vertical coordinates form one point. A knee point may be understood as a point relatively close to a valley. In some examples, searching may be performed respectively towards a left boundary and a right boundary starting from the near-valley point with a thick step size (first step size), until the left boundary and the right boundary are reached; and a point corresponding to the minimum first result during the searching process is used as the knee point. Herein, the knee point is the point closer to the valley compared to the near-valley point, and a point less than the first threshold in the aforementioned operation may be used as the near-valley point. For example, the near-valley point may be the first point in the aforementioned operation that is less than the first threshold. The first step size may be a large step size. In some examples, the first step size may be 5DAC-15DAC. In an example, the first step size may be 5DAC, 10DAC, or 15DAC. Operation S112 is performed after operation S111.

In operation S112, whether the knee point has been found is determined. If the knee point is not found, the searching is continued, and operation S111 continues to be performed, until the knee point is found. Operation S113 is performed after the knee point is found.

In operation S113 and operation S114, the searching may be performed respectively towards the left boundary and the right boundary starting from the near-valley point with a thin step size (second step size), until the left boundary and the right boundary are reached, or counting showing an upward trend exceeds the preset number of times. Herein, the counting showing the upward trend is performed once the first result corresponding to the target read voltage after a next adjustment is greater than the first result corresponding to the target read voltage after the previous adjustment. In some examples, the preset number of times is 3, 4, 5, 6, or 7. In an example, the preset number of times may be 3, 5, or 7. It is to be noted that, positions of operation S113 and operation S114 are interchangeable. The second step size may be a small step size. In some examples, the second step size may be 2DAC-4DAC. In an example, the second step size may be 2DAC, 3DAC, or 4DAC.

When the searching of operation S113 and operation S114 meets the aforementioned condition (the boundary is reached or counting showing an upward trend exceeds the preset number of times), operation S115 is performed.

In operation S115, the adjusted target read voltage corresponding to the minimum first result is used as the target valley voltage. Operation S116 is performed after operation S115.

In operation S116, whether the target valley voltage is effective is determined. Herein, the method of judging whether the target valley voltage is effective may include performing data reading by utilizing the target valley voltage, decoding read data by a memory controller, and indicating, when decoding is successful, whether the target valley voltage is effective. When a determination result of operation S116 is yes, operation S121 is performed; and when the determination result of operation S116 is no, operation S117 is performed.

In operation S117, whether the loop is ended is determined. When a determination result of operation S117 is yes, operation S119 is performed; and when the determination result of operation S117 is no, operation S118 is performed.

In operation S118, the next loop is entered, and the searching is continued. The operations may move to operation S107 from operation S118.

In operation S119, whether the target stage is a high stage is determined. When a determination result of operation S119 is yes, operation S120 is performed; and when the determination result of operation S119 is no, operation S121 is performed.

In operation S120, a predicted valley voltage of the low stage is acquired according to a target valley voltage of the high stage. Herein, the predicted valley voltage of the low stage may be acquired through the target valley voltage of the high stage, the low stage, and related mapping functions (e.g., the aforementioned second mapping function). Operation S121 is performed after operation S120.

In operation S121, whether the respective target valley voltages have been determined for read voltages of all stages included in the page is determined. When a determination result of operation S121 is yes, it indicates that the target valley voltages corresponding to read voltages of all stages included in the page all have been determined, and in this case, operation S123 may be performed; and when the determination result of operation S121 is no, it indicates that there are still undetermined stages for the target valley voltages corresponding to read voltages of all stages included in the page, and in this case, operation S122 is performed.

In operation S122, for the stages of the target valley voltages that are not determined, the target valley voltage of each stage is determined in sequence. The operations may move to operation S102 from operation S122.

In operation S123, the performing of the flow of acquiring the target valley voltage is ended. It is to be noted that, the target valley voltages corresponding to read voltages of all stages of a next page may start to be determined after operation S123.

Figure 12A:
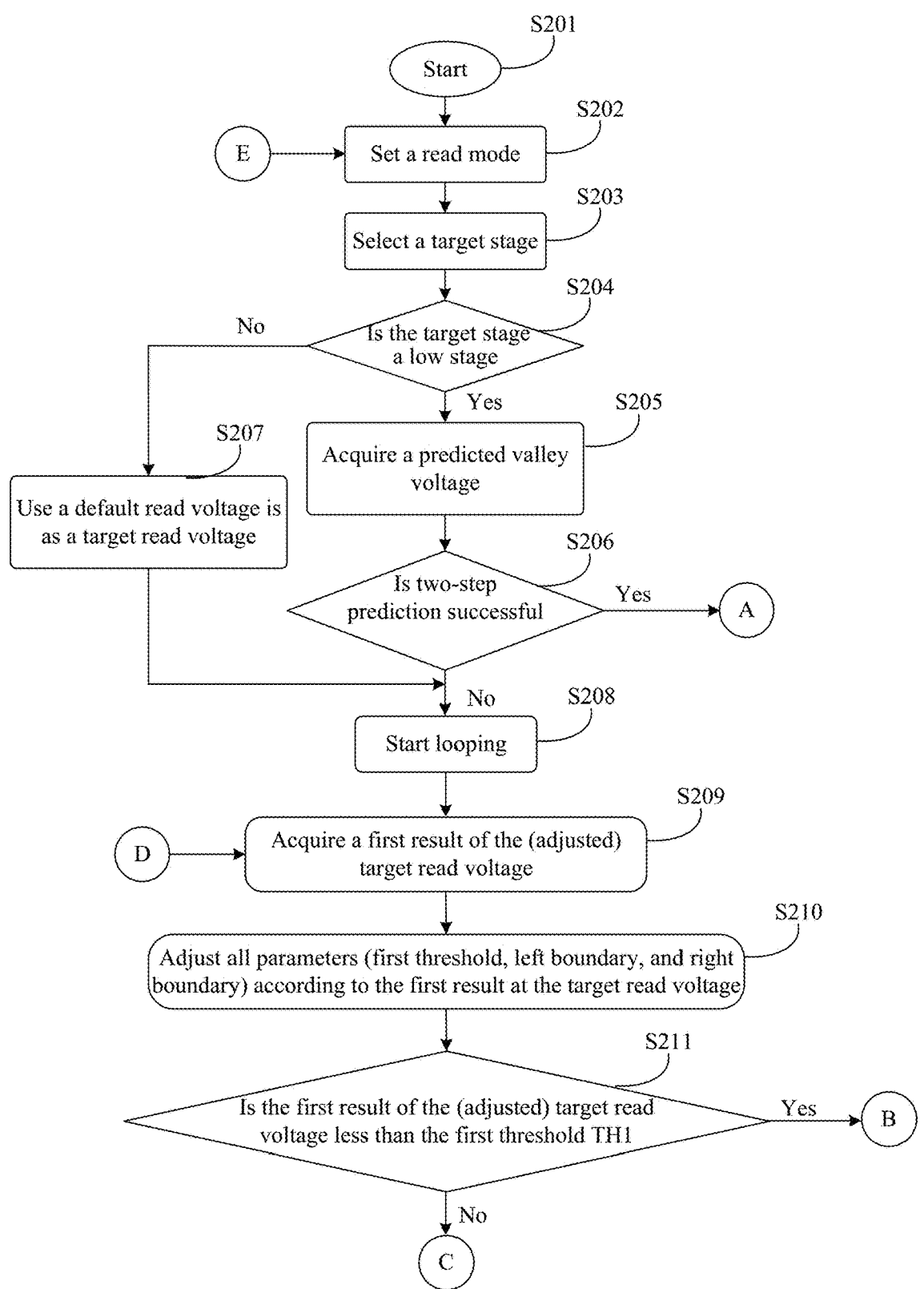
FIGS. 12A-12C are a block flowchart II of an operation method of a memory device provided by an example of the present disclosure.
Figure 12B:
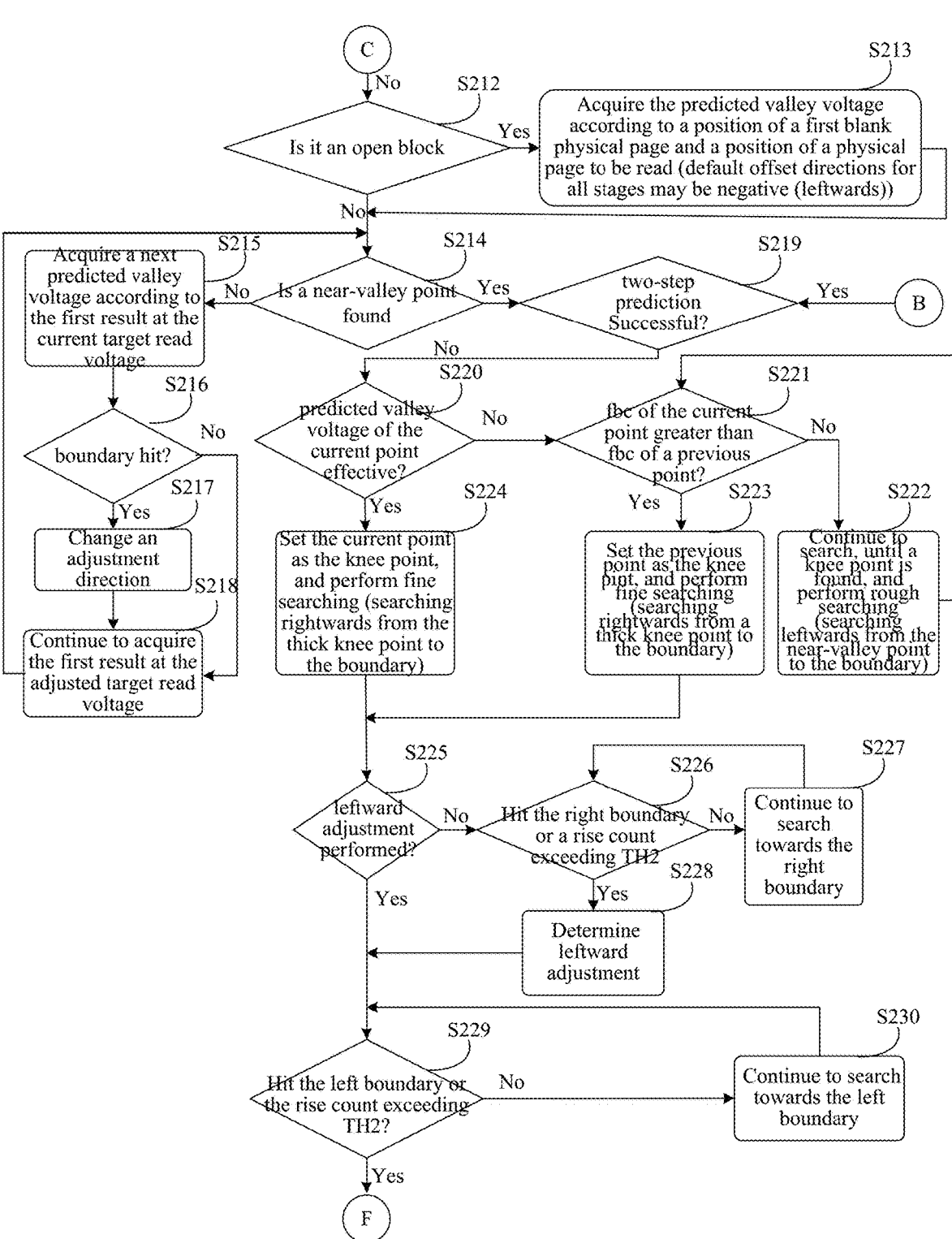
Figure 12C:
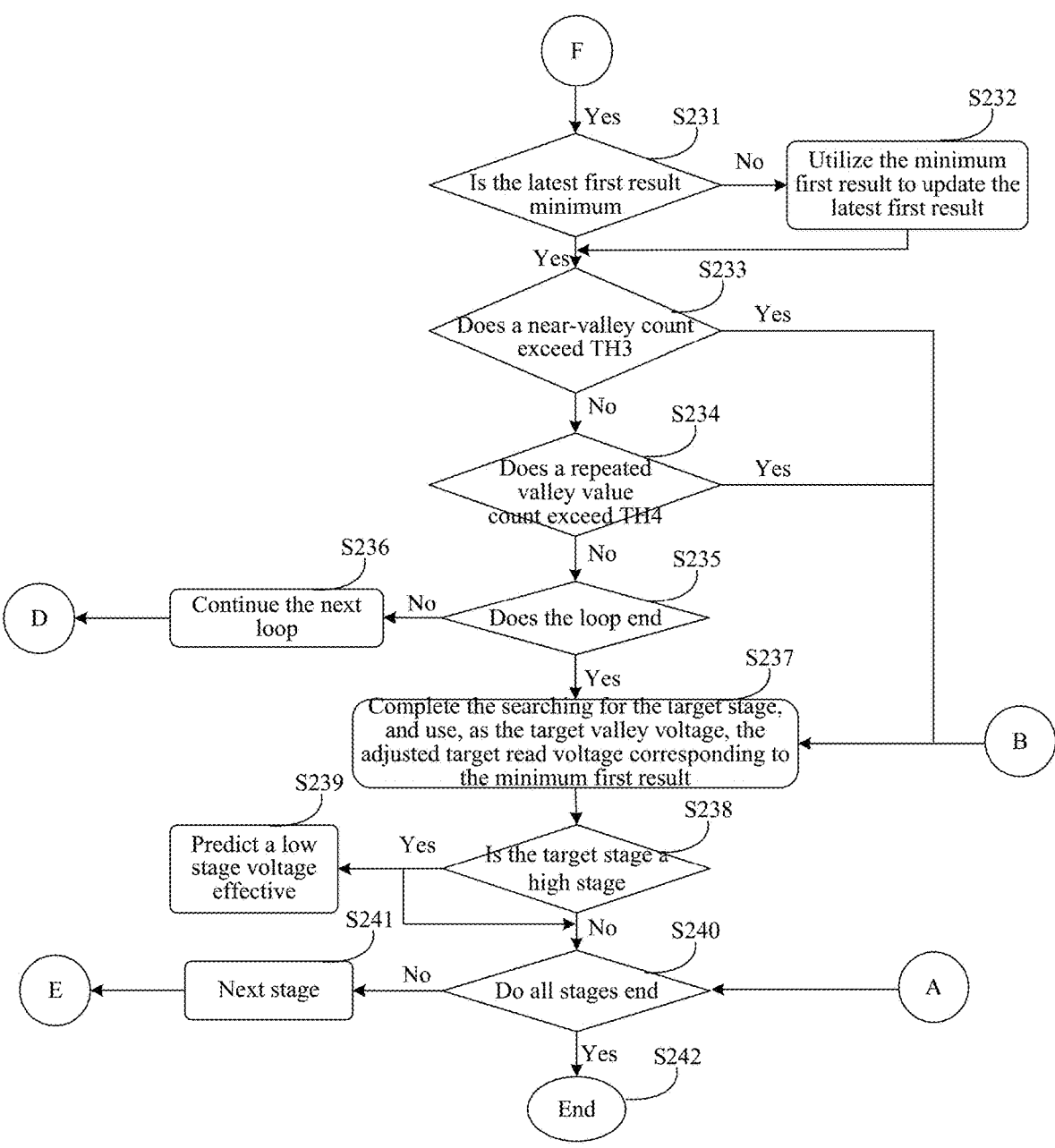

FIGS. 12A-12C are a block flowchart II of an operation method of a memory device provided by an example of the present disclosure. A detailed process of determining the target valley voltage will be described in detail below through FIGS. 12A-12C.

In operation S201, the procedure of acquiring the target valley voltage is triggered, and the flow of acquiring the target valley voltage starts to be performed. Operation S202 is performed next.

In operation S202, in some examples, a read mode of the memory device is set to single level read (SLR); here, the single level read includes reading at least one bit of storage data stored in the memory cell through a one-stage read voltage. Operation S203 is performed next.

As mentioned above, according to the fact that the memory cell includes a plurality of memory bits, the plurality of memory bits respectively correspond to the plurality of pages, and at least one page corresponds to the plurality of stages. When the target valley voltage is determined, the target valley voltage of each stage of read voltages of at least one stage corresponding to each of the plurality of page is determined in sequence. In operation S203, one stage is selected, as the target stage, from the plurality of stages corresponding to one page, and the target valley voltage corresponding to the read voltage of the target stage is first determined. Using a TLC as an example, the target valley voltages of the first-level read voltage L1 and fifth-level read voltage L5 corresponding to the lower page are first determined, such that one of the L1 or L5 may be selected as the target stage. Operation S204 is performed after the target stage is determined.

Operation S204 is mainly to determine the type of stage to which the target stage belongs. Herein, the target stage may be classified into two categories, which are the first stage (also referred to as the high stage) and the second stage (also referred to as the low stage), where the read voltage of the first stage is greater than the read voltage of the second stage. In an example, still using the lower page of the TLC as an example, the L5 is at the first stage, and the L1 is at the second stage. If the L1 is selected to be at the target stage in operation S203, the target stage is the second stage, e.g., the low stage; and if the L5 is selected to be at the target stage in operation S204, the target stage is the first stage, e.g., the high stage. Operation S205 is performed according to the target stage being the low stage; and operation S207 is performed according to the target stage being the high stage.

In operation S205, the predicted valley voltage is acquired. Herein, the predicted valley voltage is the predicted valley voltage corresponding to the low stage that is acquired according to a valley voltage corresponding to the high stage and related mapping functions. Here and below, the related mapping functions may be obtained by fitting according to a large number of experimental results before the memory device leaves the factory, and saved in the memory device. Operation S206 is performed next.

In operation S206, whether a two-step prediction method is successful is determined. Herein, the so-called two-step prediction may include a first-step prediction and a second-step prediction, where the first-step prediction is to acquire a predicted valley voltage of the high stage, and an example method is to acquire the predicted valley voltage of the high stage according to the first result corresponding to the target read voltage (default read voltage), the high stage, and the first mapping function; and the second-step prediction is to acquire a predicted valley voltage of the low stage, and an example method is to acquire the predicted valley voltage of the low stage according to the aforementioned predicted valley voltage of the high stage, the low stage, and the second mapping function. Furthermore, the predicted valley voltage is not determined after the two-step prediction is performed, and hard decode is performed by directly utilizing the predicted valley voltage of the high stage and the predicted valley voltage of the low stage; if hard decode is passed, it indicates that the two-step prediction is successful; in this case, the searching of the target valley voltage is directly stopped, and operation S245 is performed; and if hard decode fails, it indicates that the two-step prediction fails; in this case, a point corresponding to the predicted valley voltage is used as a near-valley point for subsequent iterations, and operation S220 continues to be performed. Operation S220 is described in detail in subsequent descriptions.

It is to be noted that, if hard decode fails, it indicates that the two-step prediction is not successful; and in this case, the target valley voltage needs to be determined in a method of searching or a method referred to as looping (or iterations), such that a process of looping is entered when the two-step prediction is not successful, and a searching process may be directly performed from the beginning of the loop after the two-step prediction is not successful, e.g., jumping from operation S206 to S208; and the point corresponding to the predicted valley voltage may also be directly used as the near-valley point for subsequent iterations, e.g., jumping from operation S206 (S219) to S220.

If the target stage is the high stage, the target valley voltage of the high stage is prepared to be determined by means of searching or looping. In operation S207, the default read voltage is used as the target read voltage. Herein, the target read voltage may be used as an initial value for subsequent searching or looping. In some examples, the default read voltage may be the read voltage when the threshold voltage of the memory cell is not offset; for example, for the corresponding read voltage at the time of just writing, the corresponding offset value in this case is 0 DAC. Operation S208 is performed after operation S207.

In operation S208, the target valley voltage starts to be determined by means of searching or looping. Operation S209 is performed after operation S208.

A process of performing looping for the first time, in operation S209, is to acquire the first result at the target read voltage. It can be understood that the process of performing looping for the subsequent number of times, in operation S209, is to acquire the first result at the adjusted target read voltage. Operation S210 is performed after operation S209.

In operation S210, parameters are determined or adjusted according to the first result at the target read voltage; and the parameters here may at least include the first threshold, a first boundary voltage (a position corresponding to the first boundary voltage is referred to as the left boundary), and a second boundary voltage (a position corresponding to the second boundary voltage is referred to as the right boundary). It can be understood that, during the read operation, when the threshold voltage of the memory cell is offset farther from the threshold voltage at the time of writing, the first result read by employing the target read voltage is generally relatively large. Based on this, the first threshold may be confirmed by utilizing a value of the first result at the default read voltage, and the first threshold is used for representing changing (rise) in a valley voltage caused by the offset of the threshold voltage of the memory cell. Herein, an initial first boundary voltage and an initial second boundary voltage may be set according to an empiric value, etc., for example, the initial first boundary voltage and the initial second boundary voltage, which have a relatively large range, are initially set; and then the initial first boundary voltage and the initial second boundary voltage are adjusted according to the first result at the target read voltage, for example, ranges of the first boundary voltage and the second boundary voltage are narrowed down to obtain the first boundary voltage and the second boundary voltage. Operation S211 is performed after operation S210.

It is to be noted that, operation S210 mainly aims at the process of performing looping for the first time, but may be skipped for the process of performing looping for the subsequent number of times.

The process of performing looping for the first time, in operation S211, is to determine whether the first result at the target read voltage is less than the first threshold. It can be understood that the process of performing looping for the subsequent number of times, in operation S211, is to determine whether the first result at the adjusted target read voltage is less than the first threshold. When a determination result of operation S211 is yes, it may be considered that the first result corresponding to the current adjusted target read voltage may basically meet requirements for read data decoding; then, the operations may move to S242, the loop ends, and the corresponding target valley voltage is outputted. When the determination result of operation S211 is no, operation S212 of the loop is continued.

In operation S212, whether a target block is an open block is determined. Herein, the target block is a block in which at least one code word, for which the read operation is to be performed, is located. The open block includes blocks having two data states, which are a programmed state and an erased state. When a determination result of operation S212 is yes, operation S213 is performed; and when the determination result of operation S212 is no, operation S214 is performed.

It is to be noted that, operation S212 mainly aims at the process of performing looping for the first time, but may be skipped for the process of performing looping for the subsequent number of times. Operation S214 is continued to be performed after the skipping of the step is performed.

In operation S213, it is considered that the offset of the threshold voltage of the memory cell in the open block is more complex than the offset of the threshold voltage of the memory cell in a close block (the close block may be understood as a block whose write moment difference with the open block in a same application scenario as the open block is less than a preset time duration). Compared to the close block, the offset of the threshold voltage of the memory cell in the open block is also related to a position of a first blank physical page in the open block (the first blank physical page may be understood as the first physical page in which data states appearing in the open block are all erased states according to a program sequence) and a position of a physical page to be read (the physical page in which at least one code word to be read is located). Based on this, the predicted valley voltage may be acquired according to a first offset corresponding to the close block, a second offset corresponding to the position of the first blank physical page in the open block, and a third offset corresponding to the position of the physical page to be read, and then operation S214 is continued. It can be understood that the acquired predicted valley voltage is more targeted compared to blind adjustment of the target read voltage, such that a time duration for searching may be shortened to a certain extent, and the target valley voltage may be determined more rapidly.

In operation S214, whether the near-valley point is found is determined. Herein, the target read voltage after each adjustment is used as a horizontal coordinate, the first result corresponding to the corresponding adjusted target read voltage is used as a vertical coordinate, and the horizontal and vertical coordinates form one point. During the process of adjusting the target read voltage for a plurality of times, the first point, which is less than a near-valley threshold, among the plurality of first results corresponding to the plurality of adjusted target read voltages may be used as the near-valley point. The near-valley threshold is used for representing a maximum value of the first results corresponding to voltages close to the valley voltages. It is to be noted that, the near-valley threshold differs from the afore-mentioned first threshold; when the first result is less than the near-valley threshold, it indicates that more refined searching may be performed next; and when the first result is less than the first threshold, it indicates that it may be then considered to stop the searching. When a determination result of operation S214 is yes, operation S219 is performed; and when the determination result of operation S214 is no, operation S215 is performed.

In operation S215, when the near-valley point is not found, operation S215 is entered. A predicted read voltage after next adjustment is acquired according to the first result corresponding to the target read voltage after previous adjustment and related mapping functions (e.g., the afore-mentioned first mapping function), that is, a prediction iteration is performed by utilizing the aforementioned pre-diction formulas or mapping functions. Operation S216 is performed after operation S215.

In operation S216, whether the acquired predicted read voltage after next adjustment hits a boundary is determined. The boundary here may be one of the aforementioned left boundary or right boundary; and hitting the boundary may be understood as right on the boundary or crossing the boundary. When a determination result of operation S216 is yes, operation S217 is performed; and when the determina-tion result of operation S216 is no, operation S218 is performed.

In operation S217, an adjustment direction is changed. Herein, during the process of adjusting the target read voltage, there are two adjustment directions, which are a positive direction (rightwards) and a negative direction (leftwards). Adjusting an offset direction may be understood as previously adjusting rightwards, and then adjusting left-wards after the right boundary is hit; or previously adjusting leftwards, and then adjusting rightwards after the left bound-ary is hit. Operation S218 is performed after operation S217.

In operation S218, the first result of the adjusted target read voltage is acquired. Operation S214 is performed after operation S218, that is to say, whether a latest adjustment point is the near-valley point is continued to be determined after the target voltage is adjusted each time and the respec-tive first result is acquired. Herein, adjustment is performed for one or more times until the near-valley point is found.

It is to be noted that, if, in operation processes after the near-valley point is found, the next loop is entered due to the fact that subsequent conditions are not met, operations S215 to S218 may be skipped.

In operation S219, descriptions in operation S206 may be referred to. The process of looping may be entered when the two-step prediction is not successful, and the point corre-sponding to the predicted valley voltage may be directly used as the near-valley point for subsequent iterations after the two-step prediction is not successful, e.g., jumping from operation S219 to S220.

In operation S220, whether the predicted valley voltage (the latest adjusted target read voltage) of the current point is effective is determined. In some examples, it may be determined, through the fact that the first result correspond-ing to the latest adjusted target read voltage is less than the first threshold, that the predicted valley voltage is effective. It is to be noted that, although S211, S212 and subsequent operations are entered when the first result at the (adjusted) target read voltage is not less than the first threshold, before the determination result of operation S214 is yes, the target read voltage is further adjusted at least once, such that, the newly-adjusted target read voltage may be less than the first threshold. When a determination result of operation S220 is yes, operation S224 is performed; and when the determina-tion result of operation S220 is no, operation S221 is performed.

In operation S221, it is determined whether the first result FBC of the current point is greater than a FBC of the previous point. Herein, after the near-valley point is found, during the process of starting roughly searching the knee point leftwards, changes in the FBC may generally be a decrease and then an increase; when the first result FBC of the current point is greater than the FBC of the previous point, it indicates that the FBC may further be increased in the leftward adjustment process, the previous point is a small point, and in this case, the previous point is set as the knee point. In some examples, a step size used for rough search-ing may be a large step size, for example, may be 5DAC-15DAC. In an example, the step size may be 5DAC, 10DAC, or 15DAC. Based on this, when a determination result of operation S221 is yes, operation S223 is performed; and when the determination result of operation S221 is no, operation S222 is performed.

In operation S222, the leftward rough searching starts from the near-valley point, and the FBC after each search is compared with the FBC of the previous searching, until a point of which FBC stops decreasing and starts increasing is found. After the point is found, it indicates that operation S222 has been completed, and the operations move to operation S223.

In operation S223, the previous point (e.g., the aforemen-tioned point of which FBC stops decreasing and starts increasing) is set as the knee point, and rightward fine searching starts from the knee point. In some examples, a step size used for fine searching may be a small step size, for example, may be 1DAC-4DAC. In an example, the step size may be 2DAC or 3DAC. Operation S225 is performed after operation S223.

In operation S224, the current point is set as the knee point, and the rightward fine searching starts from the knee point. In some examples, the step size used for fine searching may be referred to operation S223. Operation S225 is performed after operation S224.

In operation S225, whether the target read voltage is adjusted leftwards is determined. When a determination result of operation S225 is yes, operation S229 is performed; and when the determination result of operation S225 is no, operation S226 is performed.

In operation S226, the target read voltage is adjusted rightwards, and during the process of adjusting the target read voltage rightwards, whether the right boundary is hit or a rise count (also referred to as counting in an upward trend, where the counting showing the upward trend is performed once when the first result corresponding to the target read voltage after a next adjustment is greater than the first result corresponding to the target read voltage after the previous adjustment) exceeds a preset number of times TH2. In some examples, the preset number of times is 3-7. In an example, the preset number of times may be 3, 5, or 7. When a determination result of operation S226 is yes, operation S228 is performed; and when the determination result of operation S226 is no, operation S227 is performed.

In operation S227, when the right boundary is not hit or the rise count does not exceed the preset number of times TH2, searching towards the right boundary is continued, and judgment is performed after each searching, until the right boundary is hit or the rise count exceeds the preset number of times TH2. That is to say, once operation S227 is completed, the operations may move to operation S228.

In operation S228, the target read voltage starts to be adjusted leftwards.

In operation S229, during the process of adjusting the target read voltage leftwards, whether the left boundary or the rise count is hit is determined. The rise count here may be understood by referring to aforementioned operation S226. Thresholds of left and right rise counts are generally set to a same value. When a determination result of operation S229 is yes, operation S231 is performed; and when the determination result of operation S229 is no, operation S230 is performed.

In operation S230, when the left boundary is not hit or the rise count does not exceed the preset number of times TH2, searching towards the left boundary is continued, and judgment is performed after each searching, until the left boundary is hit or the rise count exceeds the preset number of times TH2. That is to say, when operation S230 is completed, the operations may move to operation S231.

In operation S231, whether the latest first result is minimum is determined. Herein, the latest first result refers to whether the first result at the adjusted target read voltage after the last adjustment of the target read voltage is minimum. In this case, at least all searched points in current loop need to be traversed to find the adjusted target read voltage corresponding to the point with the minimum first result. When a determination result of operation S231 is yes, operation S233 is performed; and when the determination result of operation S231 is no, operation S232 is performed.

In operation S232, the latest first result is updated by utilizing the found minimum first result. Operation S233 is performed after operation S232.

In operation S233, whether a near-valley count exceeds a preset number TH3 is determined. Herein, the first result that is the minimum first result among the plurality of first results corresponding to the target read voltage after the plurality of adjustments is used as a reference value; and if the number of the plurality of remaining first results in which difference value with the reference value is less than a second threshold is greater than the preset number, the searching is stopped, and the target read voltage corresponding to the minimum first result among the plurality of first results is used as the target valley voltage. In some examples, the second threshold and the present number may be set together according to actual situations; generally, if the second threshold is set to be slightly larger, the preset number is larger accordingly; and generally, if the second threshold is set to be slightly smaller, the preset number is smaller. When a determination result of operation S233 is yes, the searching is stopped, and operation S237 is performed; and when the determination result of operation S233 is no, next judgment is entered, and operation S234 is performed.

In operation S234, whether a repeated valley value count exceeds a preset number TH4 is determined. Herein, during the process of adjusting the target read voltage for a plurality of times, different adjustment methods may be employed for adjustment, the target read voltage correspondingly adjusted according to different adjustment methods exceeding preset adjustment methods are the same, and the first result corresponding to the same target read voltage is the minimum among all the first results, such that the same target read voltage is used as the target valley voltage. In some examples, the preset number is 2-4. In an example, the preset number may be 2, 3, or 4. When a determination result of operation S234 is yes, the searching is stopped, and operation S237 is performed; and when the determination result of operation S234 is no, next judgment is entered, and operation S235 is performed.

It is to be noted that, operation S233 and operation S234 belong to different judgment modes, and a position relationship between the operations is interchangeable, that is to say, the repeated valley value count may be determined first, and then a near-valley count is determined when the repeated valley value count does not meet conditions. It can be understood that other judgments may further be performed here to determine whether the loop is ended.

In operation S235, whether the loop is ended is determined. When a determination result of operation S235 is yes, operation S237 is performed; and when the determination result of operation S235 is no, operation S236 is performed.

In operation S236, the next loop is entered, and the searching is continued. The operations may move from operations S236 to operation S209.

In operation S237, the searching for a target stage is completed, and the adjusted target read voltage corresponding to the minimum first result is used as the target valley voltage. Operation S238 is performed after operation S237.

In operation S238, whether the target stage is a high stage is determined. When a determination result of operation S238 is yes, operation S239 is performed; and when the determination result of operation S238 is no, operation S240 is performed.

In operation S239, a predicted valley voltage of the low stage is acquired according to a target valley voltage of the high stage. Herein, the predicted valley voltage of the low stage may be acquired through the target valley voltage of the high stage, the low stage, and related mapping functions (e.g., the aforementioned second mapping function). Operation S240 is performed after operation S239.

In operation S240, whether the respective target valley voltages have been determined for all stages of read voltages included in the page is determined. When a determination result of operation S240 is yes, it indicates that the target valley voltages corresponding to all stages of read voltages included in the page all have been determined, and in this case, operation S242 may be performed; and when the determination result of operation S240 is no, it indicates that there is still an undetermined stage in the target valley voltages corresponding to all stages of read voltages included in the page, and in this case, operation S241 is performed.

In operation S241, for a stage of the target valley voltages that is not determined, the target valley voltage of each stage is determined in sequence. The operations may move from operation S236 to operation S202.

In operation S242, performing of the flow of acquiring the target valley voltage is ended. It is to be noted that, the target valley voltages corresponding to all stages of read voltages of a next page may start to be determined after operation S242.

It is to be noted that, the method disclosed in the examples of the present disclosure can solve many problems in a read retry operation, but is not used to limit application scenarios in the examples of the present disclosure. The method disclosed in the examples of the present disclosure is also applicable to a conventional read operation.

It is to be noted that the operations depicted in FIGS. 11A and 11B and FIGS. 12A-12C may be performed by a peripheral circuit or a memory controller.

Figure 13:
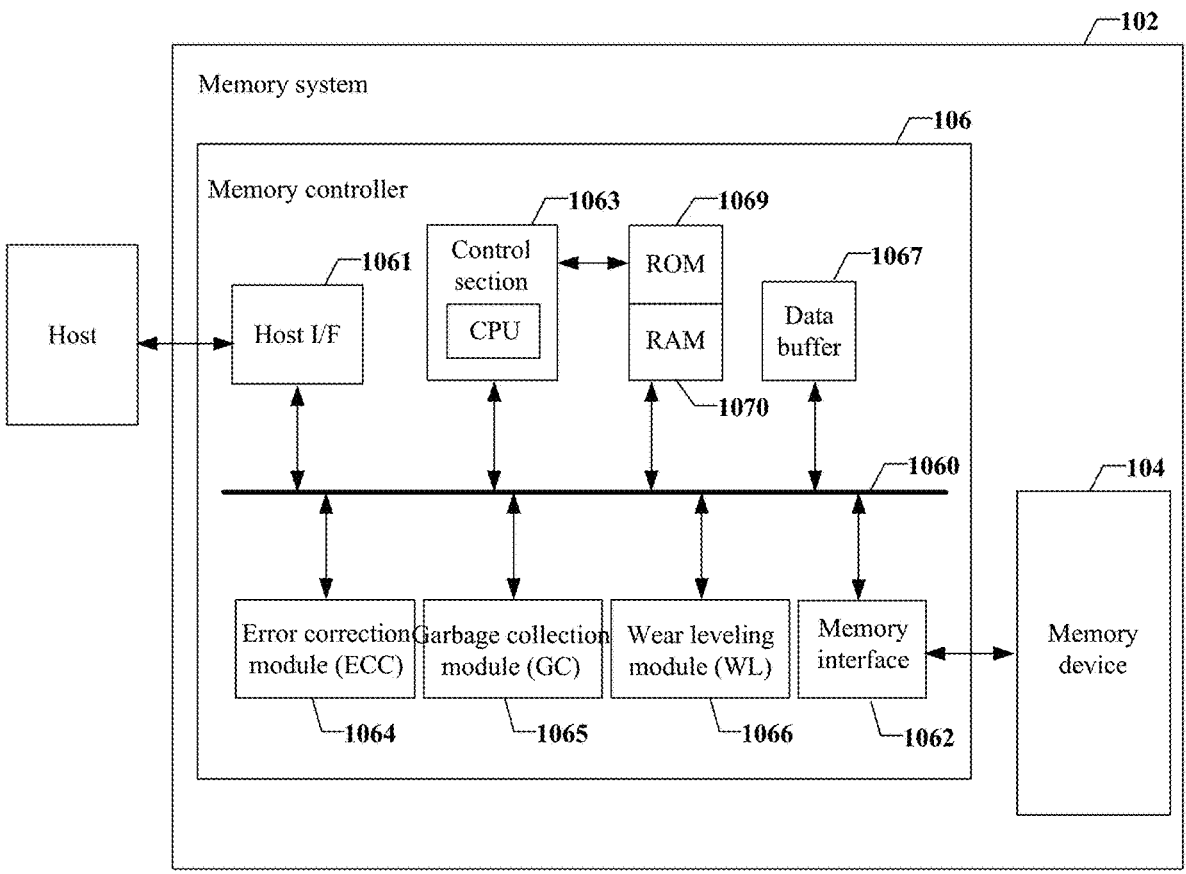
FIG. 13 is a schematic diagram of an example composition structure having a memory system provided by an example of the present disclosure.
Figure 14:
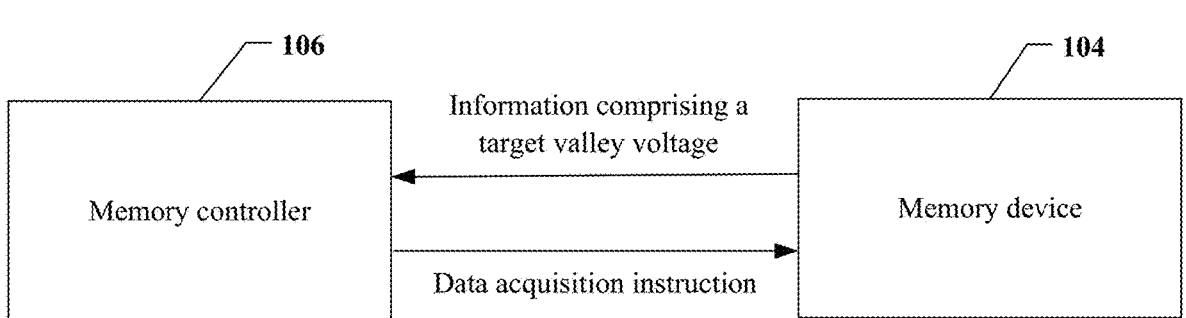
FIG. 14 is a block diagram of a memory system provided by an example of the present disclosure.

According to a second aspect, examples of the present disclosure provide a memory system. As shown in FIG. 13 and FIG. 14, the memory system 102 includes: one or more memory devices 104 as provided in the first aspect; and a memory controller 106 coupled with the memory device 104 and controlling the memory device 104.

As shown in FIG. 13, in some examples, the memory system 102 is coupled with a host, and performs a variety of feedback in response to instructions of the host. The memory system 102 may include the memory controller 106 and the memory device 104, where the memory controller 106 is configured to control the memory device 104 to perform operations of read, write, erase, etc.; and the memory controller 106 and the memory device 104 may also be coupled in any suitable methods.

The memory controller 106 may include a host interface (I/F) 1061, a memory interface (I/F) 1062, a control section 1063, a read-only memory (ROM) 1069, a random access memory (RAM) 1070, an error correction module 1064, a garbage collection module 1065, a wear leveling module 1066, a data buffer 1067, and a bus 1060. The host interface 1061 is a connection interface connecting the host 108 and the memory controller 106; and the host interface 1061 allows the host and the memory controller to communicate according to a protocol, send read and write requests, and perform other operations. The memory interface 1062 is a connection interface between the memory controller 106 and the memory device 104; and the memory interface 1062 is configured to achieve data transmission between the memory controller 106 and the memory device 104. The control section 1063 is configured to entirely control the memory system 102, and the aforementioned operations performed by the memory controller are mainly performed and completed by the control section 1063. In some examples, the control section 1063 may be a central processing unit (CPU), a micro-processing unit (MCU), etc. The ROM 1069 usually includes firmware or firmware program codes of the memory controller 106. These codes are for initializing and operating various components of the memory controller, and the RAM 1070 is usually configured to buffer data. The error correction module 1064 may further include an encoding section and a decoding section. The encoding section is configured to encode data to be stored, so as to obtain check data, and the decoding section is configured to decode the check data to detect and correct possible error data in a process of data transmission.

The garbage collection module 1065 is configured to: after a memory space of the memory device reaches a certain threshold, read out valid data in some blocks, perform rewriting, and then label these blocks, to obtain new spare blocks. A general implementation of garbage collection may include three steps: selecting a source block with a small amount of valid data; finding the valid data from the source block; and writing the valid data to a target block. In this case, all data in the source block becomes invalid data; and the source block is labeled, and may be used as a new spare block. The wear leveling module 1066 is configured to level wear (a number of erase times) of each block in the memory system through data statistics and algorithms. A general implementation of wear leveling may include two steps: selecting a source block in which cold data is located; and reading valid data in the source block and writing the same in a block with a relatively large number of erase times. In this case, the valid data in the source block becomes invalid data, and the source block is labeled. The data buffer 1067 is configured to buffer data.

In some examples, the memory controller 106 is configured to control the memory device 104 to perform a read operation on at least one code word.

In some examples, the memory controller 106 is configured to: send a data acquisition instruction, where the data acquisition instruction indicates acquisition of a target valley voltage. The memory device 104 is configured to: receive the data acquisition instruction, acquire the target valley voltage, and send information including the target valley voltage to the memory controller 106. The memory controller 106 is further configured to perform a read operation on data stored in the memory device according to the target valley voltage in the information.

In some examples, the memory controller 106 is further configured to perform an error correction code decoding operation on a read result of the read operation. In some implementations, the error correction code decoding operation includes a hard decode operation employing a low density parity check code (LDPC).

In some examples, as shown in FIG. 14, the memory controller 106 is configured to: send the data acquisition instruction, where the data acquisition instruction indicates acquisition of the target valley voltage. The memory device 104 is configured to: acquire the target valley voltage, and send information including the target valley voltage to the memory controller 106.

According to a second aspect, in the memory systems provided by the examples of the present disclosure, the first result (the first result may be several bytes) is transmitted instead of transmitting at least one code word (for example, the code word may be 4 KB), such that a data amount transmitted is reduced, thereby shortening transmission time of an output port; and the process of acquiring the first result is converged inside the memory device without occupying, for example, the space of the memory controller, and thus is less dependent on, for example, a memory controller. Meanwhile, in the examples of the present disclosure, considering a difference in charges in the memory cell with written data and the memory cell with unwritten data in the open block, on the basis of the close blocks in a same application scenario, the position of the open WL, and the distance between the word line coupled to the memory cell, for which the read operation is to be performed, and the open WL are taken into consideration, the predicted initial read voltage is acquired in a targeted method, and then the target valley voltage is determined based on the predicted initial read voltage. Compared to the method of obtaining the target valley voltage by directly utilizing the default read voltage for a plurality of loop iterations, in the examples of the present disclosure, the predicted initial read voltage obtained by considering the aforementioned two positions may reduce the number of loop iterations (the target valley voltage may be even directly determined through the predicted initial read voltage), such that the target valley voltage can be obtained more rapidly.

According to a third aspect, examples of the present disclosure provide a memory controller coupled with at least one memory device, where the memory device includes a plurality of blocks, the blocks include a plurality of word lines, and a plurality of memory cells coupled to the plurality of word lines, the plurality of memory cells coupled to a same word line form a physical page, and one physical page includes one or more code words; and the memory controller includes: a control section configured to: acquire a predicted initial read voltage of the code words according to a position of the word line coupled to the code words in an open block, and a position of a first blank physical page in the open block; and obtain a target valley voltage of the code words according to a first result corresponding to the code words at the predicted initial read voltage, where the first result includes the number of bits representing the flipping of the code words in two read results at a first read voltage and a second read voltage, and a difference between the first read voltage and the second read voltage is less than a preset voltage; and the target valley voltage is used as a read voltage when a read operation is performed on the code words.

Herein, the control section may be understood in combination with the control section 1063 shown in FIG. 13. Other components included in the memory controller may also be understood by referring to FIG. 13. It is to be noted that, in the implementation of the present disclosure, a performing subject is replaced from the aforementioned peripheral circuit to the control section in the memory controller. That is to say, in the implementation of the present disclosure, at least one first result is acquired by the memory device; meanwhile, analysis processing is performed by the control section utilizing the at least one first result, and a target valley voltage is determined according to analysis processing situations.

In some examples, the control section is configured to: acquire an offset value corresponding to the predicted initial read voltage of the code words according to a first offset value corresponding to a close block whose write moment difference with the open block is less than a preset time duration, a second offset value corresponding to a position of a word line coupled to the first blank physical page in all word lines of the open block, and a third offset value corresponding to a distance of the word line coupled to the code words from the word line coupled to the first blank physical page in the open block; and obtain the predicted initial read voltage of the code words according to the offset value corresponding to the predicted initial read voltage.

In some examples, the control section is configured to: respectively acquire the first offset value, the second offset value, and the third offset value; sum the first offset value, the second offset value, and the third offset value to obtain a total offset value; and sum a default read voltage and the total offset value to obtain the predicted initial read voltage of the code words.

In some examples, the control section is configured to: use the predicted initial read voltage as the target valley voltage of the code words according to the fact that the first result corresponding to the code words at the predicted initial read voltage is less than a preset threshold; adjust the predicted initial read voltage at least once according to the fact that the first result corresponding to the code words at the predicted initial read voltage is greater than or equal to the preset threshold, and acquire first results corresponding to the adjusted read voltages after each adjustment; and determine the target valley voltage of the code words according to the fact that the first results corresponding to the adjusted read voltages meet a preset condition.

In some examples, a memory cell is configured to store a plurality of memory bits, and the plurality of memory bits correspond to a plurality of stages of read voltages. The control section is configured to: acquire the predicted initial read voltage of the code words at a target stage, a predicted offset direction of the predicted initial read voltage, and a predicted boundary voltage according to the position of the word line coupled to the code words in an open block, the position of the first blank physical page in the open block, and a stage of the target stage among the plurality of stages; and in the process of adjusting the predicted initial read voltage at least once, change a current offset direction according to the fact that the adjusted predicted initial read voltage exceeds a range defined by the predicted boundary voltage.

In some examples, the predicted offset direction of the predicted initial read voltage is a direction in which the default read voltage is decreased.

In some examples, the control section is configured to: adjust the predicted initial read voltage for M times, during the process of M adjustments, perform M first adjustments on a read voltage to be adjusted with a first step size, and respectively acquire M first results corresponding to the read voltage after the M first adjustments; use the minimum first result in the M first results as a knee point value, where a read voltage corresponding to the knee point value includes a knee voltage; perform N second adjustments on the knee voltage with a second step size, and respectively acquire N first results corresponding to the read voltage after the N second adjustments, where the second step size is less than the first step size, and M and N both are positive integers greater than 1; and determine the target valley voltage according to the acquired N first results.

In some examples, a memory cell is configured to store a plurality of memory bits, and the plurality of memory bits correspond to a plurality of stages of read voltages. The control section is configured to: acquire a predicted valley voltage of the code words at the target stage according to the first result corresponding to the code words at the predicted initial read voltage at the target stage, and the target stage; and determine a target valley voltage of the target stage based on the predicted valley voltage of the target stage.

In some examples, a memory cell is configured to store a plurality of memory bits, and the plurality of memory bits correspond to a plurality of stages of read voltages. The control section is configured to: determine the target valley voltage of the code words at the target stage, and then respectively determine target valley voltages of other stages in the plurality of stages other than the target stage.

In some examples, the plurality of memory bits respectively correspond to a plurality of pages; at least one page corresponds to the plurality of stages; the plurality of stages include first stages and second stages; read voltages of the second stages are less than read voltages of the first stages. The control section is configured to: when stages corresponding to the determined target valley voltages belong to the first stages, acquire, according to the determined target valley voltages, predicted valley voltages of the second stages in the plurality of stages and/or predicted valley voltages of the rest of the first stages with lower read voltages; and obtain target valley voltages of the second stage and the rest of the first stages, according to the predicted valley voltages of the second stages in the plurality of stages and/or the predicted valley voltages of the rest of the first stages with lower read voltages.

In some examples, the control section is configured to: perform the read operation on the code word according to the target valley voltages/predicted valley voltages of all first stages and second stages.

It is to be noted that the aforementioned performing subject of the implementation process in FIGS. 11A and 11B and FIGS. 12A-12C may be the control section in the memory controller.

According to a third aspect, in each memory controller provided by the examples of the present disclosure, the first result (the first result may be several bytes) is transmitted instead of transmitting at least one code word (for example, the code word may be 4 KB), such that a data amount transmitted is reduced, thereby shortening transmission time of an output port; and the process of acquiring the first result is converged inside the memory device without occupying, for example, the space of the memory controller, and thus is less dependent on, for example, a memory controller. Meanwhile, in the examples of the present disclosure, considering a difference in charges in the memory cell with written data and the memory cell with unwritten data in the open block, on the basis of the close blocks in a same application scenario, the position of the open WL, and the distance between the word line coupled to the memory cell, for which the read operation is to be performed, and the open WL are taken into consideration, the predicted initial read voltage is acquired in a targeted method, and then the target valley voltage is determined based on the predicted initial read voltage. Compared to the method of obtaining the target valley voltage by directly utilizing the default read voltage for a plurality of loop iterations, in the examples of the present disclosure, the predicted initial read voltage obtained by considering the aforementioned two positions may reduce the number of loop iterations (the target valley voltage may be even directly determined through the predicted initial read voltage), such that the target valley voltage can be obtained more rapidly.

According to a fourth aspect, examples of the present disclosure provide an operation method of a memory device. The memory device includes a plurality of blocks, the blocks include a plurality of word lines, and a plurality of memory cells coupled to the plurality of word lines, the plurality of memory cells coupled to a same word line form a physical page, and one physical page includes one or more code words. The operation method includes: acquiring a predicted initial read voltage according to a position of the word line coupled to the code words in an open block, and a position of a first blank physical page in the open block; and obtaining a target valley voltage of the code words according to a first result corresponding to the code words at the predicted initial read voltage, where the first result includes the number of bits representing the flipping of the code words in two read results at a first read voltage and a second read voltage, and a difference between the first read voltage and the second read voltage is less than a preset voltage; and the target valley voltage is used as a read voltage when a read operation is performed on the code words.

In some examples, the acquiring the predicted initial read voltage of the code words according to the position of the word line coupled to the code words in the open block, and the position of the first blank physical page in the open block includes: acquiring an offset value corresponding to the predicted initial read voltage of the code words according to a first offset value corresponding to a close block whose write moment difference with the open block is less than a preset time duration, a second offset value corresponding to a position of a word line coupled to the first blank physical page in all word lines of the open block, and a third offset value corresponding to a distance of the word line coupled to the code words from the word line coupled to the first blank physical page in the open block; and obtaining the predicted initial read voltage of the code words according to the offset value corresponding to the predicted initial read voltage.

In some examples, the obtaining the predicted initial read voltage of the code words according to the offset value corresponding to the predicted initial read voltage of the code words includes: respectively acquiring the first offset value, the second offset value, and the third offset value; summing the first offset value, the second offset value, and the third offset value to obtain a total offset value; and summing a default read voltage and the total offset value to obtain the predicted initial read voltage of the code words.

In some examples, the obtaining the target valley voltage of the code words according to the first result corresponding to the code words at the predicted initial read voltage includes: using the predicted initial read voltage as the target valley voltage of the code words according to the fact that the first result corresponding to the code words at the predicted initial read voltage is less than a preset threshold; adjusting the predicted initial read voltage at least once according to the fact that the first result corresponding to the code words at the predicted initial read voltage is greater than or equal to the preset threshold, and acquire first results corresponding to the adjusted read voltages after each adjustment; and determining the target valley voltage of the code words according to the fact that the first results corresponding to the adjusted read voltages meet a preset condition.

In some examples, a memory cell is configured to store a plurality of memory bits, and the plurality of memory bits correspond to a plurality of stages of read voltages. The operation method further includes: acquiring the predicted initial read voltage of the code words at a target stage, a predicted offset direction of the predicted initial read voltage, and a predicted boundary voltage according to the position of the word line coupled to the code words in an open block, the position of the first blank physical page in the open block, and a stage of the target stage among the plurality of stages; and in the process of adjusting the predicted initial read voltage at least once, changing a current offset direction according to the fact that the adjusted predicted initial read voltage exceeds a range defined by the predicted boundary voltage.

In some examples, the predicted offset direction of the predicted initial read voltage is a direction in which the default read voltage is decreased.

In some examples, the operation method further includes: adjusting the predicted initial read voltage for M times, during the process of M adjustments, performing M first adjustments on a read voltage to be adjusted with a first step size, and respectively acquiring M first results corresponding to the read voltage after the M first adjustments; using the minimum first result in the M first results as a knee point value, where a read voltage corresponding to the knee point value includes a knee voltage; performing N second adjustments on the knee voltage with a second step size, and respectively acquiring N first results corresponding to the read voltage after the N second adjustments, where the second step size is less than the first step size, and M and N both are positive integers greater than 1; and determining the target valley voltage according to the acquired N first results.

In some examples, a memory cell is configured to store a plurality of memory bits, and the plurality of memory bits correspond to a plurality of stages of read voltages. The operation method further includes: acquiring a predicted valley voltage of the code words at the target stage according to the first result corresponding to the code words at the predicted initial read voltage at the target stage, and the target stage; and determining a target valley voltage of the target stage based on the predicted valley voltage of the target stage.

In some examples, a memory cell is configured to store a plurality of memory bits, and the plurality of memory bits correspond to a plurality of stages of read voltages. The operation method further includes determining the target valley voltage of the code words at the target stage, and then respectively determining target valley voltages of other stages in the plurality of stages other than the target stage.

In some examples, the plurality of memory bits respectively correspond to a plurality of pages; at least one page corresponds to the plurality of stages; the plurality of stages include first stages and second stages; read voltages of the second stages are less than read voltages of the first stages. The operation method further includes: when stages corresponding to the determined target valley voltages belong to the first stages, acquiring, according to the determined target valley voltages, predicted valley voltages of the second stages in the plurality of stages and/or predicted valley voltages of the rest of the first stages with lower read voltages; and obtaining target valley voltages of the second stage and the rest of the first stages, according to the predicted valley voltages of the second stages in the plurality of stages and/or the predicted valley voltages of the rest of the first stages with lower read voltages.

In some examples, the operation method further includes performing the read operation on the code words according to the target valley voltages/predicted valley voltages of all first stages and second stages.

In some examples, the operation method for acquiring the first result further includes: reading storage data of the code words at the first read voltage to obtain a second result; performing third adjustment on the first read voltage in a third step size to obtain the second read voltage, and reading the storage data of the code words at the second read voltage to obtain a third result; performing a logical operation on the second result and the third result to obtain a fourth result; and counting the number of bits in the fourth result that represent the flipping in the third result compared to the second result, so as to obtain the first result.

According to a fifth aspect, examples of the present disclosure provide an operation method of a memory system, including: a memory controller in a memory system sending a data acquisition instruction, where the data acquisition instruction indicates acquisition of a target valley voltage; a memory device in the memory system receiving the data acquisition instruction, acquiring the target valley voltage according to the operation method of a memory device described in the fourth aspect of the examples of the present disclosure, and sending information including the target valley voltage to the memory controller; and memory controller performing a read operation on data stored in the memory device according to the target valley voltage in the information.

In some examples, the operating method further includes: the memory controller performing an error correction code decoding operation on the read result of the read operation.

According to a sixth aspect, examples of the present disclosure provide an operation method of a memory controller. A memory controller is coupled with at least one memory device. The memory device includes a plurality of blocks, the blocks include a plurality of word lines, and a plurality of memory cells coupled to the plurality of word lines, the plurality of memory cells coupled to a same word line form a physical page, and one physical page includes one or more code words. The operation method includes: acquiring a predicted initial read voltage of the code words according to a position of the word line coupled to the code words in an open block, and a position of a first blank physical page in the open block; and obtaining a target valley voltage of the code words according to a first result corresponding to the code words at a predicted value of the predicted initial read voltage, where the first result includes the number of bits representing that a first code words is flipped in two read results at a first read voltage and a second read voltage, and a difference between the first read voltage and the second read voltage is less than a preset voltage; and the target valley voltage is used as a read voltage when a read operation is performed on the code words.

In some examples, the acquiring the predicted initial read voltage of the code words according to the position of the word line coupled to the code words in the open block, and the position of the first blank physical page in the open block includes: acquiring an offset value corresponding to the predicted initial read voltage of the code words according to a first offset value corresponding to a close block whose write moment difference with the open block is less than a preset time duration, a second offset value corresponding to a position of a word line coupled to the first blank physical page in all word lines of the open block, and a third offset value corresponding to a distance of the word line coupled to the code words from the word line coupled to the first blank physical page in the open block; and obtaining the predicted initial read voltage of the code words according to the offset value corresponding to the predicted initial read voltage.

In some examples, the obtaining the predicted initial read voltage of the code words according to the offset value corresponding to the predicted initial read voltage includes: respectively acquiring the first offset value, the second offset value, and the third offset value; summing the first offset value, the second offset value, and the third offset value to obtain a total offset value; and summing a default read voltage and the total offset value to obtain the predicted initial read voltage of the code words.

In some examples, the obtaining the target valley voltage of the code words according to the first result corresponding to the code words at the predicted initial read voltage includes: using the predicted initial read voltage as the target valley voltage of the code words according to the fact that the first result corresponding to the code words at the predicted initial read voltage is less than a preset threshold; adjusting the predicted initial read voltage at least once according to the fact that the first result corresponding to the code words at the predicted initial read voltage is greater than or equal to the preset threshold, and acquire first results corresponding to the adjusted read voltages after each adjustment; and determining the target valley voltage of the code words according to the fact that the first results corresponding to the adjusted read voltages meet a preset condition.

In some examples, a memory cell is configured to store a plurality of memory bits, and the plurality of memory bits correspond to a plurality of stages of read voltages. The operation method further includes: acquiring the predicted initial read voltage of the code words at a target stage, a predicted offset direction of the predicted initial read voltage, and a predicted boundary voltage according to the position of the word line coupled to the code words in an open block, the position of the first blank physical page in the open block, and a stage of the target stage among the plurality of stages; and in the process of adjusting the predicted initial read voltage at least once, changing a current offset direction according to the fact that the adjusted predicted initial read voltage exceeds a range defined by the predicted boundary voltage.

In some examples, the predicted offset direction of the predicted initial read voltage is a direction in which the default read voltage is decreased.

In some examples, the operation method further includes: adjusting the predicted initial read voltage for M times, during the process of M adjustments, performing M first adjustments on a read voltage to be adjusted with a first step size, and respectively acquiring M first results corresponding to the read voltage after the M first adjustments; using the minimum first result in the M first results as a knee point value, where a read voltage corresponding to the knee point value includes a knee voltage; performing N second adjustments on the knee voltage with a second step size, and respectively acquiring N first results corresponding to the read voltage after the N second adjustments, where the second step size is less than the first step size, and M and N both are positive integers greater than 1; and determining the target valley voltage according to the acquired N first results.

In some examples, a memory cell is configured to store a plurality of memory bits, and the plurality of memory bits correspond to a plurality of stages of read voltages. The operation method further includes: acquiring a predicted valley voltage of the code words at the target stage according to the first result corresponding to the code words at the predicted initial read voltage at the target stage, and the target stage; and determining a target valley voltage of the target stage based on the predicted valley voltage of the target stage.

In some examples, a memory cell is configured to store a plurality of memory bits, and the plurality of memory bits correspond to a plurality of stages of read voltages. The operation method further includes determining the target valley voltage of the code words at the target stage, and then respectively determining target valley voltages of other stages in the plurality of stages other than the target stage.

In some examples, the plurality of memory bits respectively correspond to a plurality of pages; at least one page corresponds to the plurality of stages; the plurality of stages include first stages and second stages; read voltages of the second stages are less than read voltages of the first stages. The operation method further includes: when stages corresponding to the determined target valley voltages belong to the first stages, acquiring, according to the determined target valley voltages, predicted valley voltages of the second stages in the plurality of stages and/or predicted valley voltages of the rest of the first stages with lower read voltages; and obtaining target valley voltages of the second stage and the rest of the first stages, according to the predicted valley voltages of the second stages in the plurality of stages and/or the predicted valley voltages of the rest of the first stages with lower read voltages.

In some examples, the operation method further includes performing the read operation on the code words according to the target valley voltages/predicted valley voltages of all first stages and second stages.

In some examples, the operation method for acquiring the first result further includes: reading storage data of the code words at the first read voltage to obtain a second result; performing third adjustment on the first read voltage in a third step size to obtain the second read voltage, and reading the storage data of the code words at the second read voltage to obtain a third result; performing a logical operation on the second result and the third result to obtain a fourth result; and counting the number of bits in the fourth result that represent the flipping in the third result compared to the second result, so as to obtain the first result.

Figure 15:
FIG. 15 is an example timing diagram of starting single-level read mode operations provided by the present disclosure.

FIG. 15 is an example timing diagram of starting single-level read mode operations provided by the present disclosure. DQx may represent a data bus signal, and Cycle Type may further represent a type of the data bus signal.

As shown in FIG. 15, a setting function command may include, for example, a sub-command (e.g., EFh). In an example, the memory device initiates a single-level read mode upon one received sub-command EFh. In the single-level read mode, the memory device transmits, between the received sub-commands 00h and 30h, addresses ADDR (for example, two column addresses C1-C2 and three row addresses R1-R3) of data to be read. Within read time, corresponding data DATA (e.g., Dn) in a page receiving the addresses may be buffered to a page buffer, and then the data DATA is read according to requirements. It is to be noted that, in the above-mentioned examples, when the read retry operation is performed, data (e.g., Dn) corresponding to one page needs to be frequently transmitted (Din/Dout) between the memory device and the memory controller, and it takes a relatively long time to transmit the data.

Figure 16:
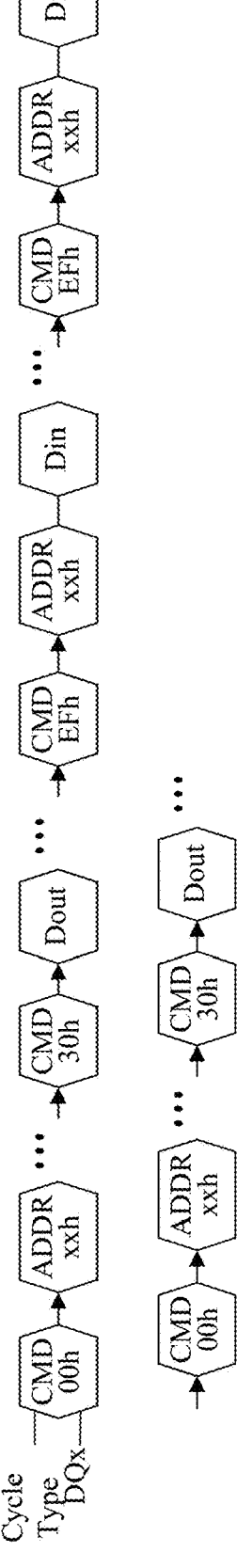
FIG. 16 is a timing diagram of determination of a target valley voltage and performing of a read operation provided by an example of the present disclosure.

FIG. 16 is a timing diagram of determination of a target valley voltage and performing of a read operation provided by an example of the present disclosure. As shown in FIG. 16, a read command may include, for example, two sub-commands (e.g., 00h and 30h). In an example, the memory device transmits, between the received sub-commands 00h and 30h, addresses ADDR (for example, two column addresses C1-C2 and three row addresses R1-R3) of data to be read. After the memory device receives a sub-command 30h, within read time, corresponding data DATA (e.g., Dn) in a page receiving the addresses may be buffered to a page buffer, and then the data DATA is read according to requirements.

In example implementations, the memory device 104 transmits, between the received sub-commands 00h and 30h, addresses ADDR (for example, two column addresses C1-C2 and three row addresses R1-R3) of data to be read. After receiving the sub-command 30h, the memory device 104 receives sub-commands EBh and xxh of a data acquisition instruction; and the memory device 104, under the indication of the data acquisition instruction, acquires a first result corresponding to a code word at a respective read voltage, and sends the acquired first result to the memory controller. The memory controller determines target valley voltages according to the plurality of first results respectively corresponding to the plurality of different read voltages received from the memory device, and performs a read operation on data stored in the memory device according to the target valley voltages.

It is to be noted that the data acquisition instruction provided in the examples of the present disclosure is only an example, and should not unduly limit the scope of protection of the present disclosure.

In some implementations, a data amount of the first result is less than a preset data amount threshold, for example, the data amount of the first result ranges from 1 byte to 4 byte, such that, in the process of determining the target valley voltages, data transmission between the memory device and the memory controller is small in volume and fast in speed, facilitating the acceleration of the overall speed of the read operation.

According to a seventh aspect, examples of the present disclosure further provide a storage medium. The storage medium stores executable instructions; and when the executable instructions are executed, operations of the operation method in the above-mentioned examples of the present disclosure may be implemented.

In some examples, the storage medium may be a ferro-magnetic random access memory (FRAM), a read only memory (ROM), a programmable read-only memory (PROM), an erasable programmable read-only memory (EPROM), an electrically erasable programmable read-only memory (EEPROM), a flash memory, a magnetic surface memory, an optical disk, or a CD-ROM (Compact Disc Read-Only Memory) and other memories, or various apparatuses including one or any combination of the above memory devices.

In some examples, executable instructions may be written in any form of programming language (including a compiled or interpreted language, or a declarative or procedural language) by adopting a form of a program, a software, a software module, a script or a code; and it may be deployed in any form, including deployed as an independent program or as a module, a component, a subroutine, or other units suitable for use in a computing environment.

As an example, the executable instruction may, but do not necessarily, correspond to files in a file system, may be stored in part of a file storing other programs or data, for example, stored in one or more scripts in a hypertext markup language (HTML) document, stored in single file dedicated for the discussed program, or stored in a plurality of cooperative files (e.g., files for storing one or more modules, subprograms or code portions).

As an example, the executable instruction may be deployed on an electronic apparatus for execution, or on a plurality of electronic apparatuses at one site for execution, or distributed on a plurality of electronic apparatuses interconnected through a communication network at a plurality of sites for execution.

Figure 17:
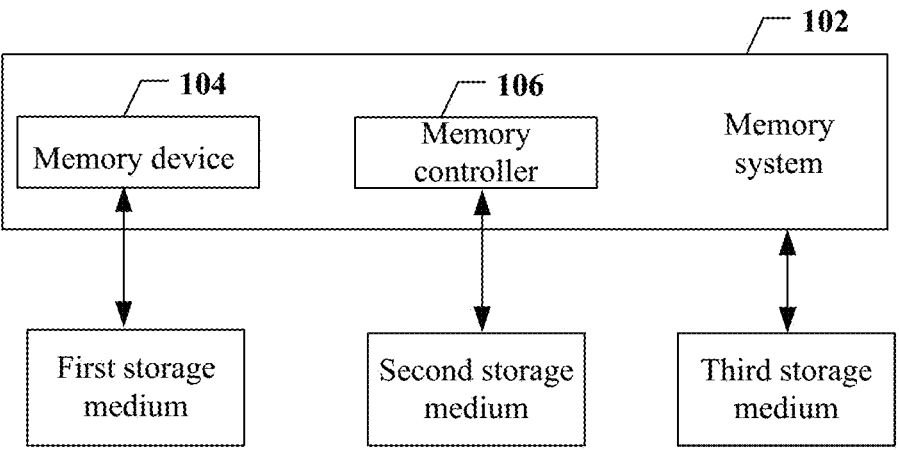
FIG. 17 is a block diagram of a storage medium provided by an example of the present disclosure.

FIG. 17 is a schematic diagram of a composition structure of a storage medium provided in examples of the present disclosure. The storage medium includes a first storage medium corresponding to the memory device 104, a second storage medium corresponding to the memory controller 106, and a third storage medium corresponding to the memory system 102. When the executable instruction is executed by the memory device, the first storage medium may be configured to implement operations of the operation method of a memory device in the above-mentioned examples of the present disclosure; when the executable instruction is executed by the memory controller, the second storage medium may be configured to implement operations of the operation method of a memory controller in the above-mentioned examples of the present disclosure; and when the executable instruction is executed by the memory system, the third storage medium may be configured to implement operations of the operation method of a memory system in the above-mentioned examples of the present disclosure.

It is to be understood that "one example" and "an example" mentioned throughout the specification mean that features, structures or characteristics related to the example is included in at least one example of the present disclosure. Therefore, "in one example" or "in an example" appearing throughout the specification does not always refer to the same example. In addition, these features, structures or characteristics may be combined in one or more examples in any proper method. It is to be understood that, in various examples of the present disclosure, sequence numbers of the above processes do not indicate a performing sequence, and a performing sequence of various processes shall be determined by functionalities and intrinsic logics thereof, and shall constitute no limitation on an implementation process of the examples of the present disclosure. The above sequence numbers of the examples of the present disclosure are only for description, and do not represent goodness and badness of the examples.

The above are only examples of the present disclosure, and are not intended to limit the patent scope of the present disclosure. Any equivalent structural transformation made under the inventive concept of this application using the contents of the description and drawings of this application, or directly/indirectly applied in other related technical fields are included in the scope of patent protection of this application.

What is claimed is:

1. A memory device, comprising:
a memory cell array comprising a plurality of blocks, wherein the plurality of blocks comprise a plurality of word lines, and a plurality of memory cells coupled to the plurality of word lines, the plurality of memory cells coupled to a same word line form a physical page, and the physical page comprises one or more code words; and
a peripheral circuit coupled to the memory cell array and configured to:
acquire a predicted initial read voltage of the one or more code words according to a position of the word line coupled to the one or more code words in an open block and a position of a first blank physical page in the open block; and
obtain a target valley voltage of the one or more code words according to a first result corresponding to the one or more code words at the predicted initial read voltage,
wherein the first result comprises a number of bits representing flipping of the one or more code words in two read results at a first read voltage and a second read voltage, and a difference between the first read voltage and the second read voltage is less than a preset voltage; and
wherein the target valley voltage is used as a read voltage when a read operation is performed on the one or more code words.

2. The memory device of claim 1, wherein the peripheral circuit is configured to:
acquire an offset value corresponding to the predicted initial read voltage of the one or more code words according to a first offset value corresponding to a close block whose write moment difference with the open block is less than a preset time duration, a second offset value corresponding to a position of a word line coupled to the first blank physical page in all word lines of the open block, and a third offset value corresponding to a distance of the word line coupled to the one or more code words from the word line coupled to the first blank physical page in the open block; and
obtain the predicted initial read voltage of the one or more code words according to the offset value corresponding to the predicted initial read voltage.

3. The memory device of claim 2, wherein the peripheral circuit is configured to:
respectively acquire the first offset value, the second offset value, and the third offset value;
sum the first offset value, the second offset value, and the third offset value to obtain a total offset value; and
sum a default read voltage and the total offset value to obtain the predicted initial read voltage of the one or more code words.

4. The memory device of claim 1, wherein the peripheral circuit is configured to:
in response to the first result corresponding to the one or more code words at the predicted initial read voltage being less than a preset threshold, use the predicted initial read voltage as the target valley voltage of the one or more code words;
in response to the first result corresponding to the one or more code words at the predicted initial read voltage being greater than or equal to the preset threshold, adjust the predicted initial read voltage at least once, and acquire the first result corresponding to the read voltage after each adjustment; and in response to the first result corresponding to the adjusted read voltage meeting a preset condition, determine the target valley voltage of the one or more code words.

5. The memory device of claim 4, wherein a memory cell is configured to store a plurality of memory bits, and the plurality of memory bits correspond to a plurality of stages of read voltages; and the peripheral circuit is configured to:

acquire the predicted initial read voltage of the one or more code words at a target stage, a predicted offset direction of the predicted initial read voltage, and a predicted boundary voltage according to the position of the word line coupled to the one or more code words in an open block, the position of the first blank physical page in the open block, and a stage of the target stage among the plurality of stages; and in response to the adjusted predicted initial read voltage exceeding a range defined by the predicted boundary voltage, change a current offset direction while adjusting the predicted initial read voltage at least once.

6. The memory device of claim 5, wherein the predicted offset direction of the predicted initial read voltage is a direction in which a default read voltage is decreased.

7. The memory device of claim 4, wherein the peripheral circuit is configured to:

adjust the predicted initial read voltage for M times, perform M first adjustments on a read voltage to be adjusted with a first step size during a process of M adjustments, and respectively acquire M first results corresponding to the read voltage after the M first adjustments; use the minimum first result in the M first results as a knee point value, wherein a read voltage corresponding to the knee point value comprises a knee voltage;

perform N second adjustments on the knee voltage with a second step size, and respectively acquire N first results corresponding to the read voltage after the N second adjustments, wherein the second step size is less than the first step size, and M and N both are positive integers greater than 1; and determine the target valley voltage according to the acquired N first results.

8. The memory device of claim 4, wherein a memory cell is configured to store a plurality of memory bits, and the plurality of memory bits correspond to a plurality of stages of read voltages; and the peripheral circuit is configured to:

acquire a predicted valley voltage of the one or more code words at a target stage, according to the first result corresponding to the one or more code words at the predicted initial read voltage at the target stage, and a stage of the target stage; and determine the target valley voltage of the target stage based on the predicted valley voltage of the target stage.

9. The memory device of claim 4, wherein a memory cell is configured to store a plurality of memory bits, and the plurality of memory bits correspond to a plurality of stages of read voltages; and the peripheral circuit is configured to:

after determining the target valley voltage of the one or more code words at a target stage, respectively determine target valley voltages of other stages in the plurality of stages other than the target stage.

10. The memory device of claim 9, wherein the plurality of memory bits respectively correspond to a plurality of pages; at least one page corresponds to the plurality of stages; the plurality of stages comprise first stages and second stages; read voltages of the second stages are less than read voltages of the first stages; and the peripheral circuit is configured to:

when stages corresponding to the determined target valley voltages belong to the first stages, acquire predicted valley voltages of the second stages in the plurality of stages or the predicted valley voltages of the rest of the first stages with lower read voltages, according to the determined target valley voltages; and obtain target valley voltages of the second stage and the rest of the first stages, according to the predicted valley voltages of the second stages in the plurality of stages or the predicted valley voltages of the rest of the first stages with lower read voltages.

11. The memory device of claim 10, wherein the peripheral circuit is configured to:

perform the read operation on the one or more code words according to the target valley voltages and the predicted valley voltages of all first stages and second stages.

12. The memory device of claim 1, wherein the peripheral circuit is configured to:

read storage data of the one or more code words at the first read voltage to obtain a second result;

perform a third adjustment on the first read voltage with a third step size to obtain the second read voltage, and read the storage data of the one or more code words at the second read voltage to obtain a third result;

perform a logical operation on the second result and the third result to obtain a fourth result; and count the number of bits in the fourth result that represent flipping in the third result compared to the second result, to obtain the first result.

13. The memory device of claim 12, wherein the peripheral circuit comprises:

a first latch is configured to store the second result;

a second latch is configured to store the third result; and a third latch is configured to store the fourth result.

14. A memory system, comprising:

one or more memory devices comprising:

a memory cell array comprising a plurality of blocks, wherein the plurality of blocks comprise a plurality of word lines, and a plurality of memory cells coupled to the plurality of word lines, the plurality of memory cells coupled to a same word line form a physical page, and the physical page comprises one or more code words; and a peripheral circuit coupled to the memory cell array and configured to:

acquire a predicted initial read voltage of the one or more code words according to a position of the word line coupled to the one or more code words in an open block and a position of a first blank physical page in the open block; and obtain a target valley voltage of the one or more code words according to a first result corresponding to the one or more code words at the predicted initial read voltage, wherein the first result comprises a number of bits representing flipping of the one or more code words in two read results at a first read voltage and a second read voltage, and a difference between the first read voltage and the second read voltage is less than a preset voltage; and wherein the target valley voltage is used as a read voltage when a read operation is performed on the one or more code words; and a memory controller coupled with the memory devices and configured to control the memory devices.

15. The memory system of claim 14, wherein the memory controller is configured to send a data acquisition instruction, wherein the data acquisition instruction indicates acquisition of a target valley voltage;

the memory device is configured to receive the data acquisition instruction, acquire the target valley voltage, and send information comprising the target valley voltage to the memory controller; and the memory controller is further configured to perform a read operation on data stored in the memory device according to the target valley voltage in the information.

16. The memory system of claim 15, wherein the memory controller is further configured to perform an error correction code decoding operation on a read result of the read operation.

17. A memory controller, comprising:

a control section configured to:

acquire a predicted initial read voltage of one or more code words according to a position of a word line coupled to the one or more code words in an open block and a position of a first blank physical page in the open block, the one or more code words being included a memory device coupled to the memory controller, the memory device comprising a plurality of blocks, the plurality of blocks comprising a plurality of word lines and a plurality of memory cells coupled to the plurality of word lines, the plurality of memory cells coupled to a same word line form a physical page, and the physical page comprising the one or more code words; and obtain a target valley voltage of the one or more code words according to a first result corresponding to the one or more code words at the predicted initial read voltage, wherein the first result comprises a number of bits representing flipping of the one or more code words in two read results at a first read voltage and a second read voltage, and a difference between the first read voltage and the second read voltage is less than a preset voltage; and wherein the target valley voltage is used as a read voltage when a read operation is performed on the one or more code words.

18. The memory controller of claim 17, wherein the control section is configured to:

acquire an offset value corresponding to the predicted initial read voltage of the one or more code words, according to a first offset value corresponding to a close block whose write moment difference with the open block is less than a preset time duration, a second offset value corresponding to a position of a word line coupled to the first blank physical page in all word lines of the open block, and a third offset value corresponding to a distance of the word line coupled to the one or more code words from the word line coupled to the first blank physical page in the open block; and obtain the predicted initial read voltage of the one or more code words according to the offset value corresponding to the predicted initial read voltage.

19. The memory controller of claim 18, wherein the control section is configured to:

respectively acquire the first offset value, the second offset value, and the third offset value;

sum the first offset value, the second offset value, and the third offset value to obtain a total offset value; and sum a default read voltage and the total offset value to obtain the predicted initial read voltage of the one or more code words.

20. The memory controller of claim 17, wherein the control section is configured to:

in response to the first result corresponding to the one or more code words at the predicted initial read voltage being less than a preset threshold, use the predicted initial read voltage as the target valley voltage of the one or more code words;

in response to the first result corresponding to the one or more code words at the predicted initial read voltage being greater than or equal to the preset threshold, adjust the predicted initial read voltage at least once, and acquire the first result corresponding to the adjusted read voltage after each adjustment; and in response to the first result corresponding to the adjusted read voltages meeting a preset condition, determine the target valley voltage of the one or more code words.

* * * * *